United States Patent
Kuhn et al.

(10) Patent No.: US 10,844,192 B2
(45) Date of Patent: Nov. 24, 2020

(54) CONJUGATED POLYMERS COMPRISING THERMALLY CLEAVABLE OXALATE PENDANT GROUPS

(71) Applicant: InnovationLab GmbH, Heidelberg (DE)

(72) Inventors: Marius Kuhn, Heidelberg (DE); Manuel Hamburger, Mannheim (DE)

(73) Assignee: Innovation Lab GmbH, Heidelberg (DE)

( * ) Notice: Subject to any disclaimer, the term of this patent is extended or adjusted under 35 U.S.C. 154(b) by 74 days.

(21) Appl. No.: 15/764,921

(22) PCT Filed: Sep. 1, 2016

(86) PCT No.: PCT/EP2016/001482
§ 371 (c)(1),
(2) Date: Mar. 30, 2018

(87) PCT Pub. No.: WO2017/054900
PCT Pub. Date: Apr. 6, 2017

(65) Prior Publication Data
US 2018/0244893 A1 Aug. 30, 2018

(30) Foreign Application Priority Data

Sep. 30, 2015 (EP) .................................... 15002801

(51) Int. Cl.
| | | |
|---|---|---|
| *C08K 5/092* | (2006.01) | |
| *C08G 61/12* | (2006.01) | |
| *H01L 51/50* | (2006.01) | |
| *C09K 11/06* | (2006.01) | |
| *H01L 51/00* | (2006.01) | |
| *C08L 65/00* | (2006.01) | |
| *H01L 51/42* | (2006.01) | |

(52) U.S. Cl.
CPC ............... *C08K 5/092* (2013.01); *C08G 61/12* (2013.01); *C08L 65/00* (2013.01); *C09K 11/06* (2013.01); *H01L 51/0026* (2013.01); *H01L 51/0035* (2013.01); *H01L 51/0043* (2013.01); *H01L 51/5012* (2013.01); *C08G 2261/1426* (2013.01); *C08G 2261/3223* (2013.01); *C08G 2261/3246* (2013.01); *C08L 2203/204* (2013.01); *C09K 2211/1416* (2013.01); *C09K 2211/1458* (2013.01); *C09K 2211/1466* (2013.01); *C09K 2211/1491* (2013.01); *H01L 51/0003* (2013.01); *H01L 51/0047* (2013.01); *H01L 51/4253* (2013.01); *Y02E 10/549* (2013.01)

(58) Field of Classification Search
CPC ... C08K 5/10; C08K 5/43; C08K 5/46; C08G 2261/18; C08G 2261/51; C08G 2261/411–417; C08G 61/025; C08G 61/21

See application file for complete search history.

(56) References Cited

U.S. PATENT DOCUMENTS

| | | |
|---|---|---|
| 5,081,183 A | 1/1992 | Kei et al. |
| 5,304,595 A | 4/1994 | Rhee et al. |
| 10,629,815 B2 | 4/2020 | Kuhn et al. |

FOREIGN PATENT DOCUMENTS

| | | |
|---|---|---|
| CA | 2012064 A1 | 9/1990 |
| JP | H02240129 A | 9/1990 |
| JP | H02275837 A | 11/1990 |
| WO | WO-2015124272 A1 | 8/2015 |

OTHER PUBLICATIONS

Tobler (Helvetica Chimica Acta (1941) 24, 100-9E).*
Lee (Advanced Functional Materials (2012) 22, 4128-4138).*
Lee et al., "Inversion of Dominant Polarity in Ambipolar Polydiketopyrrolopyrrole with Thermally Removable Groups," Advanced Functional Materials, vol. 22, No. 19, pp. 4128-4138 (2012).
Sun et al., "Diketopyrrolopyrrole-based semiconducting polymer bearing thermocleavable side chains," Journal of Materials Chemistry, vol. 22, pp. 18950-18955 (2012).

* cited by examiner

*Primary Examiner* — Kuo Liang Peng
(74) *Attorney, Agent, or Firm* — Faegre Drinker Biddle & Reath LLP

(57) ABSTRACT

The invention relates to novel conjugated polymers containing oxalate side groups which can be cleaved off thermally, to monomers and processes for their preparation, to their use as semiconductors in organic electronic (OE) devices, in particular in organic photovoltaic (OPV) devices, organic photodetectors (OPDs), organic light-emitting diodes (OLEDs) and organic field-effect transistors (OFETs), and to OE, OPV, OPD, OLED and OFET devices containing these polymers.

30 Claims, 3 Drawing Sheets

CONJUGATED POLYMERS COMPRISING THERMALLY CLEAVABLE OXALATE PENDANT GROUPS

RELATED APPLICATIONS

Figure 1A:
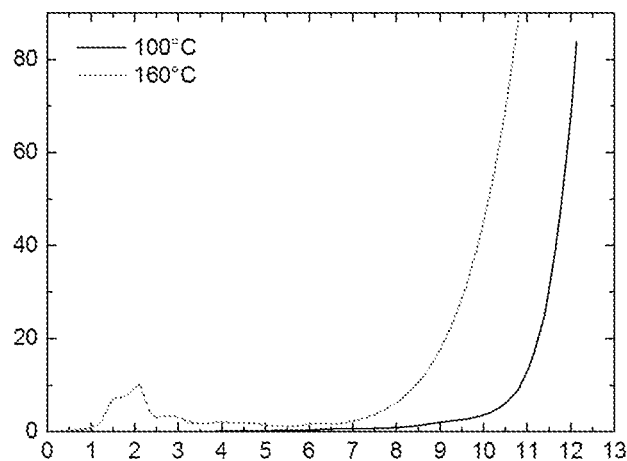
Figure 1B:
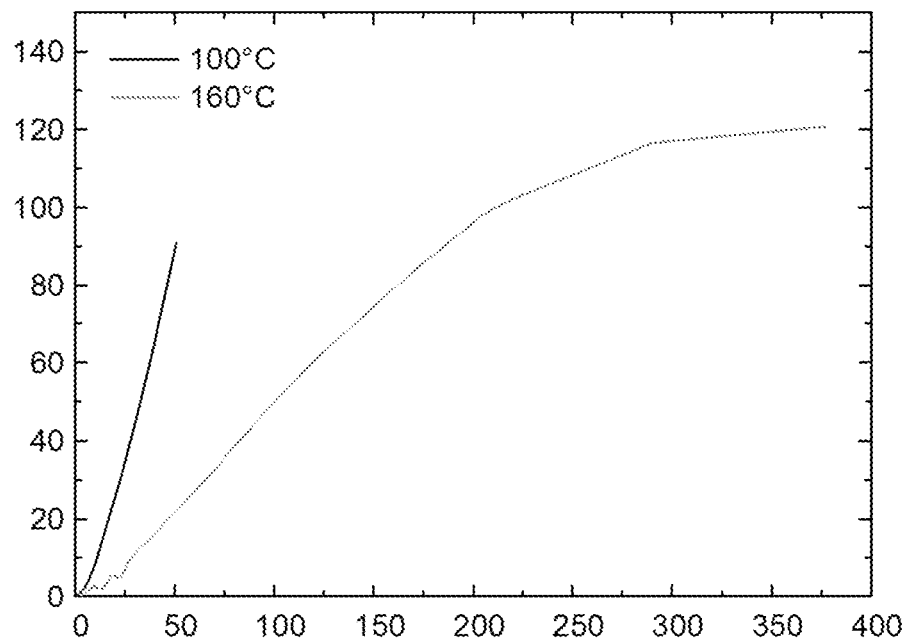
Figure 1C:
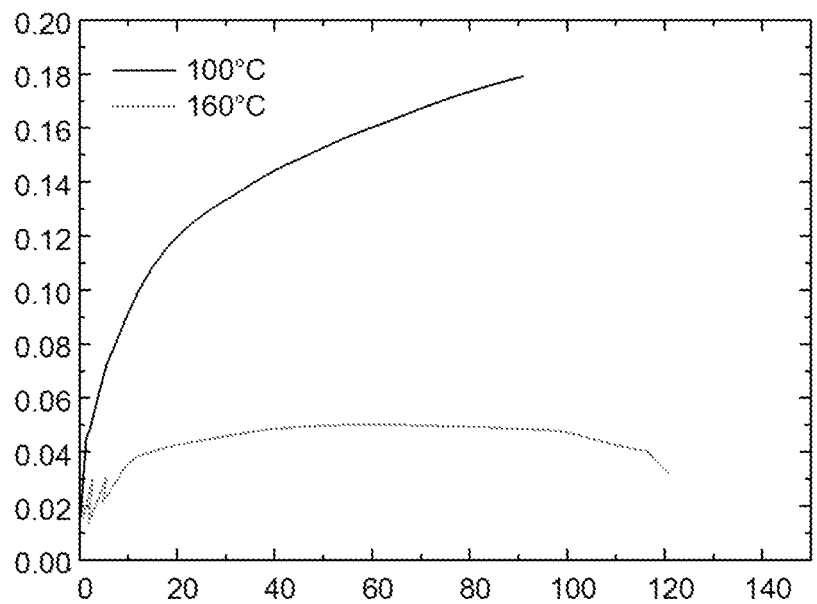
Figure 1D:
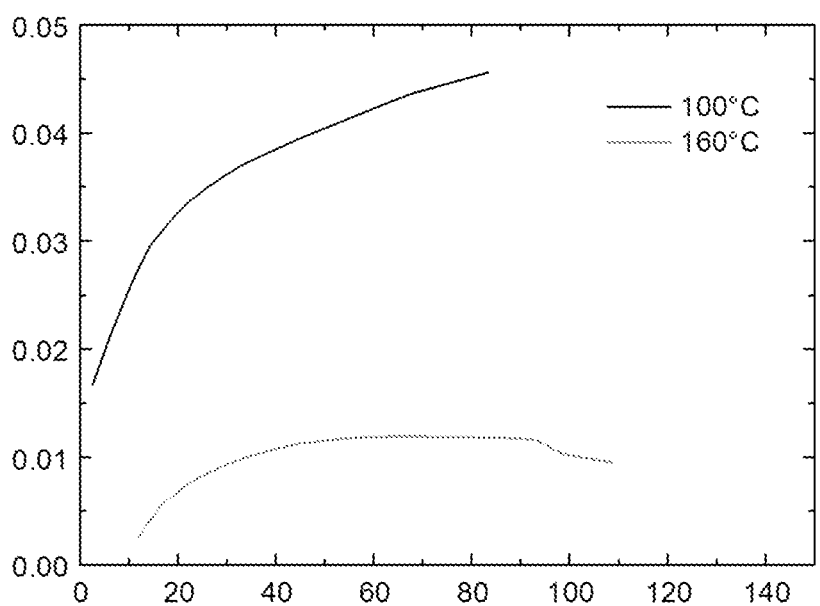

This application is a national stage entry, filed pursuant to 35 U.S.C. § 371, of PCT/EP2016/001482, filed Sep. 1, 2016, which claims the benefit of European Patent Application No. 15002801.7, filed Sep. 30, 2015, which is incorporated herein by reference in its entirety.

The invention relates to novel conjugated polymers containing oxalate side groups which can be cleaved off thermally, to monomers and processes for their preparation, to their use as semiconductors in organic electronic (OE) devices, in particular in organic photovoltaic (OPV) devices, organic photodetectors (OPDs), organic light-emitting diodes (OLEDs) and organic field-effect transistors (OFETs), and to OE, OPV, OPD, OLED and OFET devices containing these polymers.

In recent years, organic semiconductor materials have been developed in order to produce more versatile and less expensive OE devices. Materials of this type are used in a multiplicity of devices or equipment, such as, for example, in OFETs, OLEDs, OPV or OPD devices, sensors, memory elements and logic circuits. The organic semiconductor materials in the OE device are typically in the form of a thin layer of, for example, a thickness of less than 1 micron.

A particularly important area is OPV devices, such as organic solar cells. Conjugated polymers are used as organic semiconductors in organic solar cells, since they enable simple production of the photoactive layer by processing techniques from solution, such as spin coating, dip coating or ink-jet printing. Compared with evaporation techniques, as are used for the production of inorganic semiconductor layers, processing from solution can be carried out less expensively and on a larger scale. For organic solar cells containing polymeric semiconductors, efficiencies of greater than 7% have been reported.

A further important area is OFETs. Their performance is based principally on the charge-carrier mobility of the semiconductor material and the on/off ratio of the current, so the ideal semiconductor should have low conductivity in the off state in combination with high charge-carrier mobility ($>1\times10^{-3}$ cm$^2$V$^{-1}$ s$^{-1}$). In addition, it is important that the semiconductor material is relatively resistant to oxidation, i.e. has high ionisation potential, since oxidation results in a reduction in the performance of the device. Further requirements of the semiconductor material are good processability, in particular for large-scale production of thin layers and desired patterns, and high stability, uniformity of the film and integrity of the organic semiconductor layer.

However, there continues to be a need for organic semiconductor materials which can be synthesised easily and are suitable, in particular, for mass production, have good structure organisation and film-formation properties, and exhibit good electronic properties, in particular high charge-carrier mobility, good processability, in particular high solubility in organic solvents, and high stability in air. For use in OPV elements, there is, in particular, a need for organic semiconductor materials having a low energy gap which enable improved utilisation of light by the photoactive layer and can result in higher efficiency of the elements. For use in OFETS, there is, in particular, a need for organic semiconductor materials having high charge-carrier mobility and high oxidation stability.

In order to achieve improved solubility of the organic semiconductors in organic solvents, the semiconductors used in the prior art are usually conjugated polymers which contain solubility-promoting, generally unconjugated side chains, such as, for example, alkyl groups. However, these side chains may adversely affect the organisation of the conjugated main polymer chains in the functional layer and in particular crystallisation of the polymers, and thus impair charge transport between the polymer molecules. In addition, the solubility-promoting side groups used to date often do not exhibit the desired increase in solubility. In addition, solubility-promoting side chains of this type may result in the polymers likewise being soluble in solvents which are used for the application of further layers to the functional layer. As a consequence, the application of a further layer may damage the functional polymer layer applied beforehand. By contrast, an organic semiconductor material which has high solubility in the solvent used for application of the semiconductor layer, but is insoluble or has only low solubility in a solvent used for application of further layers, i.e. has high orthogonality, would therefore be desirable.

It was an aim of the present invention to provide compounds for use as organic semiconductor materials which do not have the above-mentioned disadvantages of the prior-art materials, can be synthesised easily, in particular by processes which are suitable for mass production, and, in particular, have good processability, high stability, good solubility in organic solvents, high orthogonality with respect to adjacent layers in the device, high charge-carrier mobility and a low energy gap. A further aim was the expansion of the range of organic semiconductor materials available to the person skilled in the art. Further aims of the present invention are apparent to the person skilled in the art from the following disclosure.

It has been found that these aims can be achieved by the provision of conjugated semiconductor polymers in accordance with the present invention, as described below. These polymers have solubility-improving oxalate side chains which can be cleaved off thermally.

Conjugated polymers having solubility-improving groups are known from the prior art. However, these usually consist either of groups, such as, for example, very long alkyl or fluoroalkyl radicals, which cannot be cleaved off and therefore remain in the film after processing, or of groups which can only be cleaved off at very high temperatures (>300° C.).

Thus, for example, US 2011/0045628 A1, J. Yu, S. Holdcroft, *Macromolecules* 2000, 33, 5073-5079, M. Helgesen, R. Søndergaard, F. C. Krebs, *J. Mater. Chem.* 2010, 20, 36-60, P. D. Kazarinoff, P. J. Shamburger, F. S. Ohuchi, C. K. Luscombe, *J. Mater. Chem.* 2010, 20, 3040-3045, E. Bundgaard, O. Hagemann, M. Bjerring, N. C. Nielsen, J. W. Andreasen, B. Andreasen, F. C. Krebs, *Macromolecules* 2012, 45, 3644-3646, F. C. Krebs, H. Spanggaard, *Chem. Mater.* 2005, 17, 5235-5237, J. Lee, A.-R. Han, J. Hong, J. H. Seo, J. H. Oh, C. Yang, *Adv. Funct. Mater.* 2012, 22, 4128-4138, or B. Sun, W. Hong, H. Aziz, Y. Li, *J. Mater. Chem.* 2012, 22, 18950-18955, disclose polymers containing carbonyl, carboxyloxy or THP ether groups which can be cleaved off thermally in the side chain.

However, the process for cleaving off such groups requires very high temperatures above 200° C. and up to 310° C., as shown by way of example in the following scheme. However, such high process temperatures are disadvantageous, since they may damage the semiconductor layer applied or other components of the device.

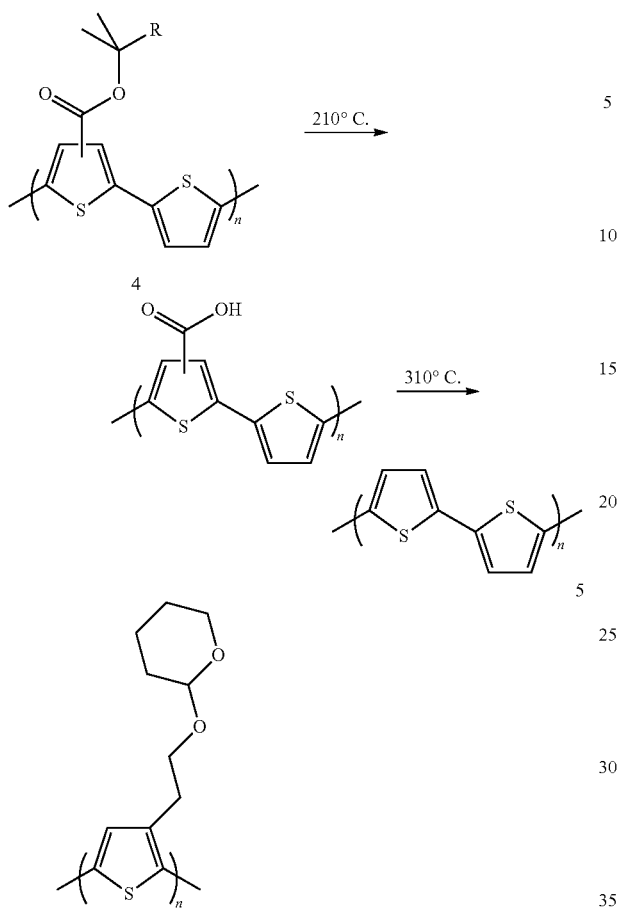

Surprisingly, it has now been found that polymers according to the invention containing solubility-improving oxalate side chains enable some or all of the side chains to be cleaved off even at temperatures below 200° C. In addition, the polymers according to the invention have improved solubility compared with the materials known from the prior art. In addition, it has been found that these polymers enable better crystallisation or higher ordering of the polymer chains after the side chains have been cleaved off and optionally after thermal treatment, which results in improved charge transport in the semiconductor layer and in higher efficiency on use in organic solar cells.

The possibility of cleaving off the side groups in a polymer according to the invention additionally enables variation of its solubility. Thus, after application of the polymeric semiconductor layer from solution, the solubility of the polymer can be reduced significantly by cleaving off the side chains. This enables the stability of the semiconductor layer to solvents which are used for the application of further organic layers to be increased significantly. In addition, the same or a similar solvent as for the application of the semiconductor layer can be used for the application of further organic layers. The use of orthogonal solvents or corresponding materials for the subsequent layer is thus no longer absolutely necessary. This enables greater variability in the choice of the materials and processes used.

The monomers and polymers of the present invention are suitable, in particular, for industrial preparation on a large scale. At the same time, they have good processability, high solubility in organic solvents, high charge-carrier mobility, high long-term stability, high stability to solvents and high oxidation stability, and represent highly promising materials for organic electronic OE devices, in particular for OPV, OPD, OLED and OFET devices.

The invention thus relates to a conjugated polymer containing one or more identical or different recurring units, in which at least one of the recurring units is substituted by an oxalate group.

The invention furthermore relates to a conjugated polymer containing one or more identical or different recurring units of the formula I:

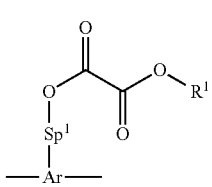

in which the individual radicals have the following meanings:

Ar denotes mono- or polycyclic aryl or heteroaryl, which may additionally be substituted in one or more positions, $Sp^1$ denotes a single bond or straight-chain, branched and/or cyclic alkylene having 1 to 20 C atoms, which is unsubstituted or mono- or polysubstituted by F, Cl, Br, I or CN, and in which, in addition, one or more non-adjacent $CH_2$ groups may each be replaced, independently of one another, by —O—, —S—, —C(O)—, —C(S)—, —C(O)—O—, —O—C(O)—, —$NR^0$—, —$SiR^0R^{00}$—, —$CF_2$—, —$CHR^0=CR^{00}$—, —$CY^1=CY^2$— or —C≡C— in such a way that O and/or S atoms are not linked directly to one another.

$R^1$ denotes hydrocarbyl having 1 to 40 C atoms, $Y^1$ and $Y^2$ each, independently of one another, denote H, F, Cl or CN, $R^0$ and $R^{00}$ each, independently of one another, denote H or alkyl having 1 to 12 C atoms.

The invention furthermore relates to a conjugated polymer containing one or more recurring units which are substituted by an oxalate group, and which are preferably selected from the recurring units of the formula I, and additionally contain one or more, optionally substituted, mono- or poly-cyclic aryl or heteroaryl units.

The invention furthermore relates to a process for cleaving off some or all of the oxalate groups of a polymer as described above and below by heating the polymer, or a layer comprising the polymer, to a temperature of 200° C., and to a polymer obtainable by this process.

The invention furthermore relates to a polymer obtainable by cleaving off the oxalate groups of a polymer as described above and below, preferably by thermal or chemical cleaving-off.

The invention furthermore relates to monomers containing a unit of the formula I and one or more reactive groups which are suitable for the pre-partition of polymers as described above and below.

The invention furthermore relates to the use of polymers in accordance with the present invention as semiconductor, for example as electron donor or p-type semiconductor, or as electron acceptor or n-type semiconductor.

The invention furthermore relates to the use of polymers in accordance with the present invention as semiconducting material, preferably as electron donor, in an organic electronic device or a component of an organic electronic device.

The invention furthermore relates to the use of polymers in accordance with the present invention as light-emitting emitting in an organic electronic device or a component of an organic electronic device.

The invention furthermore relates to a semiconducting and/or light-emitting material, an organic electronic device or a component of an organic electronic device, containing a polymer in accordance with the present invention having electron-donor properties and one or more additional compounds or polymers having electron-acceptor properties.

The invention furthermore relates to a semiconducting and/or light-emitting material, an organic electronic device or a component of an organic electronic device, containing a polymer in accordance with the present invention having electron-acceptor properties and one or more additional compounds or polymers having electron-donor properties.

The invention furthermore relates to a semiconducting and/or light-emitting material, an organic electronic device or a component of an organic electronic device, containing one or more polymers in accordance with the present invention having electron-donor properties and one or more polymers in accordance with the present invention having electron-acceptor properties.

The invention furthermore relates to a mixture or polymer blend comprising one or more polymers in accordance with the present invention and one or more additional compounds or polymers, which are preferably selected from compounds and polymers having semiconductor, charge-transport, hole/electron-transport, hole/electron-blocking, electrically conducting, photoconducting or light-emitting properties.

The invention furthermore relates to a mixture or polymer blend comprising one or more polymers according to the present invention having electron-donor properties and one or more additional compounds selected from electron acceptors or organic n-type semiconductors, preferably selected from the group consisting of fullerenes and substituted fullerenes.

The invention furthermore relates to a formulation comprising one or more polymers, mixtures or polymer blends in accordance with the present invention and one or more solvents, preferably selected from organic solvents.

The invention furthermore relates to the use of polymers, formulations, mixtures and polymer blends in accordance with the present invention as charge-transport material, semiconductor material, electrically conducting material, photoconducting material or light-emitting material, preferably in a device having optical, electro-optical, electronic, electroluminescent or photoluminescent properties, in a component of a device of this type, or in a product containing a device of this type.

The invention furthermore relates to a charge-transport, semiconductor, electrically conducting, photoconducting or light-emitting material comprising a polymer, formulation, mixture or polymer blend in accordance with the present invention.

The invention furthermore relates to an optical, electro-optical, electronic, electroluminescent or photoluminescent device, a component of a device of this type or a product containing a device of this type, which contains a polymer, formulation, mixture or polymer blend in accordance with the present invention.

The optical, electro-optical, electronic, electroluminescent and photoluminescent devices include, without being restricted thereto, organic field-effect transistors (OFETs), organic thin-film transistors (OTFTs), organic light-emitting diodes (OLEDs), organic light-emitting transistors (OLETs), organic photovoltaic devices (OPVs), organic photodetectors (OPDs), organic solar cells, Perovskite solar cells, Schottky diodes, laser diodes and organic photoconductors.

Particular preference is given to OFETs, OPV devices, organic solar cells and OPDs, in particular OPV devices and organic solar cells, in which the organic semiconductors in the photoactive layer form a bulk heterojunction "BHJ") (BHJ-OPVs).

The components of the devices according to the invention include, without being restricted thereto, charge-injection layers, charge-transport layers, interlayers, planarisation layers, antistatic films, polymer electrolyte membranes (PEMs), conducting substrates and conducting patterns.

The products containing the devices according to the invention include, without being restricted thereto, integrated circuits (ICs), capacitors, RFID (radio-frequency identification) tags or security marks or security devices containing these, flat-panel screens, backlighting for displays, electro-photographic devices, organic memory devices, sensor devices, photovoltaic systems, biosensors and biochips.

The invention furthermore relates to the use of the polymers, formulations, mixtures and polymer blends in accordance with the present invention as electrode materials in batteries and in components or devices for the detection and discrimination of DNA sequences.

FIGS. 1a-d show the opto-electronic characteristic data of an OLED comprising a polymer according to Example 3.1 as emitter.

Figure 2:
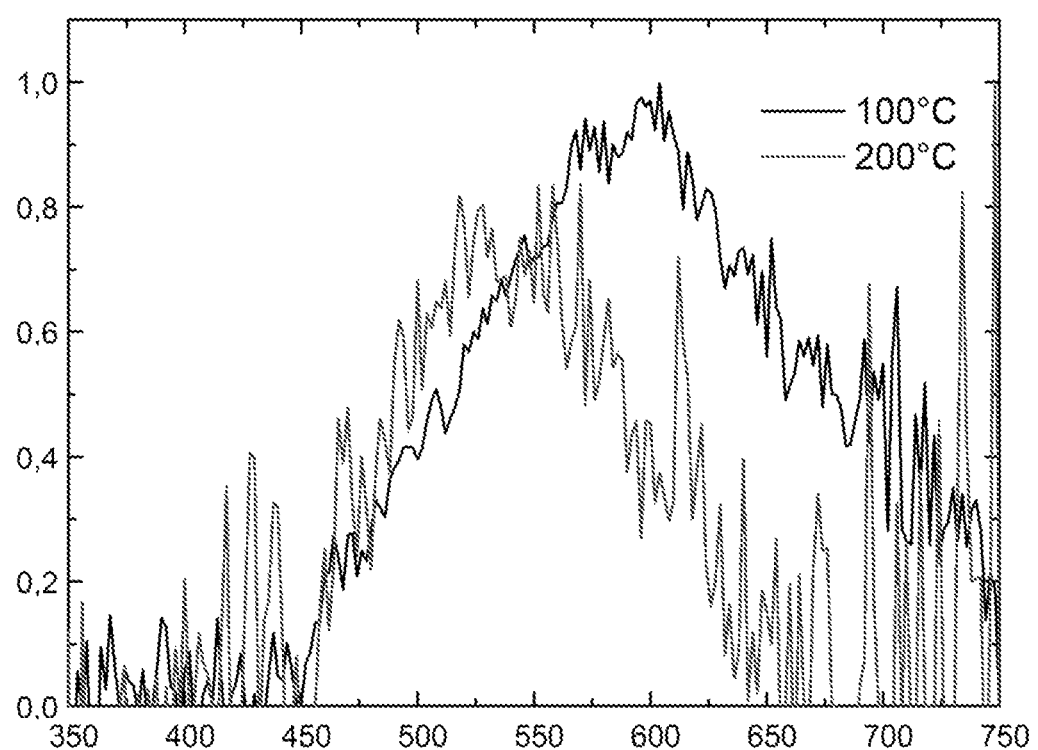

FIG. 2 shows the electroluminescence spectra of an OLED comprising a polymer according to Example 3.1 as emitter before and after the oxalate side chains have been cleaved off thermally.

The monomers and polymers of the present invention can be synthesised easily and have a number of advantageous properties, such as a low energy gap, high charge-carrier mobility, high solubility in organic solvents, good processability during production of the device, high oxidation stability and a long lifetime in electronic devices.

The oxalate side chains increase the solubility of the polymer in conventional organic solvents, which allows simpler processing of the material from solution.

The oxalate side chains can be cleaved off thermally after processing of the polymer from solution, for example in the form of a thin layer. This increases the stability of the polymer layer to solvents used, for example, for the subsequent application of additional layers. In addition, crystallisation of the polymer is improved and improved pi-pi stacking of the polymer chains in the solid state is facilitated, which results in improved charge-transport properties in the form of higher charge-carrier mobility.

The solubility-improving groups in the polymers according to the invention exhibit better solubility compared with standard groups, such as alkyl radicals, in conventional solvents. This has been demonstrated by gel permeation chromatography (GPC) with reference to the $M_n$ values of the polymers. Standard polymers, such as poly-3-hexylthiophene (P3HT), were investigated here with the polymers according to the invention in various solvents (comparison between acetone and chloroform).

The term "polymer" generally denotes a molecule having a high relative molecular weight whose structure essentially comprises the multiple repetition of units which are actually or conceptually derived from molecules having low relative molecular weight (PAC, 1996, 68, 2291). The term "oligomer" generally denotes a molecule having a moderate relative molecular weight whose structure essentially includes a small number of units which are actually or conceptually derived from molecules having lower relative molecular weight (PAC, 1996, 68, 2291). In a preferred meaning in accordance with the present invention, a polymer denotes a compound having >1, preferably ≥5, recurring units, and an oligomer denotes a compound having >1 and <10, preferably <5, recurring units.

Unless indicated otherwise, the molecular weight indicated is the number average molecular weight $M_n$ or weight average molecular weight $M_w$, determined by gel permeation chromatography (GPC) against polystyrene standards in eluting solvents, such as tetrahydrofuran, trichloromethane (TCM, chloroform), chlorobenzene or 1,2,4-trichlorobenzene. Unless indicated otherwise, trichloromethane is employed as solvent. The degree of polymerisation (n) denotes the number average degree of polymerisation, given by $n=M_n/M_u$, in which $M_u$ is the molecular weight of the individual recurring unit, as described in J. M. G. Cowie, *Polymers: Chemistry & Physics of Modern Materials*, Blackie, Glasgow, 1991.

Above and below, an asterisk (*) in a formula which shows a polymer or recurring unit, such as the formula I and sub-formulae thereof, indicates a link to the adjacent recurring unit in the polymer chain.

The terms "recurring unit" and "monomer unit" denote the constitutional repeating unit (CRU), which is the smallest basic unit whose repetition represents a regular macromolecule, a regular oligomer molecule, a regular block or a regular chain (PAC, 1996, 68, 2291). The term "unit" denotes a structural unit, which may itself be a recurring unit or may form a recurring unit together with other units.

The term "leaving group" denotes an atom or group (charged or uncharged) which is separated from an atom in the part which is regarded as the remaining or main part of the molecule by participation in a specific reaction (see also PAC, 1994, 66, 1134).

The term "conjugated" denotes a compound which contains predominantly C atoms having $sp^2$ hybridisation (or optionally also sp hybridisation), which may also be replaced by heteroatoms. In the simplest case, this is, for example, a compound having alternating C—C single and double (or triple) bonds, but also includes compounds containing units, such as 1,3-phenylene. "Principally" in this connection means that a compound having naturally (spontaneously) occurring defects which may result in interruption of the conjugation is likewise regarded as a conjugated compound.

The terms "donor" and "acceptor" in each case denote an electron donor or acceptor respectively. The term "electron donor" denotes a chemical compound or group which donates electrons to another chemical compound or group. The term "electron acceptor" denotes a chemical compound or group which accepts electrons from another chemical compound or group (see U.S. Environmental Protection Agency, 2009, Glossary of technical terms) http://www.epa.gov/oust/cat/TUMGLOSS.HTM The term "n-type" or "n-type semiconductor" denotes an extrinsic semiconductor in which the density of the conducting electrons is higher than the density of the mobile holes. The terms "p-type" or "p-type semiconductor" denotes an extrinsic semiconductor in which the density of the conducting electrons is lower than the density of the mobile holes (see J. Thewlis, *Concise Dictionary of Physics*, Pergamon Press, Oxford, 1973).

The term "carbyl group" as used above and below stands for any desired monovalent or multivalent organic moiety which contains at least one carbon atom, either without any non-carbon atoms (such as, for example, —C≡C—), or optionally in combination with at least one non-carbon atom, such as N, O, S, P, Si, Se, As, Te or Ge (for example carbonyl, etc.). The term "hydrocarbyl group" denotes a carbyl group which additionally contains one or more H atoms and optionally one or more heteroatoms, such as, for example, N, O, S, P, Si, Se, As, Te or Ge.

A carbyl or hydrocarbyl group having a chain of 3 or more C atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, where all these groups optionally contain one or more heteroatoms, preferably selected from N, O, S, P, Si, Se, As, Te and Ge.

The carbyl or hydrocarbyl group can be a saturated or unsaturated acyclic group or a saturated or unsaturated cyclic group. Unsaturated acyclic or cyclic groups are preferred, in particular aryl, alkenyl and alkynyl groups (in particular ethynyl). An acyclic $C_1$-$C_{40}$ carbyl or hydrocarbyl group may be straight-chain or branched. The $C_1$-$C_{40}$ carbyl or hydrocarbyl group includes, for example: a $C_1$-$C_{40}$ alkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Of the above groups, preference is given to a $C_1$-$C_{20}$ alkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_6$-$C_{12}$ aryl group or a $C_4$-$C_{20}$ polyenyl group. Likewise included are combinations of groups having carbon atoms and groups having heteroatoms, such as, for example, an alkynyl group, preferably ethynyl, which is substituted by a silyl group, preferably a trialkylsilyl group.

Aryl and heteroaryl preferably denote a mono-, bi- or tricyclic aromatic or heteroaromatic group having 4 to 30 ring C atoms, which may also contain condensed rings and is optionally substituted by one or more groups L as defined above.

Particularly preferred substituents L are selected from halogen, especially preferably F, or alkyl, alkoxy, oxaalkyl, thioalkyl, fluoroalkyl and fluoroalkoxy having 1 to 12 C atoms or alkenyl, alkynyl having 2 to 12 C atoms.

Particularly preferred aryl and heteroaryl groups are phenyl, in which, in addition, one or more CH groups may be replaced by N, naphthalene, thiophene, selenophene, thienothiophene, dithienothiophene, fluorene and oxazole, all of which may be unsubstituted or mono- or polysubstituted by L as defined above. Very preferred rings are selected from pyrrole, preferably N-pyrrole, pyridine, preferably 2- or 3-pyridine, pyrimidine, thiophene preferably 2-thiophene, selenophene, preferably 2-selenophene, thieno-[3,2-b]thiophene, thiazole, thiadiazole, oxazole and oxadiazole, particularly preferably thiophen-2-yl, 5-substituted thiophen-2- yl or pyridin-3-yl, all of which may be unsubstituted or mono- or polysubstituted by L as defined above.

An alkyl or alkoxy radical, i.e. where the terminal $CH_2$ group has been replaced by —O—, may be straight-chain or branched. It is preferably straight-chain, has 2, 3, 4, 5, 6, 7 or 8 carbon atoms and thus preferably stands, for example, for ethyl, propyl, butyl, pentyl, hexyl, heptyl, octyl, ethoxy, propoxy, butoxy, pentoxy, hexoxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy.

An alkenyl group, in which one or more $CH_2$ groups have been replaced by —CH=CH—, may be straight-chain or branched. It is preferably straight-chain, has 2 to 10 C atoms and thus preferably stands, for example, for vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl, oct-1-, -2-, -3-, -4-, -5-, -6- or -7-enyl, non-1-, -2-, -3-, -4-, -5-, -6-, -7- or -8-enyl, or dec-1-, -2-, -3-, -4-, -5-, -6-, -7-, -8- or -9-enyl.

Particularly preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples of particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where a $CH_2$ group has been replaced by —O—, preferably stands, for example, for straight-chain 2-oxapropyl (=methoxymethyl), 2- (=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl. Oxaalkyl, i.e. where one $CH_2$ group has been replaced by —O—, preferably stands, for example, for straight-chain 2-oxapropyl (=methoxymethyl), 2- (=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl.

In an alkyl group in which one $CH_2$ group has been replaced by —O— and one has been replaced by —CO—, these radicals are preferably adjacent. These radicals together thus form a carbonyloxy group —CO—O— or oxycarbonyl group —O—CO—. This group is preferably straight-chain and has 2 to 6 C atoms. It thus preferably stands for acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, 4-(methoxycarbonyl)butyl.

An alkyl group in which two or more $CH_2$ groups have been replaced by —O— and/or —COO— may be straight-chain or branched. It is preferably straight-chain and has 3 to 12 C atoms. It thus preferably stands for biscarboxymethyl, 2,2-biscarboxyethyl, 3,3-biscarboxypropyl, 4,4-biscarboxybutyl, 5,5-biscarboxypentyl, 6,6-biscarboxyhexyl, 7,7-biscarboxyheptyl, 8,8-biscarboxyoctyl, 9,9-biscarboxynonyl, 10,10-biscarboxydecyl, bis(methoxycarbonyl) methyl, 2,2-bis(methoxycarbonyl)ethyl, 3,3-bis(methoxycarbonyl)propyl, 4,4-bis(methoxycarbonyl)butyl, 5,5-bis (methoxycarbonyl)pentyl, 6,6-bis(methoxycarbonyl)hexyl, 7,7-bis(methoxycarbonyl)heptyl, 8,8-bis(methoxycarbonyl) octyl, bis(ethoxycarbonyl)methyl, 2,2-bis(ethoxycarbonyl) ethyl, 3,3-bis(ethoxycarbonyl)propyl, 4,4-bis(ethoxycarbonyl)butyl or 5,5-bis(ethoxycarbonyl)hexyl.

A thioalkyl group, i.e where a $CH_2$ group has been replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), in which the $CH_2$ group adjacent to the $sp^2$-hybridised vinyl carbon atom has preferably been replaced.

A fluoroalkyl group is preferably straight-chain perfluoroalkyl $C_iF_{2i+1}$, in which i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

The above-mentioned alkyl, alkoxy, alkenyl, oxaalkyl, thioalkyl, carbonyl and carbonyloxy groups may be achiral or chiral groups. Particularly preferred chiral groups are, for example, 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethylhexoxy, 1-methylhexoxy, 2-octyloxy, 2-oxa-3-methylbutyl, 3-oxa-4-methylpentyl, 4-methylhexyl, 2-hexyl, 2-octyl, 2-nonyl, 2-decyl, 2-dodecyl, 6-methoxyoctoxy, 6-methyloctoxy, 6-methyloctanoyloxy, 5-methylheptyloxycarbonyl, 2-methylbutyryloxy, 3-methylvaleroyloxy, 4-methylhexanoyloxy, 2-chloropropionyloxy, 2-chloro-3-methylbutyryloxy, 2-chloro-4-methylvaleryloxy, 2-chloro-3-methylvaleryloxy, 2-methyl-3-oxapentyl, 2-methyl-3-oxahexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl and 2-fluoromethyloctyloxy. 2-hexyl, 2-octyl, 2-octyloxy, 1,1,1-trifluoro-2-hexyl, 1,1,1-trifluoro-2-octyl and 1,1,1-trifluoro-2-octyloxy are very preferred.

Preferred achiral branched groups are isopropyl, isobutyl (=methylpropyl), isopentyl (=3-methylbutyl), tert-butyl, isopropoxy, 2-methylpropoxy and 3-methylbutoxy.

In a further preferred embodiment of the present invention, the alkyl and alkoxy groups are selected from primary, secondary or tertiary alkyl or alkoxy having 1 to 30 C atoms, in which one or more H atoms have optionally been replaced by F, or aryl, aryloxy, heteroaryl or heteroaryloxy, which is optionally alkylated or alkoxylated and has 4 to 30 ring atoms. Very preferred groups of this type are selected from the group consisting of the following formulae

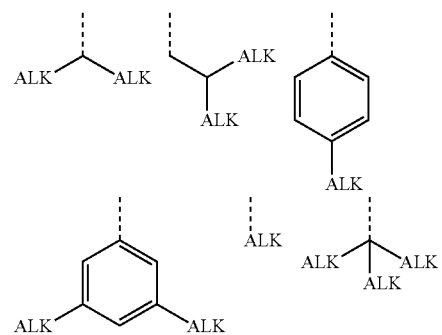

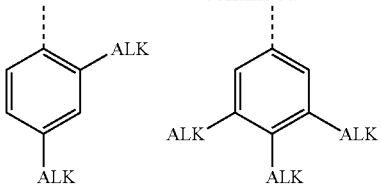

in which "ALK" denotes optionally fluorinated, preferably linear, alkyl or alkoxy having 1 to 20, preferably 1 to 12 C atoms, in the case of tertiary groups very preferably 1 to 9 C atoms, and the dashed line indicates the link to the ring to which these groups are linked. Of these groups, particular preference is given to those in which all ALK subgroups are identical.

—$CY^1$=$CY^2$— preferably denotes —CH=CH—, —CF=CF— or —CH=C(CN)—.

Halogen denotes F, Cl, Br or I, preferably F, Cl or Br.

Above and below, —CO—, —C(=O)— and —C(O)— denote a carbonyl group, i.e. a group having the structural formula

A preferred embodiment is directed to conjugated polymers according to the invention in which the recurring units which are substituted by an oxalate group, or the units of the formula I, are selected from the group consisting of the following formulae, which preferably have electron-donor properties:

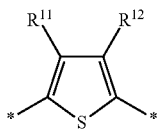
(D1)

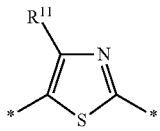
(D2)

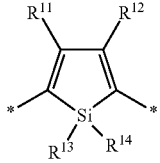
(D3)

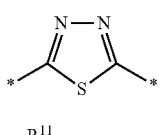
(D4)

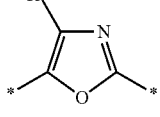
(D5)

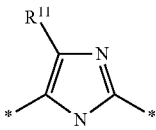
(D6)

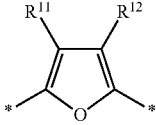
(D7)

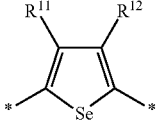
(D8)

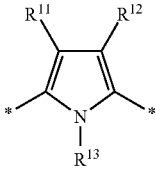
(D9)

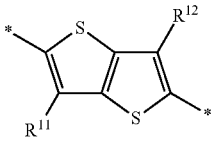
(D10)

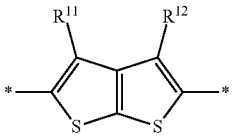
(D11)

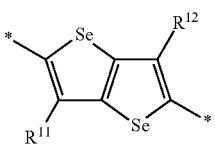
(D12)

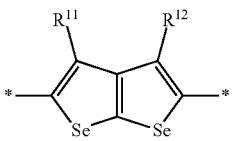
(D13)

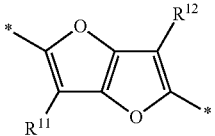
(D14)

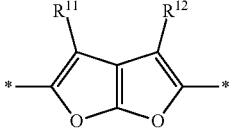
(D15)

-continued
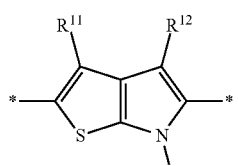
(D16)
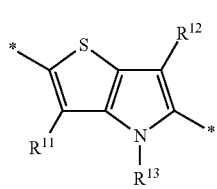
(D17)
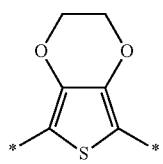
(D18)
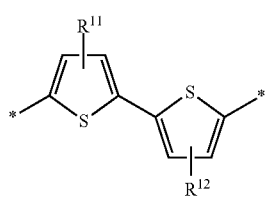
(D19)
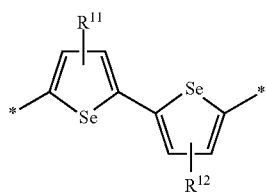
(D20)
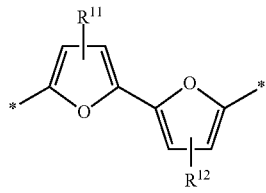
(D21)
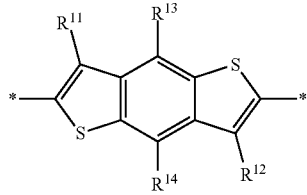
(D22)
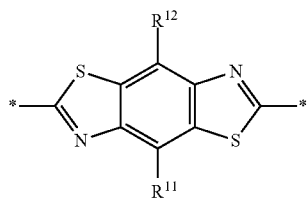
(D23)
-continued
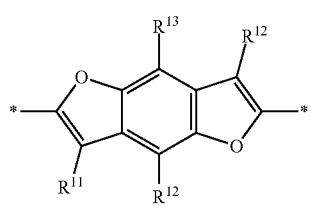
(D24)
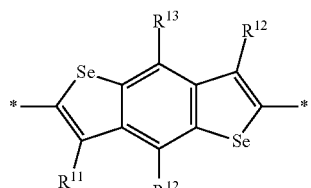
(D25)
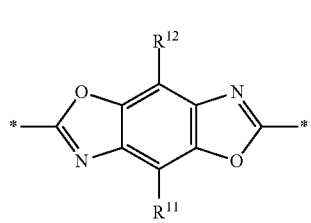
(D26)
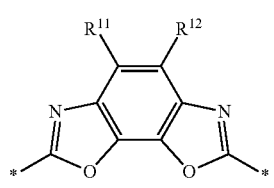
(D27)
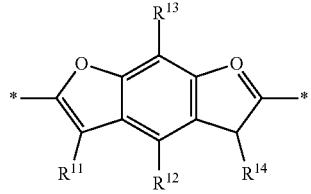
(D28)
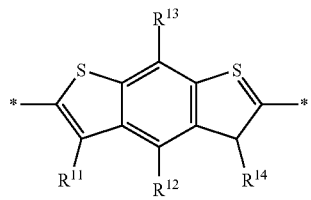
(D29)
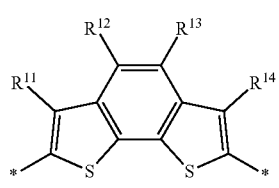
(D30)
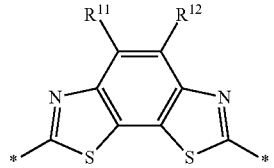
(D31)

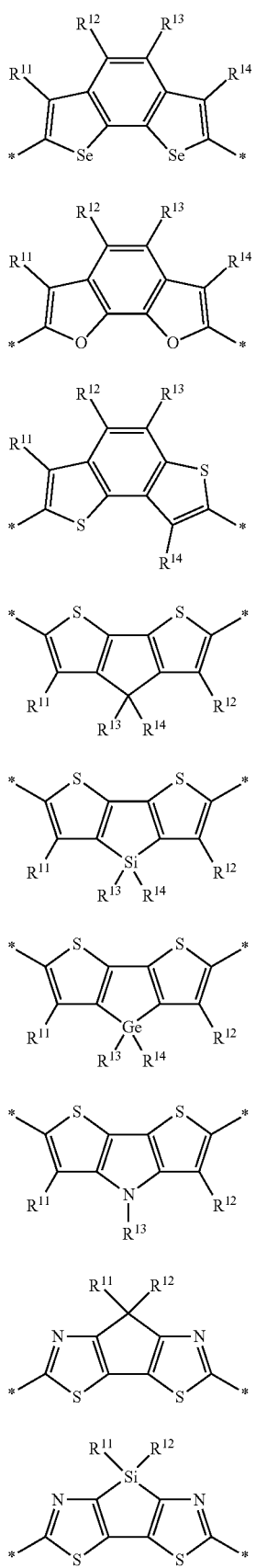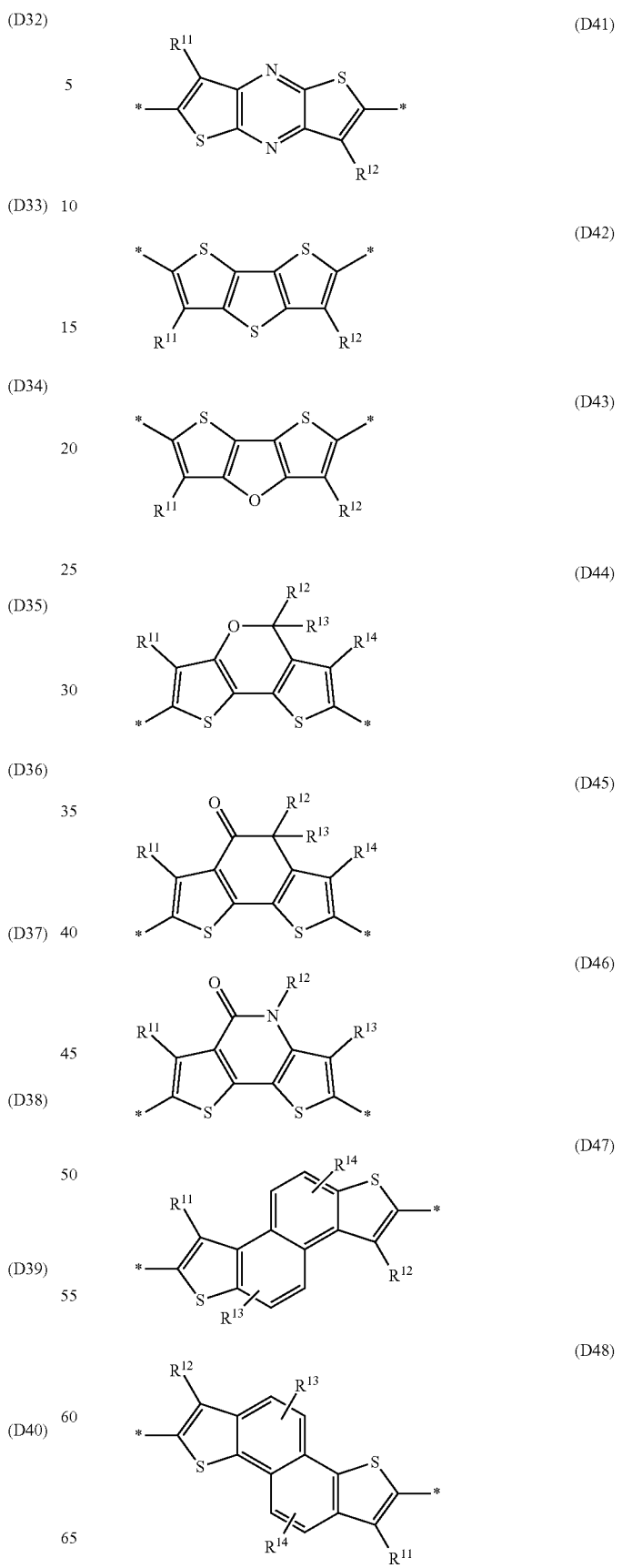

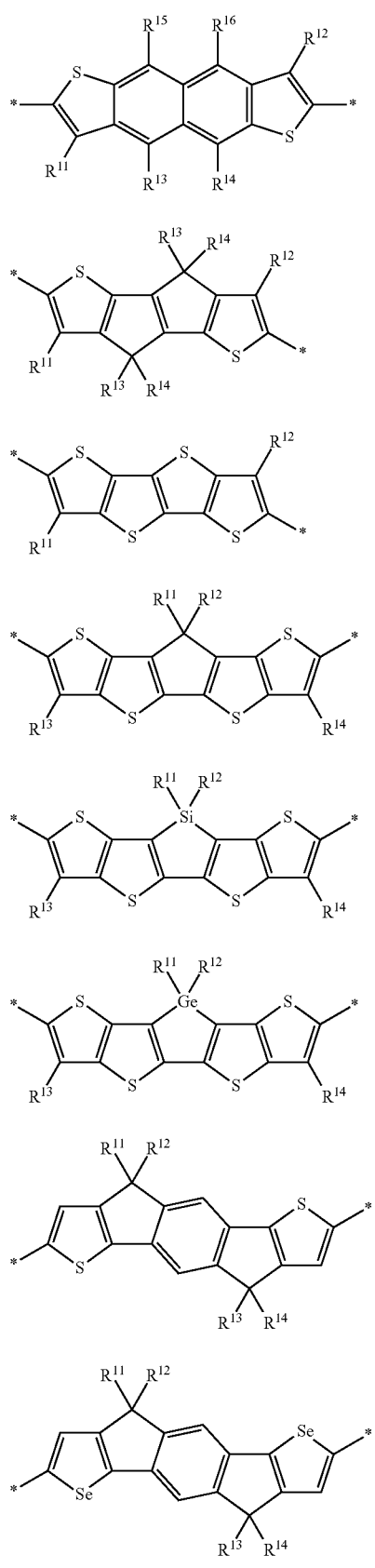
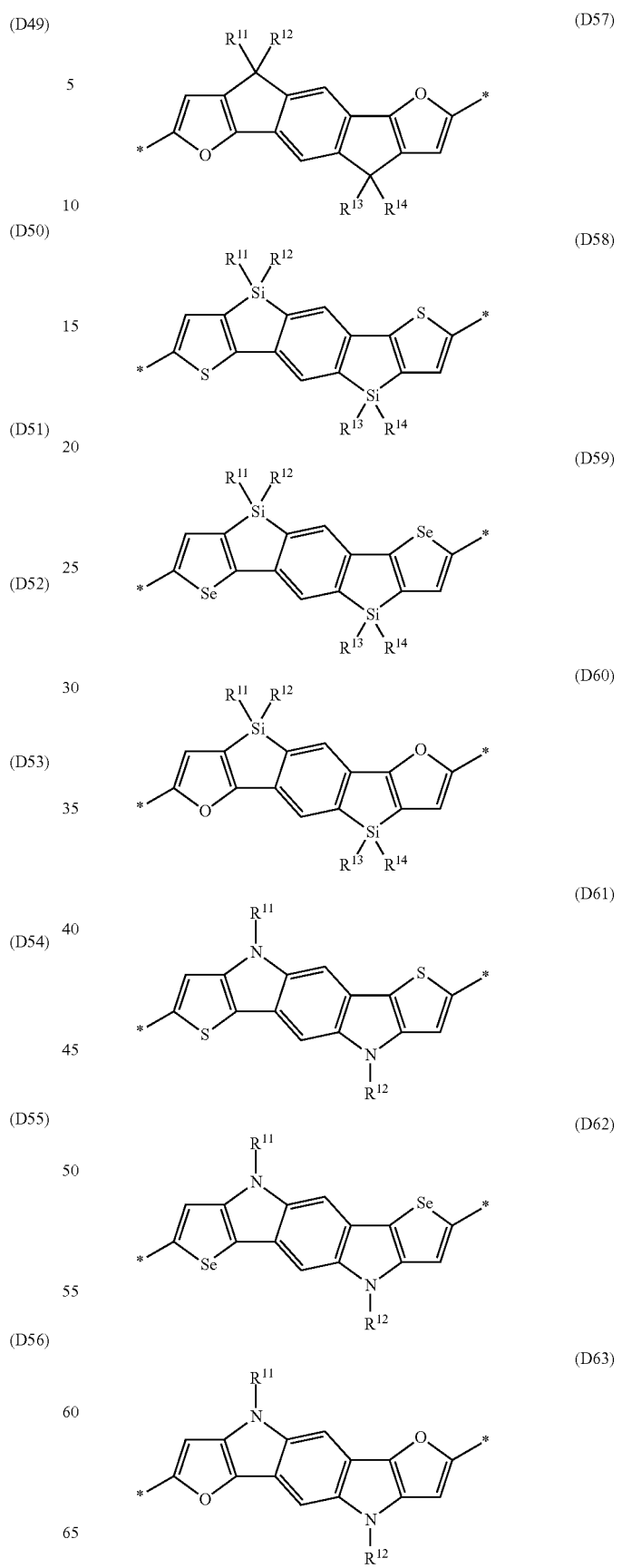

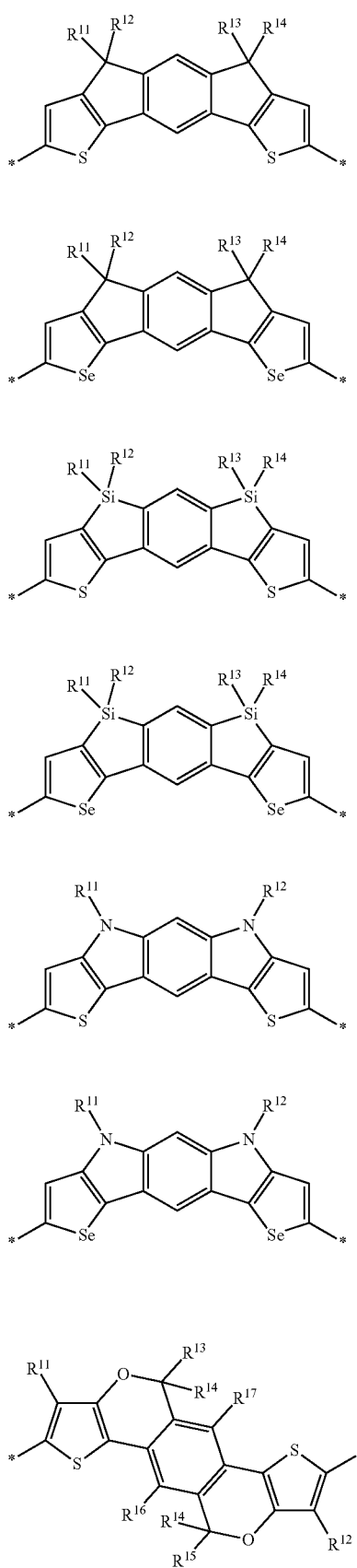
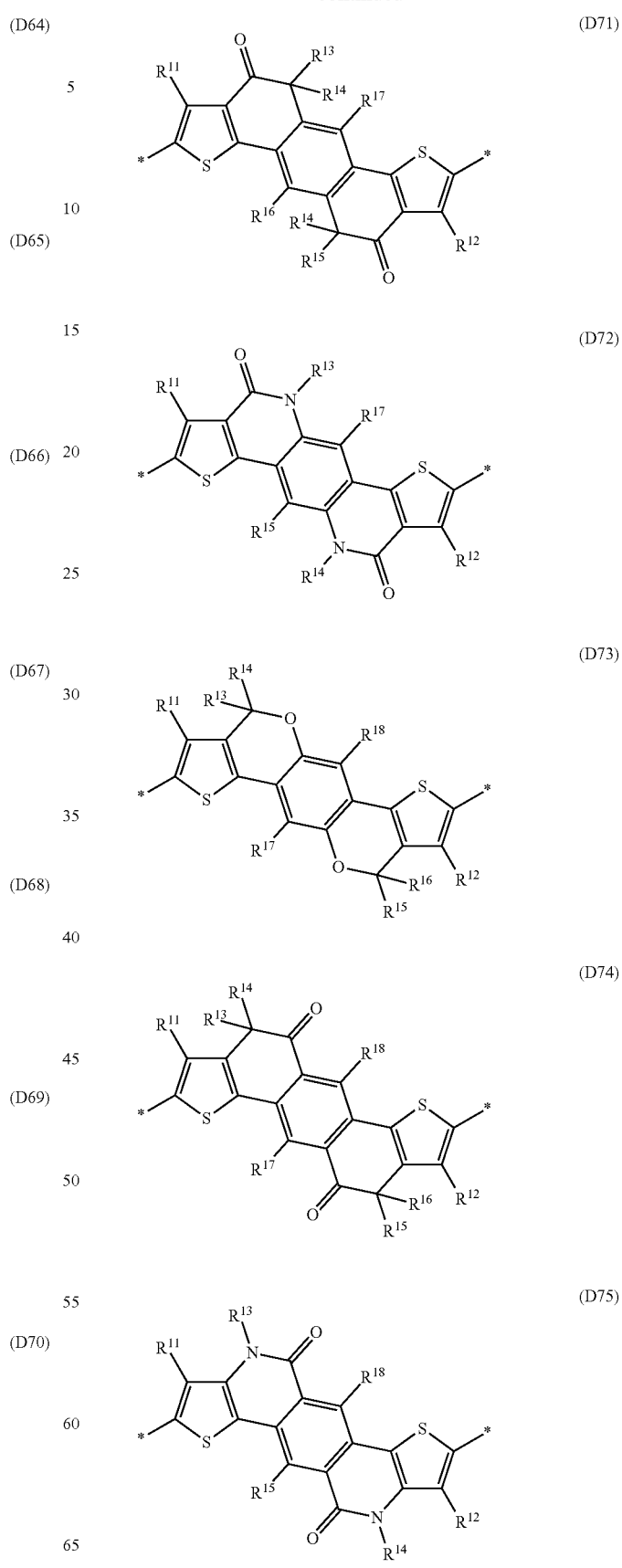

(D76)
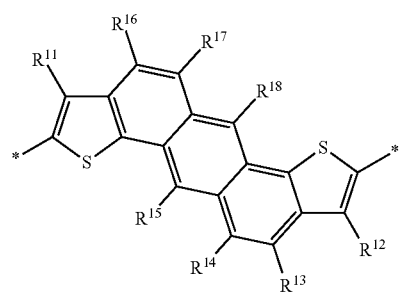
(D77)
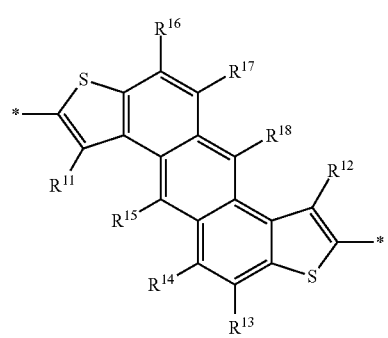
(D78)
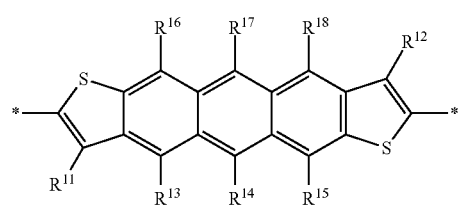
(D79)
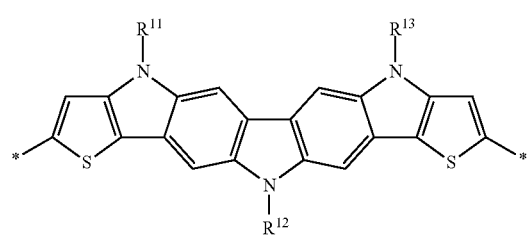
(D80)
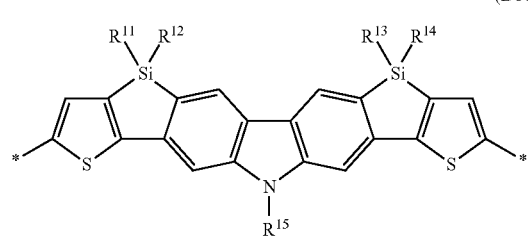
(D81)
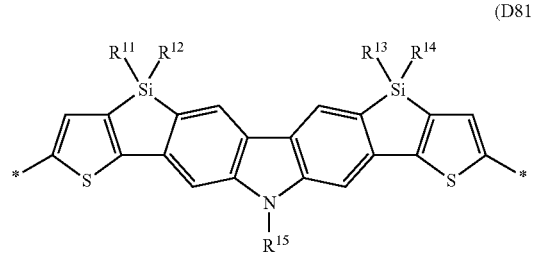
(D82)
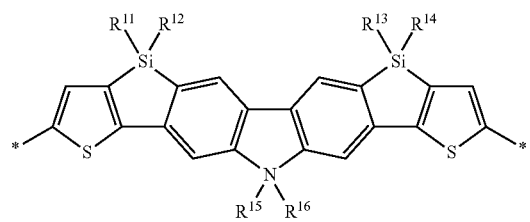
(D83)
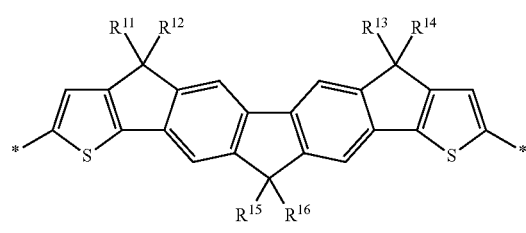
(D84)
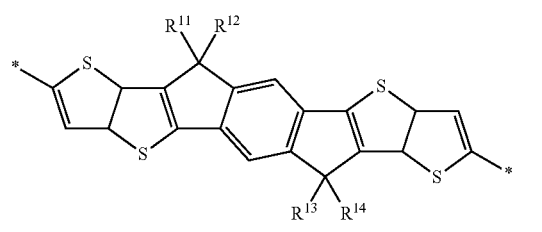
(D85)
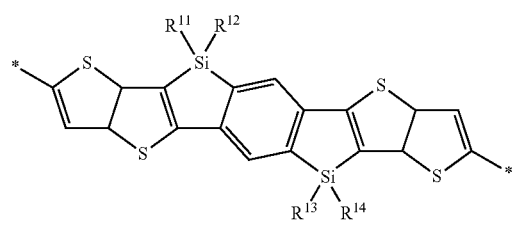
(D86)
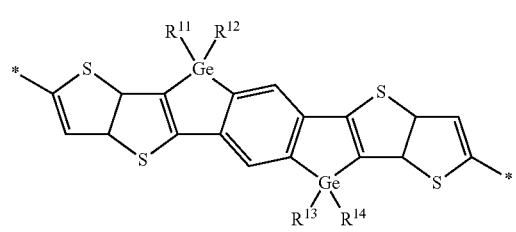
(D87)
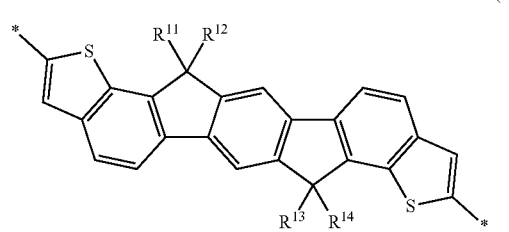

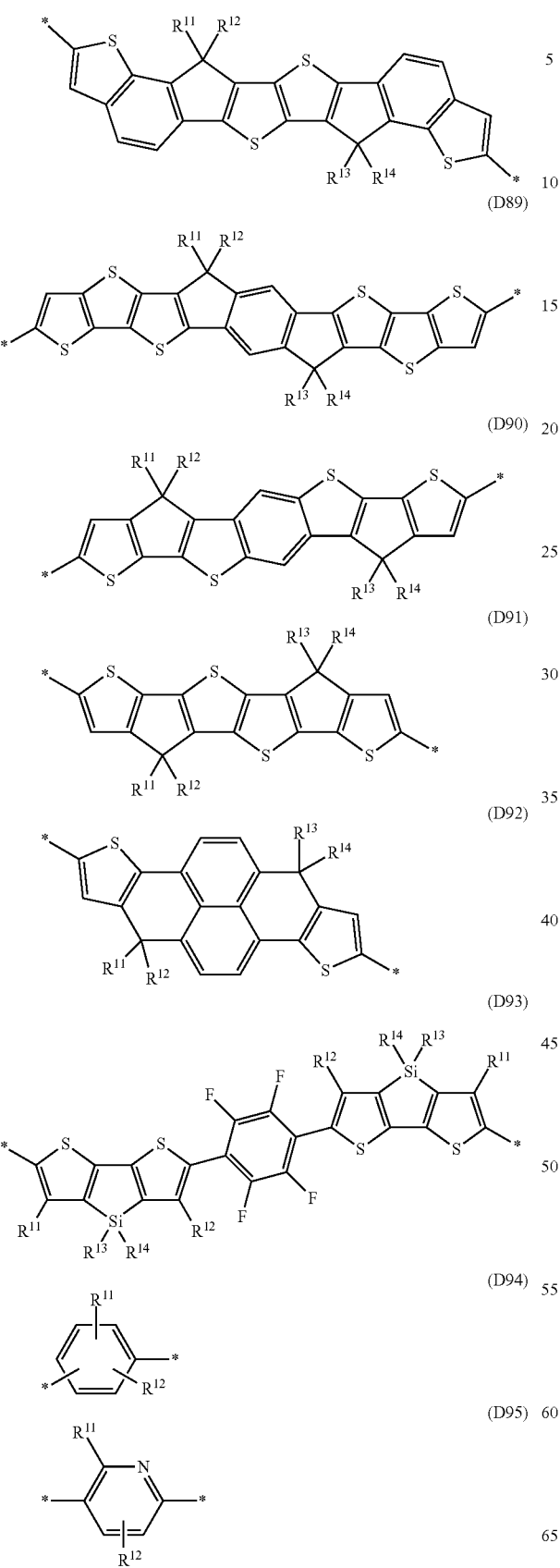
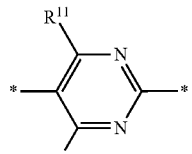
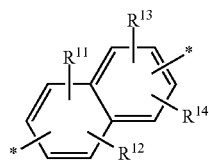
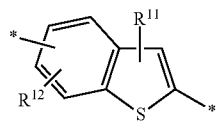
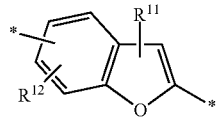
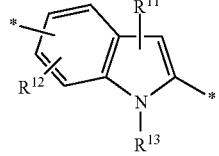
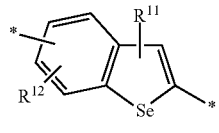
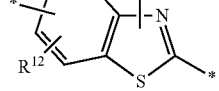
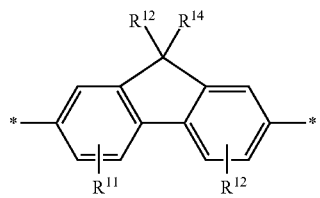
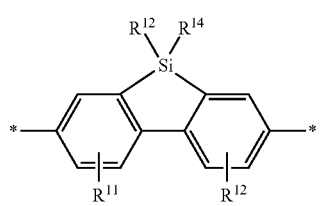

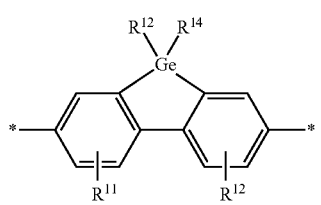 (D105)
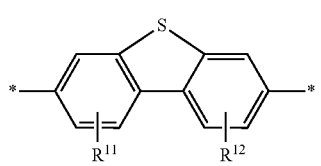 (D106)
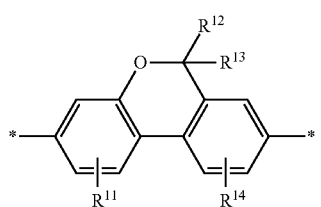 (D107)
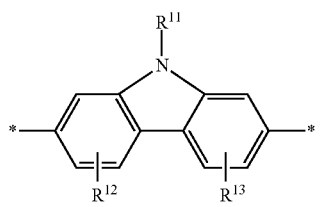 (D108)
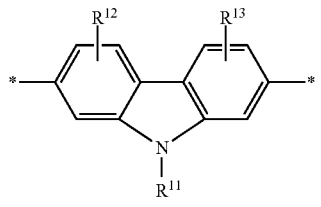 (D109)
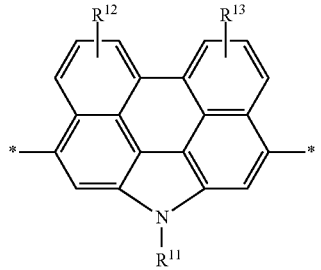 (D110)
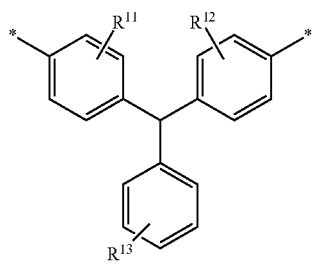 (D111)
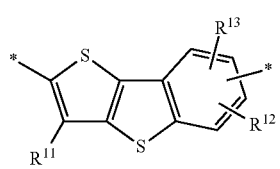 (D112)
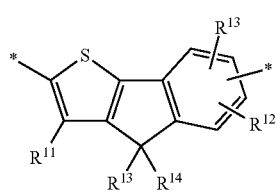 (D113)
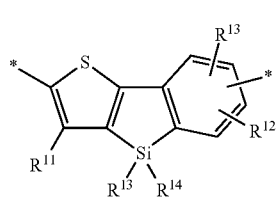 (D114)
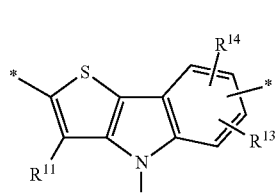 (D115)
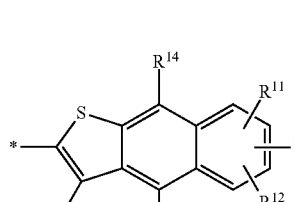 (D116)
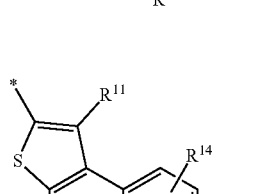 (D117)
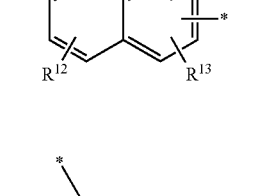 (D118)
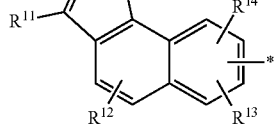

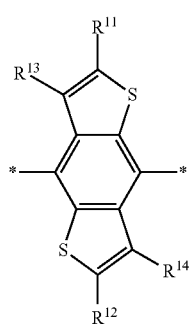 (D119)
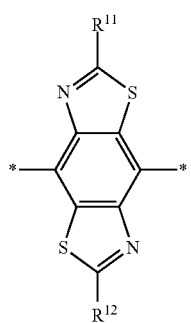 (D120)
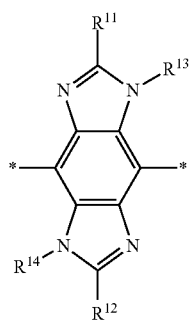 (D121)
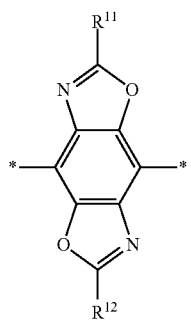 (D122)
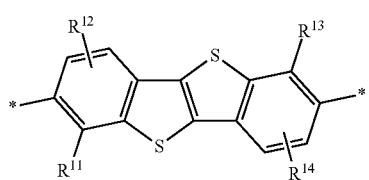 (D123)
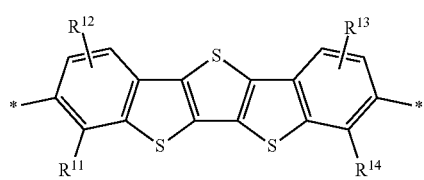 (D124)
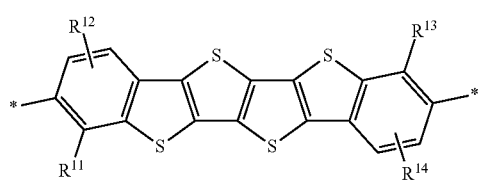 (D125)
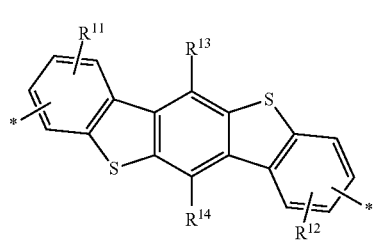 (D126)
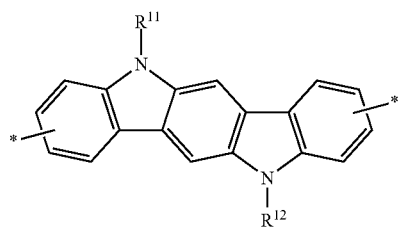 (D127)
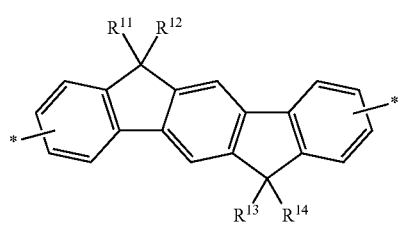 (D128)
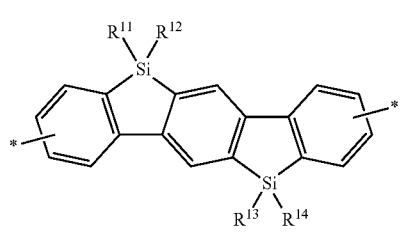 (D129)
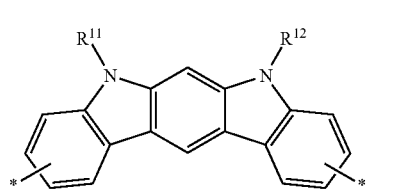 (D130)

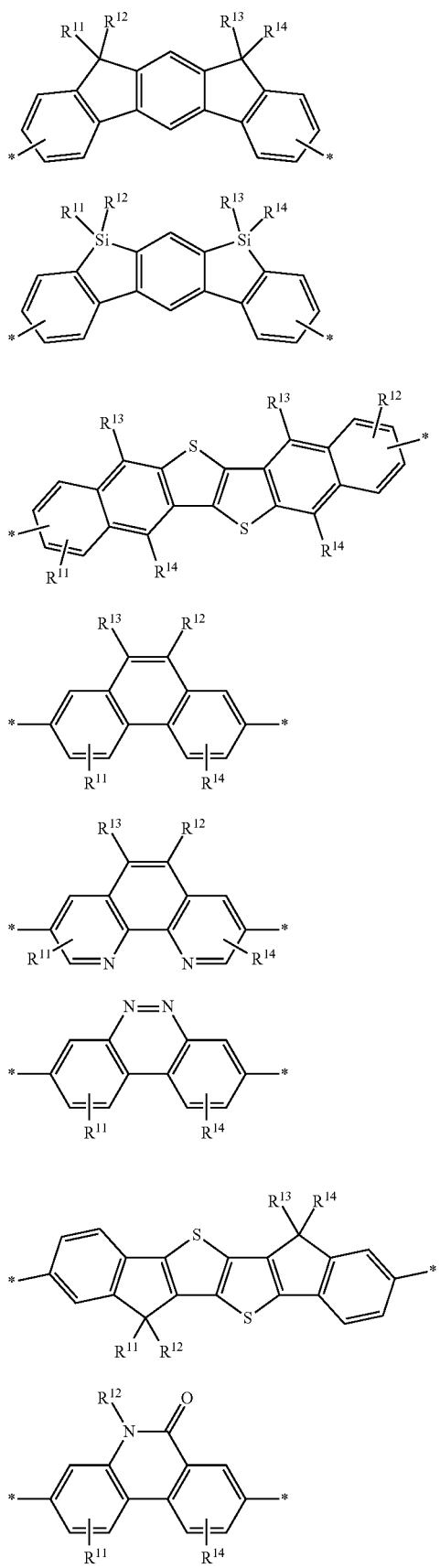
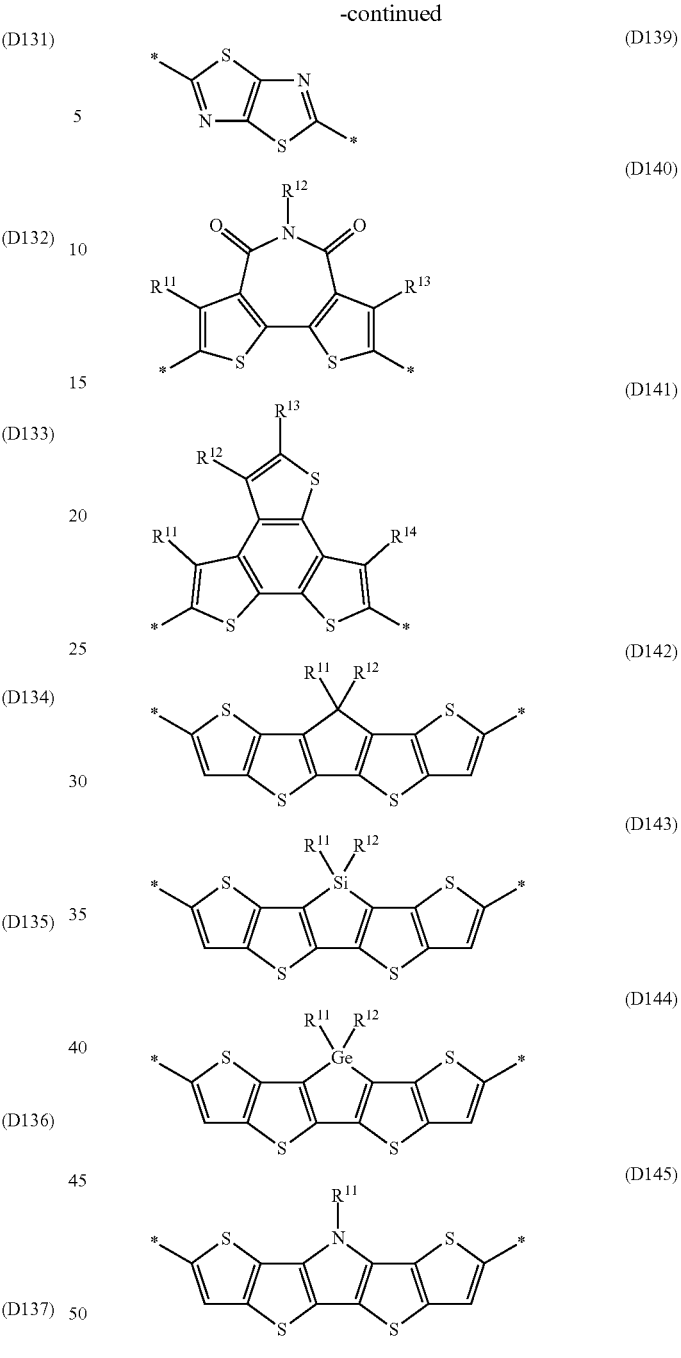

in which $R^{11}$, $R^{12}$, $R^{13}$, $R^{14}$, $R^{15}$, $R^{16}$, $R^{17}$ and $R^{18}$ each, independently of one another, denote H, F or $R^1$ as defined in formula I, and in which one or more of the radicals $R^{11}$, $R^{12}$, $R^{13}$, $R^{14}$, $R^{15}$, $R^{16}$, $R^{17}$ and $R^{18}$ denotes a group -Sp$^1$-O—C(O)—C(O)—O—$R^1$ as defined in formula I.

Preferred units of the formula I are selected from the group consisting of the formulae D1, D10, D19, D22, D25, D35, D36, D37, D38, D44, D84, D93, D94, D103, D108, D111, D137, D139, D140 and D141, in which $R^{11}$, $R^{12}$, $R^{13}$, $R^{14}$, $R^{15}$, $R^{16}$, $R^{17}$ and $R^{18}$ each, independently of one another, denote H, F or $R^1$ as defined in formula I, and in which one or more of the radicals $R^{11}$, $R^{12}$, $R^{13}$, $R^{14}$, $R^{15}$, $R^{16}$, $R^{17}$ and $R^{18}$ denote a group -Sp$^1$-OC(O)—C(O)—O—$R^1$ as defined in formula I.

A further preferred embodiment is directed to conjugated polymers according to the invention in which the recurring units which are substituted by an oxalate group, or the units of the formula I, are selected from the group consisting of the following formulae, which preferably have electron-acceptor properties:
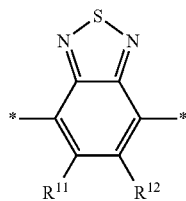 (A1)
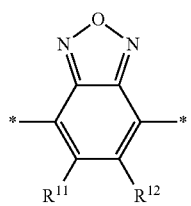 (A2)
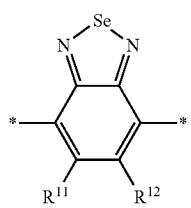 (A3)
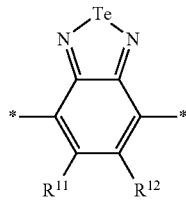 (A4)
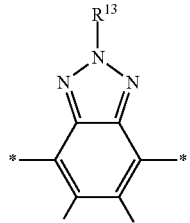 (A5)
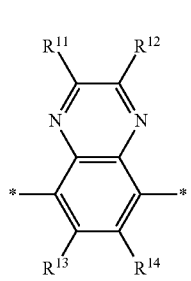 (A6)
-continued
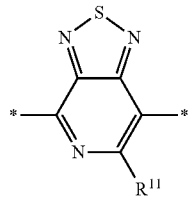 (A7)
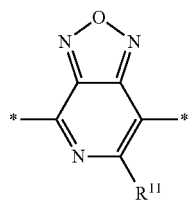 (A8)
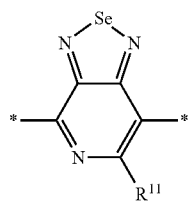 (A9)
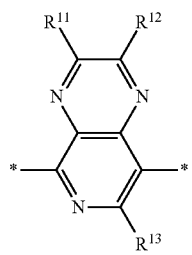 (A10)
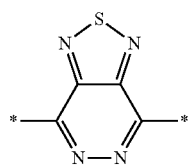 (A11)
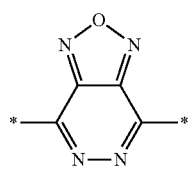 (A12)
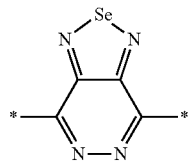 (A13)
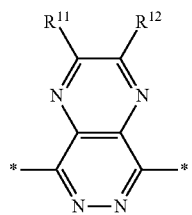 (A14)

(A15) 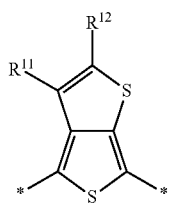
(A16) 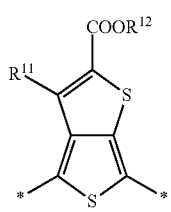
(A17) 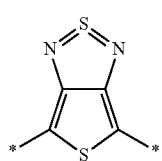
(A18) 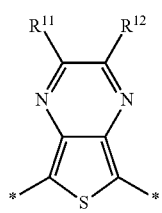
(A19) 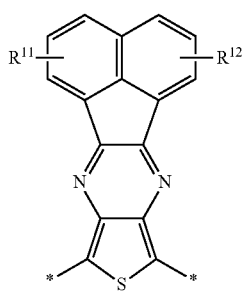
(A20) 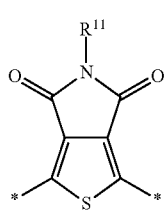
(A21) 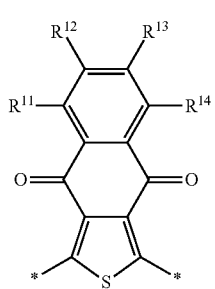
(A22) 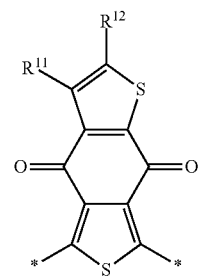
(A23) 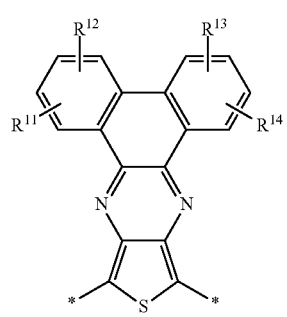
(A24) 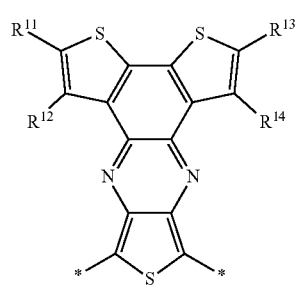
(A25) 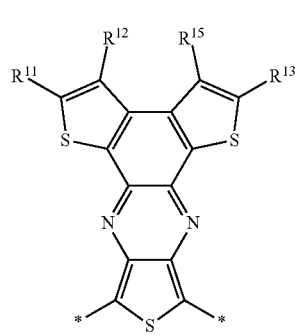
(A26) 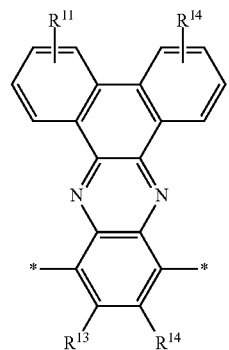

(A27)
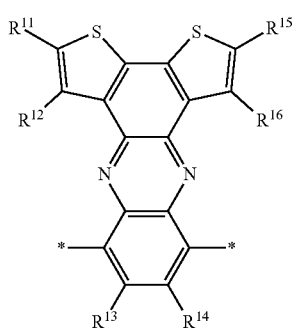
(A28)
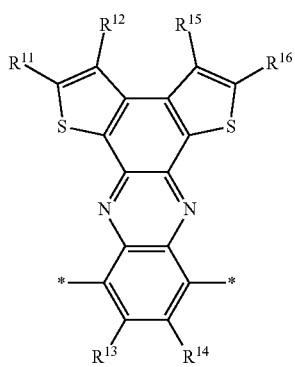
(A29)
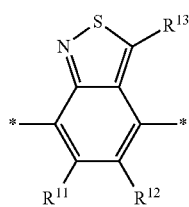
(A30)
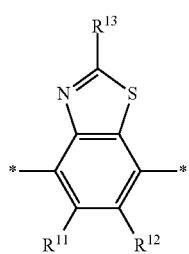
(A31)
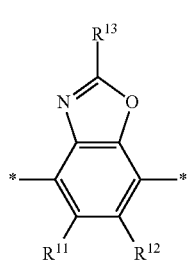
(A32)
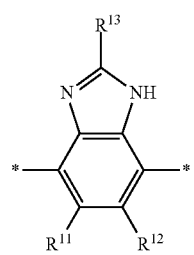
(A33)
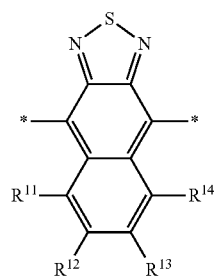
(A34)
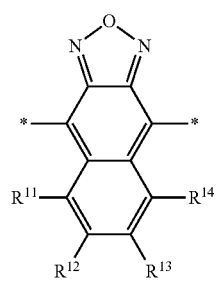
(A35)
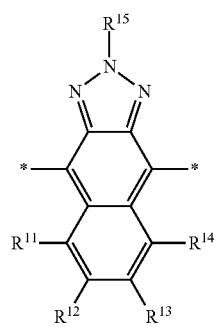
(A36)
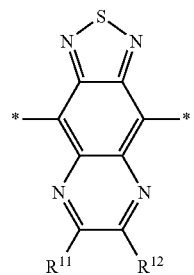

-continued
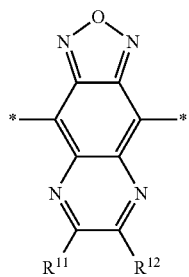
(A37)
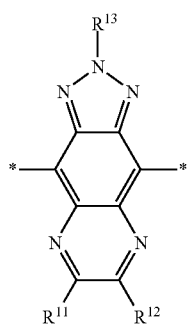
(A38)
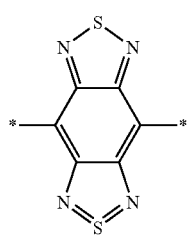
(A39)
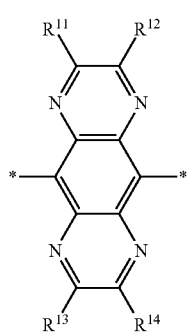
(A40)
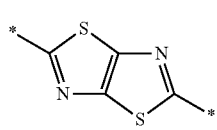
(A41)
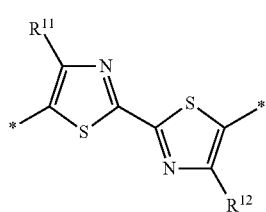
(A42)
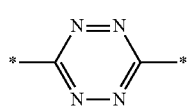
(A43)
-continued
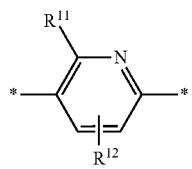
(A44)
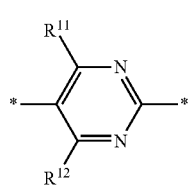
(A45)
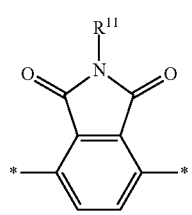
(A46)
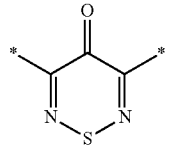
(A47)
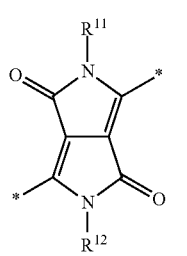
(A48)
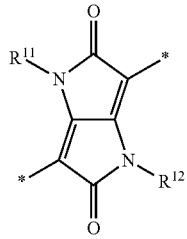
(A49)
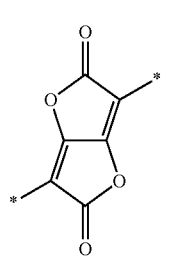
(A50)

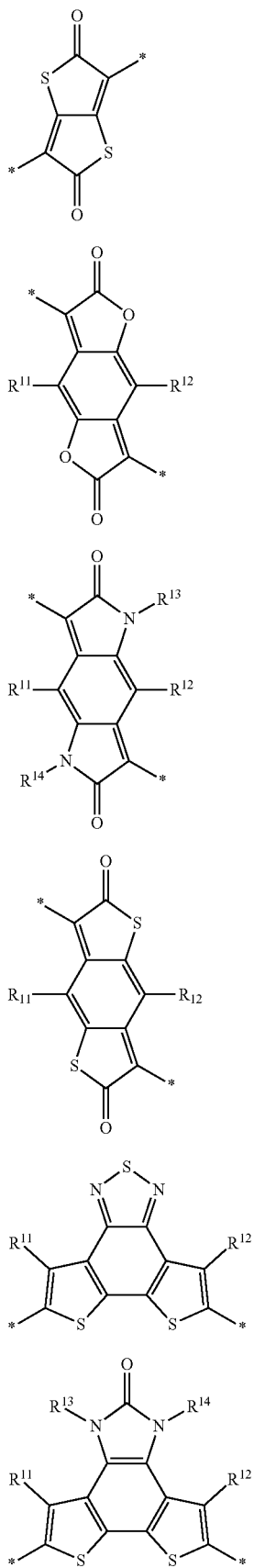
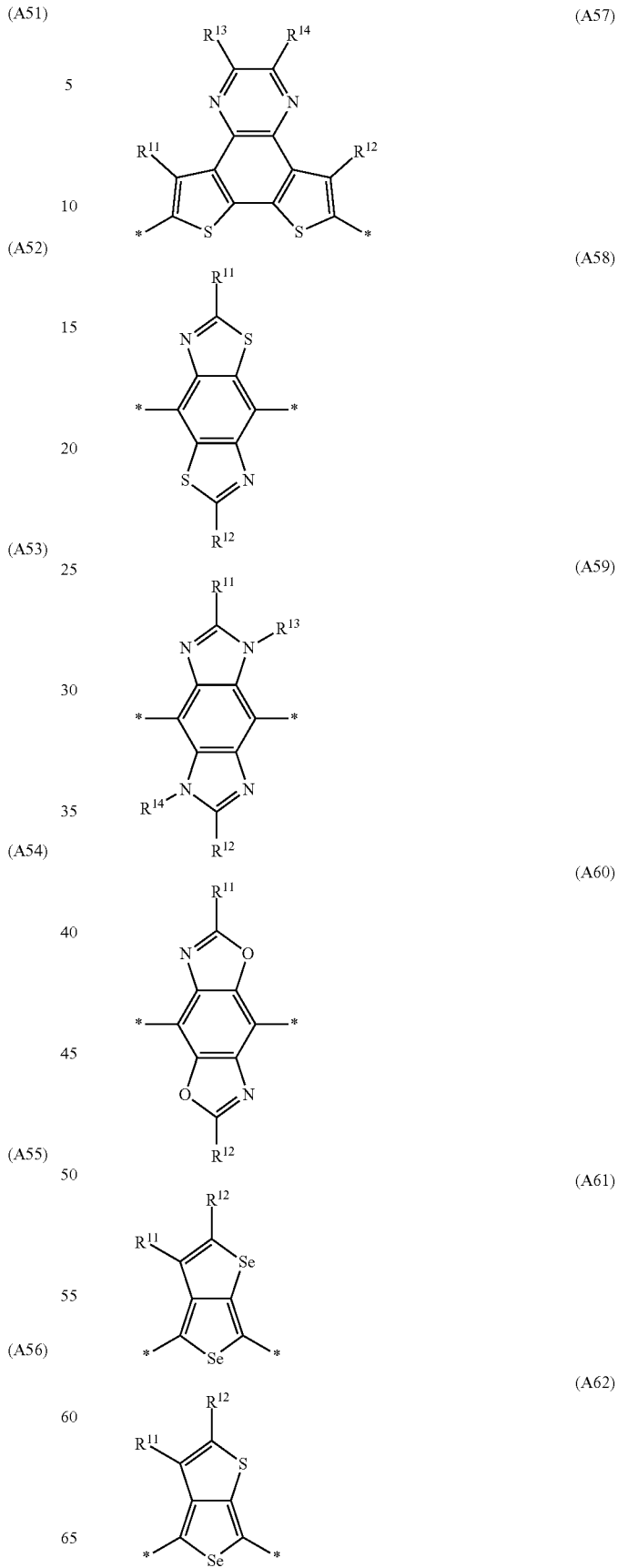

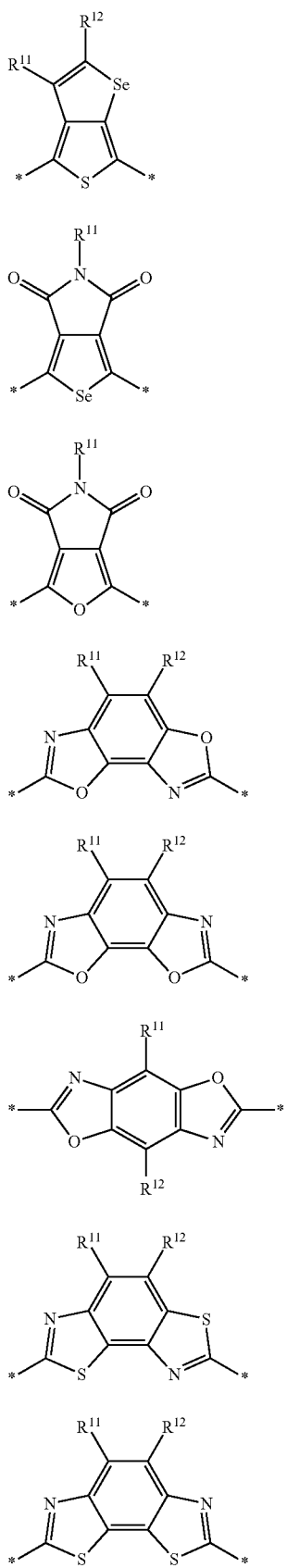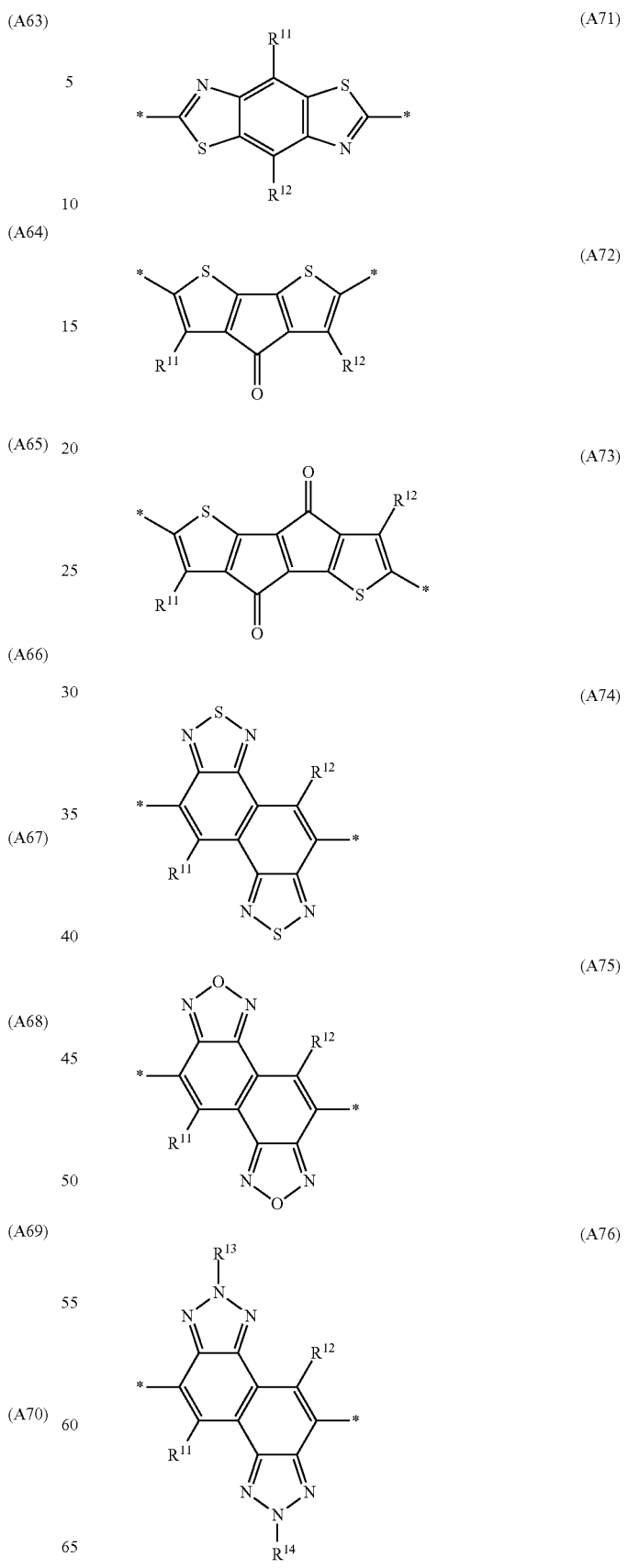

(A77) 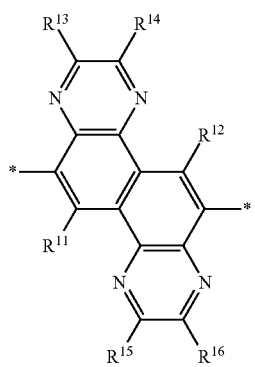
(A78) 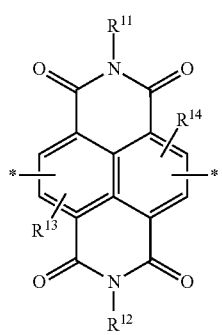
(A79) 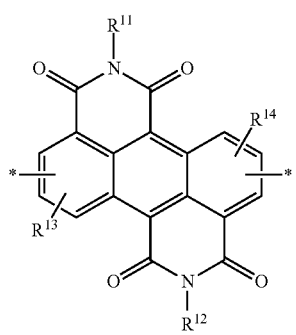
(A80) 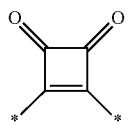
(A81) 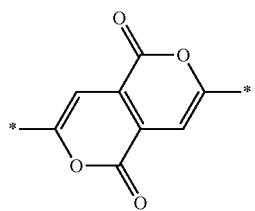
(A82) 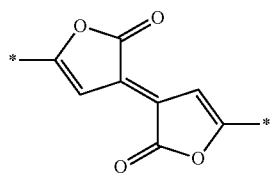
(A83) 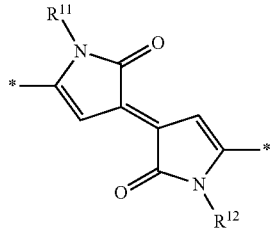
(A84) 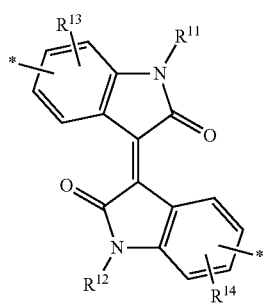
(A85) 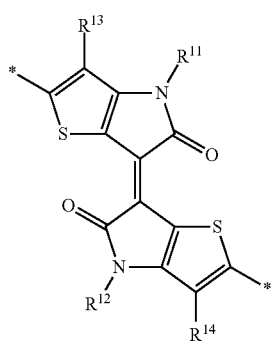
(A86) 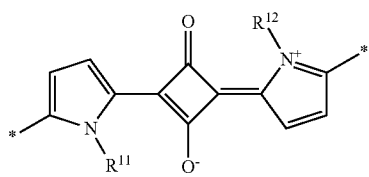
(A87) 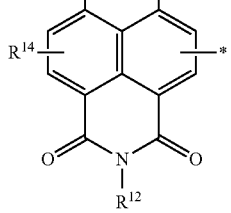

(A88) 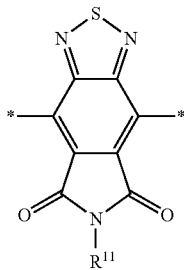

(A89) 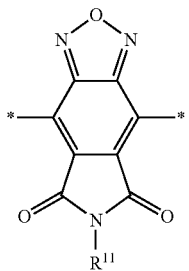

(A90) 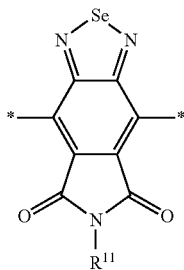

(A91) 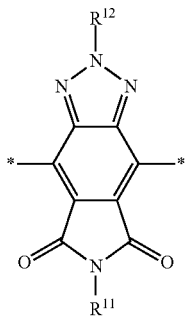

(A92) 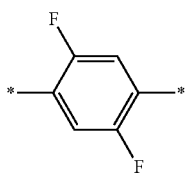

(A93) 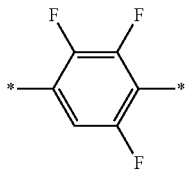

(A94) 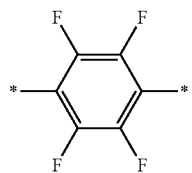

(A95) 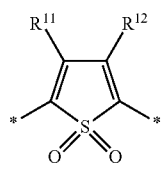

(A96) 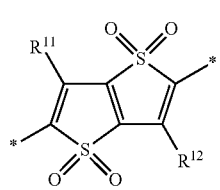

(A97) 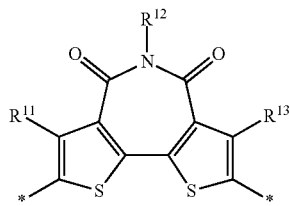

in which $R^{11}$, $R^{12}$, $R^{13}$, $R^{14}$, $R^{15}$ and $R^{16}$ each, independently of one another, denote H, F or $R^1$ as defined in formula I, and in which one or more of the radicals $R^{11}$, $R^{12}$, $R^{13}$, $R^{14}$, $R^{15}$ and $R^{16}$ denote a group -$Sp^1$-O—C(O)C(O)—O—$R^1$ as defined in formula I.

Preferred units of the formula I are selected from the group consisting of the formulae A1, A2, A3, A20, A41, A48, A74, A85 and A94, in which $R^{11}$, $R^{12}$, $R^{13}$, $R^{14}$, $R^{15}$ and $R^{16}$ each, independently of one another, denote H, F or $R^1$ as defined in formula I, and in which one or more of the radicals $R^{11}$, $R^{12}$, $R^{13}$, $R^{14}$, $R^{15}$ and $R^{16}$ denote a group -$Sp^1$-O—C(O)—C(O)—O—$R^1$ as defined in formula I.

A further preferred embodiment is directed to conjugated polymers according to the invention in which the recurring units which are substituted by an oxalate group, or the units of the formula I, are selected from the group consisting of the following formulae:

Sp1 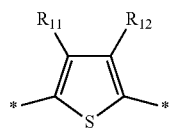

Sp2 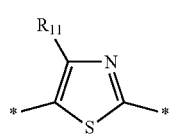

Sp3 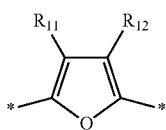
Sp4 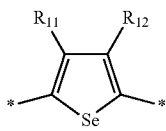
Sp5 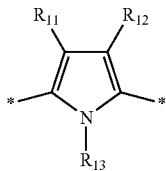
Sp6 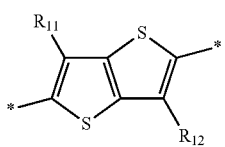
Sp7 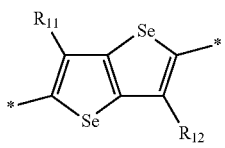
Sp8 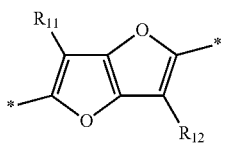
Sp9 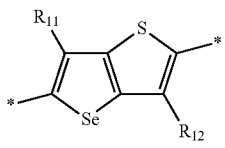
Sp10 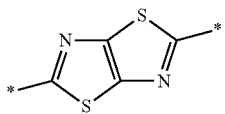
Sp11 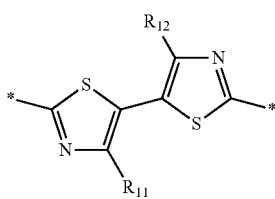
Sp12 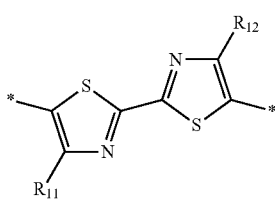
Sp13 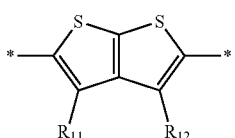
Sp14 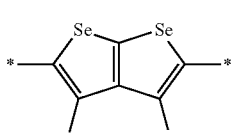
Sp15 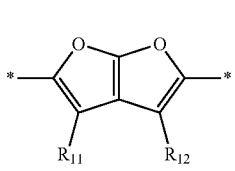
Sp16 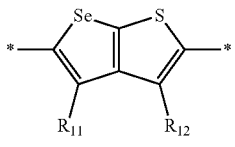
in which $R^{11}$ and $R^{12}$ each, independently of one another, denote H, F or $R^1$ as defined in formula I, and in which one or more of the radicals $R^{11}$ and $R^{12}$ denotes a group -$Sp^1$-O—C(O)—C(O)—O—$R^1$ as defined in formula I.
Particularly preferred recurring units of the formula I are selected from the following sub-formulae:
I1 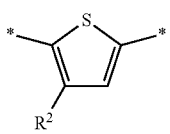
I2 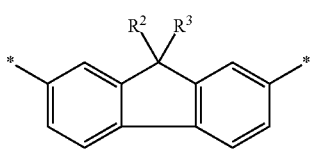
I3 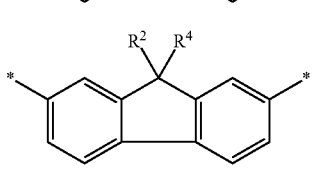
I4 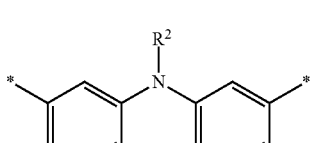
I5 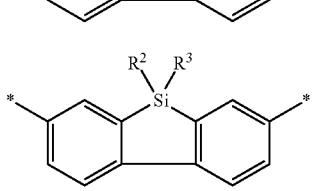

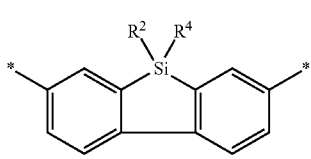

I6

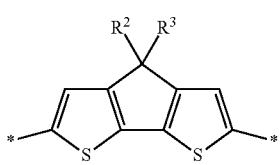

I7

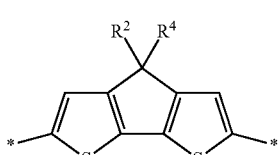

I8

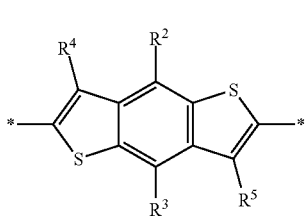

I9

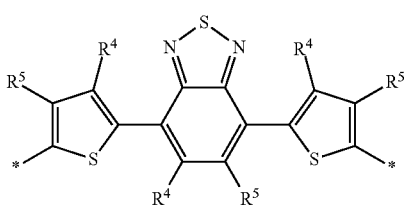

I10

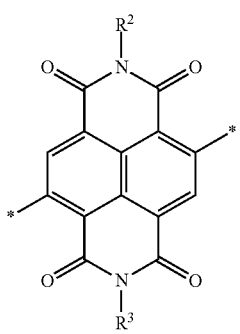

I11

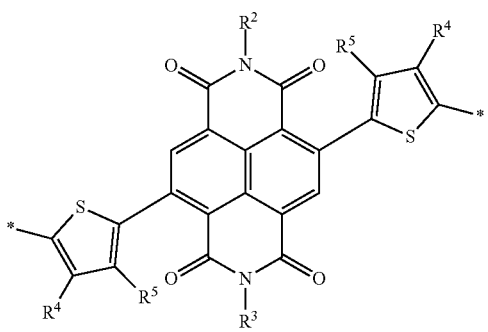

I12 in which $R^2$ and $R^3$ each, independently of one another, and identically or differently on each occurrence, denote a radical -Sp$^1$-OC(O)—C(O)OR$^1$, $R^4$ and $R^5$ each, independently of one another, and identically or differently on each occurrence, denote H or F or have one of the meanings indicated for $R^1$, Sp$^1$ and $R^1$ have the meanings indicated above or below, and at least one of the radicals $R^4$ and $R^5$ in formula I10 denotes a radical -Sp$^1$-O—C(O)—C(O)—O—R$^1$.

The radical Sp$^1$ in formula I and sub-formulae thereof preferably denotes alkylene having 1 to 20, particularly preferably having 1 to 8, C atoms, very particularly preferably methylene, ethylene or propylene.

The radicals $R^{1-3}$ in formulae I and 11-112 and the radicals $R^{4-18}$ which are different from H and F in the formulae D1-D145, A1-A97 and Sp1-Sp16 preferably denote straight-chain, branched or cyclic alkyl having 1 to 25 C atoms, which is unsubstituted or mono- or polysubstituted by F, Cl, Br, I or CN, and in which, in addition, one or more non-adjacent CH$_2$ groups may each be replaced, independently of one another, by —O—, —S—, —C(O)—, —C(S)—, —C(O)—O—, —O—C(O)—, —NR$^0$—, —SiR$^0$R$^{00}$—, —CF$_2$—, —CHR$^0$=CR$^{00}$—, —CY$^1$=CY$^2$— or —C≡C— in such a way that O and/or S atoms are not linked directly to one another, where R$^0$ and R$^{00}$ have the meaning indicated in formula I.

R$^1$ particularly preferably denotes alkyl or alkenyl having 1 to 25, preferably 1 to 20, C atoms, which may be straight-chain, branched and/or cyclic.

Preferred radicals -Sp$^1$-O—C(O)—C(O)—O—R$^1$ are selected from the formula S:

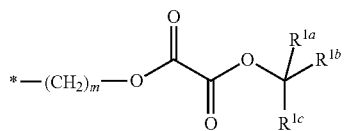

S in which $R^{1a}$, $R^{1b}$ and $R^{1c}$ each, independently of one another, denote H, a straight-chain, branched or cyclic alkyl radical having 1 to 20 C atoms or a straight-chain, branched or cyclic alkenyl radical or alkynyl radical, in each case having 2 to 20 C atoms, where, in addition, two of the radicals $R^{1a}$, $R^{1b}$ and $R^{1c}$ together may form a cyclic alkyl radical, alkenyl radical or alkynyl radical, in each case having 5 to 12 C atoms, m denotes 0 or an integer from 1 to 12, preferably 2, 3, 4, 5 or 6, and the symbol * denotes the link to the radical Ar. Preferably, at least two, particularly preferably three, radicals $R^{1a}$, $R^{1b}$ and $R^{1c}$ are different from H.

Particularly preferred radicals -Sp$^1$-O—C(O)—C(O)—O—R$^1$ are selected from the following sub-formulae:

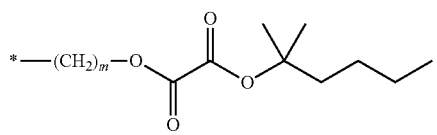

S1

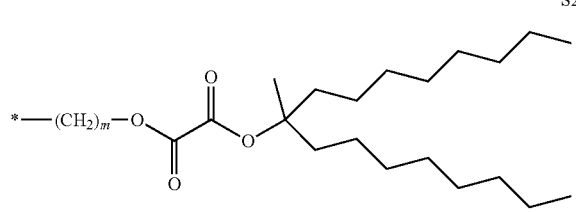

S2

-continued

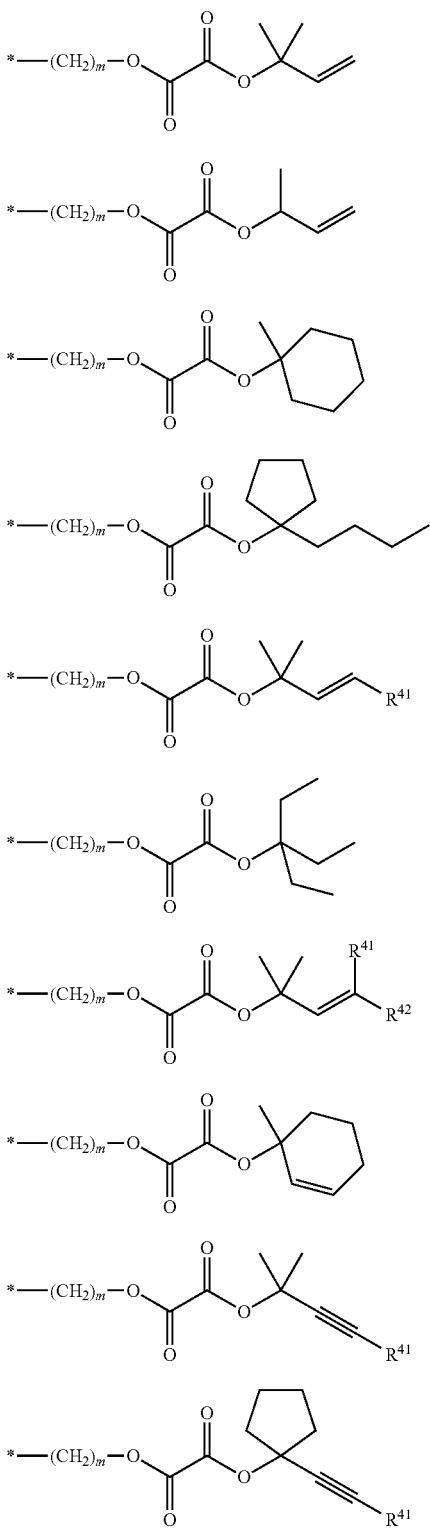

in which $R^{41}$ and $R^{42}$ each, independently of one another, and identically or differently on each occurrence, denote H or a straight-chain or branched alkyl radical having 1 to 20 C atoms, m denotes an integer from 1 to 12, 2, 3, 4, 5 or 6, and the symbol * denotes the link to the radical Ar. $R^{41}$ and $R^{42}$ are preferably different from H.

Preferred polymers in accordance with the present invention contain one or more recurring units of the formula IIa or IIb:

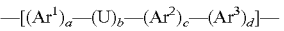  IIa

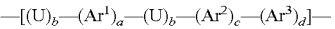  IIb in which the individual radicals have the following meanings:

U on each occurrence, identically or differently, denotes a unit of the formula I or sub-formulae I1 to I12 thereof, $Ar^1$, $Ar^2$, $Ar^3$ on each occurrence, identically or differently, and in each case independently of one another, denote aryl or heteroaryl which is different from U, preferably has 5 to 30 ring atoms, and is optionally substituted, preferably by one or more groups $R^S$, $R^S$ on each occurrence, identically or differently, denotes F, Br, Cl, —CN, —NC, —NCO, —NCS, —OCN, —SCN, —C(O)NR$^0$R$^{00}$, —C(O)X$^0$, —C(O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl or hydrocarbyl having 1 to 40 C atoms, which is optionally substituted and optionally contains one or more heteroatoms, $R^0$ and $R^{00}$ are defined as in formula I, $X^0$ denotes halogen, preferably F, Cl or Br, a, b and c on each occurrence, identically or differently, and in each case independently of one another, denote 0, 1 or 2, d on each occurrence, identically or differently, denotes 0 or an integer from 1 to 10, where the polymer according to the invention contains at least one recurring unit of the formula IIa or IIb in which b is at least 1.

$R^S$ preferably denotes, identically or differently on each occurrence, H, F, Cl, straight-chain, branched or cyclic alkyl having 1 to 30 C atoms, in which, in addition, one or more non-adjacent CH$_2$ groups may each be replaced, independently of one another, by —O—, —S—, —C(O)—, —C(S)—, —C(O)—O—, —O—C(O)—, —NR$^0$—, —SiR$^0$R$^{00}$—, —CF$_2$—, —CHR$^0$=CR$^{00}$—, —CY$^1$=CY$^2$— or —C≡C— in such a way that O and/or S atoms are not linked directly to one another, and in which, in addition, one or more H atoms may be replaced by F, Cl, Br, I or CN, or denotes aryl, heteroaryl, aryloxy or heteroaryloxy having 4 to 20 ring atoms, which is optionally substituted, preferably by halogen or alkyl or cycloalkyl as defined above.

Further preferred polymers in accordance with the present invention contain, in addition to the units of the formula I, IIa or IIb, one or more recurring units selected from the group consisting of mono- or polycyclic aryl or heteroaryl groups, which are optionally substituted.

These additional recurring units are preferably selected from formulae IIIa and IIIb,

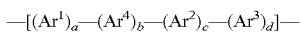  IIIa

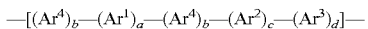  IIIb in which $Ar^1$, $Ar^2$, $Ar^3$, a, b, c and d are defined as in formula II, and $Ar^4$ denotes an aryl or heteroaryl group which is different from U and $Ar^{1-3}$, preferably has 5 to 30 ring atoms, and is optionally substituted, preferably by one or more groups $R^S$, where the polymer according to the invention contains at least one recurring unit of the formula IIIa or IIIb in which b is at least 1.

Particularly preferred units U are selected from the group consisting of the above-mentioned formulae D1 to D145.

Further preferred units U are selected from the group consisting of the above-mentioned formulae A1 to A97.

Further preferred units U are selected from the group consisting of the above-mentioned formulae Sp1 to Sp16.

Further preferred units U are selected from the group consisting of the above-mentioned formulae I1 to I12.

Particularly preferred groups $Ar^1$, $Ar^2$, $Ar^3$ and $Ar^4$ are selected from the group consisting of the above-mentioned formulae D1 to D145 in which $R^{11}$, $R^{12}$, $R^{13}$, $R^{14}$, $R^{15}$, $R^{16}$, $R^{17}$ and $R^{18}$ each, independently of one another, denote H, F or $R^1$ as defined in formula I.

Further preferred groups $Ar^1$, $Ar^2$, $Ar^3$ and $Ar^4$ are selected from the group consisting of the above-mentioned formulae A1 to A97 in which $R^{11}$, $R^{12}$, $R^{13}$, $R^{14}$, $R^{15}$ and $R^{16}$ each, independently of one another, denote H, F or $R^1$ as defined in formula I.

Further preferred groups $Ar^1$, $Ar^2$, $Ar^3$ and $Ar^4$ are selected from the group consisting of the above-mentioned formulae Sp1 to Sp16 in which $R^{11}$ and $R^{12}$ each, independently of one another, denote H, F or $R^1$ as defined in formula I.

If Ar in formula I, or U in formulae IIa and IIb, is selected from the group consisting of the formulae D1 to D145, $Ar^4$ in formulae IIIa and IIIb preferably denotes an aryl or heteroaryl group having electron-acceptor properties. $Ar^4$ in this case is particularly preferably selected from the group consisting of the formulae A1 to A97.

If Ar in formula I, or U in formulae IIa and IIb, is selected from the group consisting of the formulae A1 to A97, $Ar^4$ in formulae IIIa and IIIb preferably denotes an aryl or heteroaryl group having electron-donor properties. $Ar^4$ in this case is particularly preferably selected from the group consisting of the formulae D1 to D145.

In a further preferred embodiment, the conjugated polymer contains
one or more units U or $Ar^{1-4}$ having electron-donor properties ("donor units"), preferably selected from the formulae D1-D145, and
one or more units U or $Ar^{1-4}$ having electron-acceptor properties ("acceptor units"), preferably selected from the formulae A1-A97, and
one or more units U or $Ar^{1-4}$ which are arranged between the donor units and acceptor units in such a way that the donor and acceptor units are not directly adjacent to other donor or acceptor units ("spacer units"), preferably selected from the formulae Sp1-Sp16.

In a further preferred embodiment, the conjugated polymer contains
one or more units U of the formula I, preferably selected from the sub-formulae I1 to I12, and
one or more donor units $Ar^{1-4}$ selected from the formulae D1-D145, and/or one or more acceptor units $Ar^{1-4}$ selected from the formulae A1-A97, and
one or more spacer units $Ar^{1-4}$ selected from the formulae Sp1-Sp16, which are arranged between the units U and $Ar^{1-4}$ in such a way that these are not directly adjacent to other units U or $Ar^{1-4}$.

The spacer units $Ar^{1-4}$ are preferably selected so that they do not act as electron acceptor with respect to the donor units and do not act as electron donor with respect to the acceptor units.

The conjugated polymers of the present invention are preferably selected from formula IV:

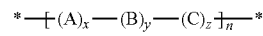
IV in which the individual radicals have the following meanings:
A, B, C each, independently of one another, denote a different unit of the formulae I, I1 to I12, IIa, IIb, IIIa or IIIb, D1-D145, A1-A97, Sp1-Sp16,
x is >0 and ≤1,
y is ≥0 and <1,
z is ≥0 and <1,
x+y+z is 1, and
n denotes an integer >1.

Preferred polymers of the formula IV are selected from the following sub-formulae:

  IVa

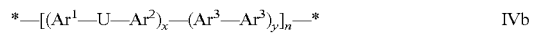  IVb

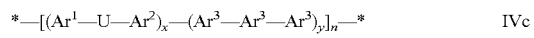  IVc

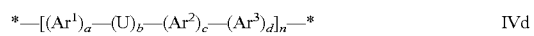  IVd

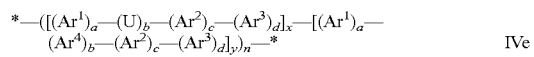  IVe

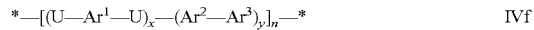  IVf

  IVg

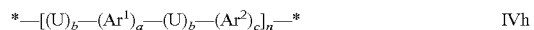  IVh

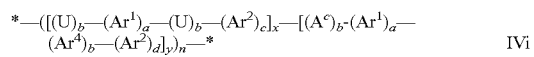  IVi

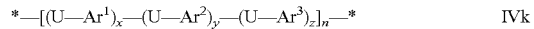  IVk in which U, $Ar^1$, $Ar^2$, $Ar^3$, a, b, c and d on each occurrence, identically or differently, have one of the meanings indicated in formula IIa, $Ar^4$ on each occurrence, identically or differently, has one of the meanings indicated in formula IIIa, and x, y, z and n are defined as in formula IV, where these polymers may be alternating or random copolymers, and where, in formulae IVd and IVe, b is at least 1 in at least one recurring unit $[(Ar^1)_a—(U)_b—(Ar^2)_c—(Ar^3)_d]$ and in at least one recurring unit $[(Ar^1)_a—(Ar^4)_b—(Ar^2)_c—(Ar^3)_d]$, and, in formulae IVh and IVi, b is 1 in at least one recurring unit $[(U)_b—(Ar^1)_a—(U)_b—(Ar^2)_c]$.

In the polymers of the formulae IV and IVa to IVk, b is preferably at least 1 in all recurring units.

In the polymers of the formulae IV and IVa to IVk, x is preferably 0.1 to 0.9, particularly preferably 0.3 to 0.7.

In a preferred embodiment of the invention, y and z are 0.
In a preferred embodiment of the invention, y and z are >0.
In a further preferred embodiment of the invention, one of the indices y and z is 0 and the other is >0. In the polymers of the formulae IV and IVa to IVk in which y or z is >0, this is preferably 0.1 to 0.9, particularly preferably 0.3 to 0.7.

In the polymers in accordance with the present invention, the total number of recurring units n is preferably ≥5, very preferably ≥10, particularly preferably ≥50, and preferably up to 500, very preferably up to 1,000, particularly preferably up to 2,000, including any desired combinations of the above-mentioned lower and upper limit values for n.

The polymers of the present invention include homopolymers and copolymers, such as random copolymers, alternating copolymers and block copolymers, and combinations thereof.

Particular preference is given to polymers selected from the following groups:

group A consisting of homopolymers of the recurring unit U or ($Ar^1$—U) or ($Ar^1$—U—$Ar^2$) or ($Ar^1$—U—$Ar^3$) or (U—$Ar^2$—$Ar^3$) or ($Ar^1$—U—$Ar^2$—$Ar^3$), i.e. in which all recurring units are identical, group B consisting of random or alternating copolymers formed from identical recurring units ($Ar^1$—U—$Ar^2$) and identical recurring units ($Ar^3$), group C consisting of random or alternating copolymers formed from identical recurring units ($Ar^1$—U—$Ar^2$) and identical recurring units ($Ar^1$), group D consisting of random or alternating copolymers formed from identical recurring units ($Ar^1$—U—$Ar^2$) and identical recurring units ($Ar^1$—$Ar^4$—$Ar^2$), in which U, $Ar^1$, $Ar^2$ and $Ar^3$ in all these groups are defined as above and below, $Ar^1$, $Ar^2$ and $Ar^3$ in the groups A, B and C are different from a single bond, and one of the radicals $Ar^1$ and $Ar^2$ in group D may also denote a single bond.

Particularly preferred polymers of the formula IV are selected from the following sub-formulae:

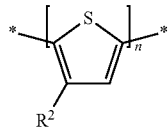

IV1

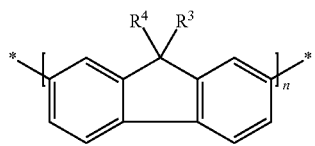

IV2

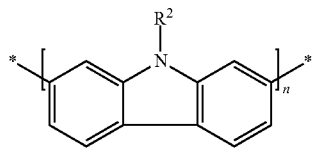

IV3

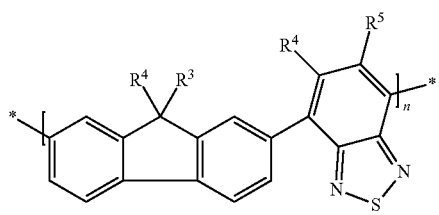

IV4

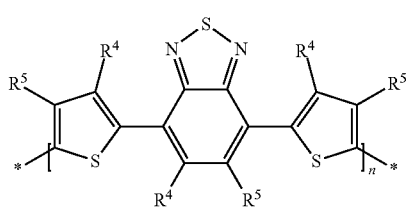

IV5

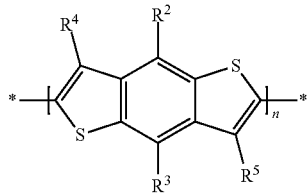

IV6

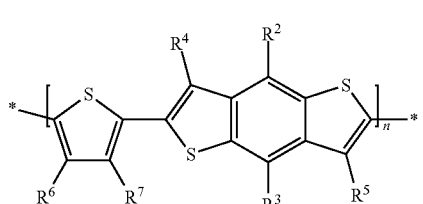

IV7

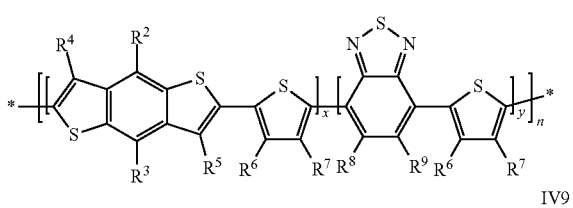

IV8

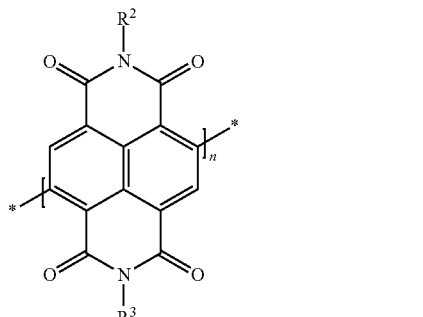

IV9

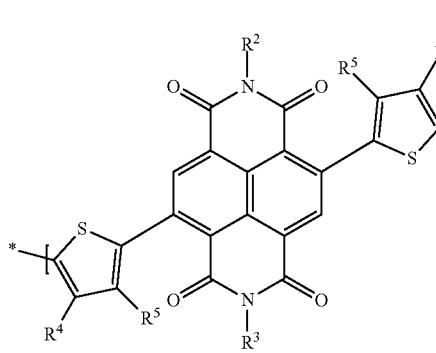

IV10 in which $R^2$ and $R^3$ each, independently of one another, and identically or differently on each occurrence, denote a radical -$Sp^1$-O—C(O)—C(O)—O—$R^1$, $R^4$-$R^9$ each, independently of one another, and identically or differently on each occurrence, denote H or F or have one of the meanings indicated for $R^1$, $Sp^1$ and $R^1$ have the meanings indicated above or below, in formula IV5 at least one of the radicals $R^4$ and $R^5$ denotes a radical -$Sp^1$-O—C(O)C(O)—O—$R^1$, n has the meaning indicated in formula IV, and x and y each, independently of one another, are >0 and <1.

In the polymers of the formulae IV1 to IV10, x and y are each, independently of one another, preferably 0.1 to 0.9, particularly preferably 0.3 to 0.7.

Preferred polymers of the formulae IV, IVa to IVk and IV1 to IV10 are selected from the following formula:

$$R^{21}\text{-chain-}R^{22} \qquad \qquad V$$

in which "chain" denotes a polymer chain selected from the above formulae IV, IVa to IVk and IV1 to IV10, and $R^{21}$ and $R^{22}$ each, independently of one another, have one of the meanings indicated for $R^S$ in formula IIa, or denote H, F, Br, Cl, I, —CH$_2$Cl, —CHO, —CR'=CR"$_2$, —SiR'R"R'", —SiR'X'X", —SiR'R"X', —SnR'R"R'", —BR'R", —B(OR') (OR"), —B(OH)$_2$, —O—SO$_2$—R', —C≡CH, —C≡C—SiR'$_3$ or —ZnX', in which X' and X" denote halogen, R', R" and R'" each, independently of one another, have one of the meanings indicated for $R^0$ in formula I, and two of the radicals R', R" and R'", together with the respective heteroatom to which they are bonded, may also form a cyclosilyl, cyclostannyl, cycloborane or cycloboronate group having 2 to 20 C atoms.

$R^{21}$ and $R^{22}$ preferably denote H, $C_1$-$C_{20}$-alkyl, $C_1$-$C_{20}$-alkoxy, $C_2$-$C_{20}$-alkenyl, $C_1$-$C_{20}$-fluoroalkyl, or optionally substituted $C_{6-12}$-aryl or $C_{2-10}$-heteroaryl, particularly preferably H, phenyl or triphenylamine, which may also be mono- or polysubstituted by $C_1$-$C_4$-alkyl groups, such as, for example, methyl.

In the polymers of the formulae IV, IVa to IVk, IV1 to IV10 and V, x, y and z each denote the molar proportion of the units A, B and C, and n denotes the degree of polymerisation or the total number of all units A, B and C. These formulae include block copolymers, random copolymers and alternating copolymers of A, B and C, as well as homopolymers of A in the case where x>0 and y=z=0.

The invention furthermore relates to monomers of the formulae VIa and VIb:

$$R^{31}-(Ar^1)_a-U-(Ar^2)_c-R^{32} \qquad \qquad VIa$$

$$R^{31}-U-(Ar^1)_a-U-R^{32} \qquad \qquad VIb$$

in which U, $Ar^1$, $Ar^2$, a and b have the meanings indicated in formula IIa and $R^{31}$ and $R^{32}$ are each selected, independently of one another, from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^0$ and —Sn(Z$^4$)$_3$, in which X$^0$ denotes halogen, preferably Cl, Br or I, $Z^{1-4}$ are selected from the group consisting of alkyl and aryl, which may optionally be substituted, and two radicals $Z^2$, together with the B and O atoms, may also form a cycloboronate group having 2 to 20 C atoms.

Particular preference is given to monomers selected from the following formulae:

$$R^{31}-Ar^1-U-Ar^2-R^{32} \qquad \qquad VI1$$

$$R^{31}-U-R^{32} \qquad \qquad VI2$$

$$R^{31}-Ar^1-U-R^{32} \qquad \qquad VI3$$

$$R^{31}-U-Ar^2-R^{32} \qquad \qquad VI4$$

$$R^{31}-U-Ar^1-U-R^{32} \qquad \qquad VI5$$

in which U, $Ar^1$, $Ar^2$, $R^{31}$ and $R^{32}$ are defined as in formula VIa. Particular preference is given to monomers of the formula VI2.

Particular preference is given to recurring units, polymers and monomers of the formulae I, IIa, IIb, IIIa, IIIb, IVa, IVb, V, VIa and VIb and sub-formulae thereof in accordance with the following preferred embodiments and combinations thereof:

y is >0 and <1 and z is 0,
y is >0 and <1 and z is >0 and <1,
x is >0 and <1 and y is >0 and <1,
n is at least 5, preferably at least 10, particularly preferably at least 50, and up to 2,000, preferably up to 500,
$M_w$ is at least 5,000, preferably at least 8,000, particularly preferably at least 10,000, and preferably up to 300,000, particularly preferably up to 100,000,
$M_w$ is at least 5,000, preferably at least 8,000, particularly preferably at least 10,000, and up to 300,000, preferably up to 100,000,
$X^1$ denotes O or NH, particularly preferably O,
$Sp^1$ denotes alkylene having 1 to 20, particularly preferably having 1 to 8, C atoms, very particularly preferably methylene, ethylene, propylene or hexylene,
$Ar^1$ and $Ar^2$ are selected, in each case independently of one another, and identically or differently on each occurrence, from 1,4-phenylene, thiophene-2,5-diyl, thiazole-2,5-diyl, selenophene-2,5-diyl, furan-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl or selenopheno-[2,3-b]thiophene-2,5-diyl, where all these radicals may be unsubstituted or mono- or polysubstituted, preferably by $R^S$ as defined above and below,
$Ar^3$ and $Ar^4$ are selected, in each case independently of one another, and identically or differently on each occurrence, from 1,4-phenylene, thiophene-2,5-diyl, selenophene-2,5-diyl, thieno[3,2-b]thiophene-2,5-diyl, thieno[2,3-b]thiophene-2,5-diyl, selenopheno[3,2-b] selenophene-2,5-diyl, selenopheno[2,3-b]selenophene-2,5-diyl, selenopheno[3,2-b]-thiophene-2,5-diyl, selenopheno[2,3-b]thiophene-2,5-diyl, benzo[1,2-b: 4,5-b'] dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, carbazole-2,7-diyl, fluorene-2,7-diyl, indaceno[1,2-b:5,6-b']dithiophene-2,7-diyl, benzo[1",2":4,5;4",5":4',5']bis (silolo[3,2-b:3',2'-b']thiophene)-2,7-diyl, phenanthro[1, 10,9,8-c,d,e,f,g]carbazole-2,7-diyl, benzo-2,1,3-thiadiazole-4,7-diyl, benzo-2,1,3-selenadiazole-4,7-diyl, benzo-2,1,3-oxadiazole-4,7-diyl, 2H-benzotriazole-4,7-diyl, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, 3,6-dithien-2-ylpyrrolo[3,4-c] pyrrole-1,4-dione or 1,3-thiazolo[5,4-d]-1,3-thiazole-2, 5-diyl, where all these radicals may be unsubstituted or mono- or polysubstituted, preferably by $R^S$ as defined above and below,
Ar is selected, identically or differently on each occurrence, from 1,4-phenylene, thiophene-2,5-diyl, selenophene-2,5-diyl, thieno[3,2-b]thiophene-2,5-diyl, thieno [2,3-b]thiophene-2,5-diyl, selenopheno[3,2-b]-selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4, 5-b]dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, carbazole-2,7-diyl, fluorene-2,7-diyl, indaceno-[1,2-b:5,6-b] dithiophene-2,7-diyl, benzo[1",2":4,5;4",5":4',5']bis (silolo-[3,2-b:3',2'-b']thiophene)-2,7-diyl, phenanthro [1,10,9,8-c,d,e,f,g]-carbazole-2,7-diyl, benzo-2,1,3-thiadiazole-4,7-diyl, benzo-2,1,3-selenadiazole-4,7-diyl, benzo-2,1,3-oxadiazole-4,7-diyl, 2H-benzotriazole-4,7-diyl, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, 1,3-thiazolo[5,4-d]-1,3-thiazole-2,5-diyl or benzo-[lmn]-3,8-phenanthroline-1,3,6,8-tetraone-4,9-diyl, where all these radicals may be unsubstituted or mono- or polysubstituted, preferably by $R^S$ as defined above and below, and all radicals are at least monosubstituted by $Sp^1$-$X^1$—C(O)—O—$R^1$ as defined above and below, Ar and $Ar^{1-4}$ are different from optionally substituted phenylene-1,4-diyl, $R^1$ is different from H, $R^1$ denotes primary alkyl having 1 to 20 C atoms, secondary alkyl having 3 to 30 C atoms or tertiary alkyl having 4 to 30 C atoms, where one or more H atoms in all these groups have optionally been replaced by F, $R^1$ denotes straight-chain or branched alkenyl having 2 to 20 C atoms, in which one or more H atoms have optionally been replaced by F, $R^1$ denotes cyclic alkyl 3 to 20 C atoms, in which one or more H atoms have optionally been replaced by F, $R^1$ denotes a radical containing straight-chain and cyclic alkyl groups having a total of 5 to 20 C atoms, in which one or more H atoms have optionally been replaced by F, $R^0$ and $R^{00}$ are selected from H or $C_1$-$C_{10}$-alkyl, $R^S$ is selected, identically or differently on each occurrence, from straight-chain, branched and/or cyclic alkyl, alkoxy or sulfanylalkyl having 1 to 30 C atoms, in which one or more H atoms have optionally been replaced by F, $R^S$ is selected, identically or differently on each occurrence, from aryl, aryloxy, heteroaryl and heteroaryloxy, which is optionally substituted by F, alkyl or alkoxy and has 4 to 30 ring atoms, $R^S$ is selected, identically or differently on each occurrence, from straight-chain, branched and/or cyclic alkylcarbonyl, alkoxycarbonyl and alkylcarbonyloxy, in which one or more H atoms have optionally been replaced by F, $R^S$ denotes, identically or differently on each occurrence, F, Cl, Br, I, CN, $R^9$, —C(O)—$R^9$, —C(O)—O—$R^9$, —O—C(O)—$R^9$, —$SO_2$—$R^9$ or —$SO_3$—$R^9$, in which $R^9$ denotes straight-chain, branched and/or cyclic alkyl having 1 to 20 C atoms, in which, in addition, one or more non-adjacent $CH_2$ groups may each be replaced, independently of one another, by —O—, —S—, —C(O)—, —C(S)—, —C(O)—O—, —O—C(O)—, —$NR^0$—, —$SiR^0R^{00}$—, —$CF_2$—, —$CHR^0$=$CR^{00}$—, —$CY^1$=$CY^2$— or —C≡C— in such a way that O and/or S atoms are not linked directly to one another, and in which, in addition, one or more H atoms may be replaced by F, Cl, Br, I or CN, or denotes aryl, heteroaryl, aryloxy or heteroaryloxy having 4 to 20 ring atoms, which is optionally substituted, preferably by halogen or alkyl or cycloalkyl as defined above, $R^0$ and $R^{00}$ each, independently of one another, denote H or $C_1$-$C_{10}$-alkyl, $R^{21}$ and $R^{22}$ are selected, in each case independently of one another, and identically or differently on each occurrence, from H, halogen, —$CH_2Cl$, —CHO, —CH=$CH_2$, —SiR'R''R''', —SnR'R''R''', —BR'R'', —B(OR')(OR''), —B(OH)$_2$, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl having 4 to 10 ring atoms, preferably phenyl, $R^{31}$ and $R^{32}$ are selected, in each case independently of one another, denote, and identically or differently on each occurrence, from Cl, Br, I, O-tosylate, O-triflate, O-mesylate, O-nonaflate, —$SiMe_2F$, —$SiMeF_2$, —O-$SO_2Z^1$, —B($OZ^2$)$_2$, —$CZ^3$=C($Z^4$)$_2$, —C≡CH, C≡CSi($Z^1$)$_3$, —ZnX$^0$ and —Sn($Z^4$)$_3$, in which $X^0$ denotes halogen, preferably Cl, Br or I, $Z^{1-4}$ is selected from the group consisting of alkyl and aryl, which may optionally be substituted, and two radicals $Z^2$, together with the B and O atoms, may also form a cycloboronate group having 2 to 20 C atoms.

The polymers and monomers in accordance with the present invention can be synthesised by or analogously to processes which are known to the person skilled in the art and are described in the literature. Other preparation processes are revealed by the examples.

For example, polymers according to the invention can be prepared in a suitable manner by aryl-aryl coupling reactions, such as Yamamoto coupling, Suzuki coupling, Stille coupling, Kumada coupling, Negishi coupling, Sonogashira coupling, Heck coupling, Buchwald coupling or Yokozawa synthesis. Suzuki coupling, Yamamoto coupling and Stille coupling are particularly preferred.

The monomers which are polymerised for the formation of the recurring units of the polymers can be prepared by processes known to the person skilled in the art.

The polymers are preferably prepared from monomers of the formula VIa or VIb or preferred sub-formulae thereof, as described above and below.

A further aspect of the invention is a process for the preparation of a polymer according to the invention by coupling one or more identical or different monomer units of the formula I or one or more identical or different monomers of the formula VIa or VIb to one another and/or to one or more comonomers in a polymerisation reaction, preferably in an aryl-aryl coupling reaction.

Suitable and preferred comonomers are selected from the following formulae:

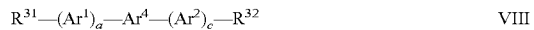
$$R^{31}—(Ar^1)_a—Ar^4—(Ar^2)_c—R^{32} \qquad \text{VIII}$$

$$R^{31}—Ar^1—R^{32} \qquad \text{IX}$$

$$R^{31}—Ar^3—R^{32} \qquad \text{X}$$

in which $Ar^1$, $Ar^2$, $Ar^3$, $Ar^4$, a and c have the meanings indicated in formulae IIa and IIIa, and $R^{31}$ and $R^{32}$ have the meanings indicated in formula VIa.

Particular preference is given to a process for the preparation of a polymer by reaction of one or more identical or different monomers of the formula VIa or VIb with one or more monomers of the formula VIII, and optionally with one or more monomers selected from the formulae IX and X, in an aryl-aryl coupling reaction, in which $R^{31}$ and $R^{32}$ are preferably selected from Cl, Br, I, —B($OZ^2$)$_2$ and —Sn($Z^4$)$_3$.

Particularly preferred processes are selected from the following embodiments:

a) a process for the preparation of a polymer by aryl-aryl coupling reaction of a monomer of the formula VI1

$$R^{31}—Ar^1—U—Ar^2—R^{32} \qquad \text{VI1}$$

with a monomer of the formula IX

$$R^{31}—Ar^1—R^{32} \qquad \text{IX}$$

b) a process for the preparation of a polymer by aryl-aryl coupling reaction reaction of a monomer of the formula VI2

$$R^{31}—U—R^{32} \qquad \text{VI2}$$

with a monomer of the formula VIII1

$$R^{31}-Ar^1-Ar^4-Ar^2-R^{32} \qquad \text{VIII1}$$

c) a process for the preparation of a polymer by aryl-aryl coupling reaction of a monomer of the formula VI2

$$R^{31}-U-R^{32} \qquad \text{VI2}$$

with a monomer of the formula VIII2

$$R^{31}-Ar^4-R^{32} \qquad \text{VIII2}$$

d) a process for the preparation of a polymer by aryl-aryl coupling reaction of a monomer of the formula VI2

$$R^{31}-U-R^{32} \qquad \text{VI2}$$

with a monomer of the formula VIII2

$$R^{31}-Ar^4-R^{32} \qquad \text{VIII2}$$

and a monomer of the formula IX $$R^{31}-Ar^1-R^{32} \qquad \text{IX}$$

e) a process for the preparation of a polymer by aryl-aryl coupling reaction of a monomer of the formula VI5

$$R^{31}-U-Ar^1-U-R^{32} \qquad \text{VI5}$$

with a monomer of the formula IX $$R^{31}-Ar^1-R^{32} \qquad \text{IX}$$

f) a process for the preparation of a polymer by aryl-aryl coupling reaction of a monomer of the formula VI2

$$R^{31}-U-R^{32} \qquad \text{VI2}$$

with a monomer of the formula IX $$R^{31}-Ar^1-R^{32} \qquad \text{IX}$$

and with a monomer of the formula X $$R^{31}-Ar^3-R^{32} \qquad \text{X}$$

in which $R^{31}$, $R^{32}$, U, $Ar^{1,2,3,4}$ are defined as in formulae IIa, IIIa and VIa, and $R^{31}$ and $R^{32}$ are preferably selected from Cl, Br, I, —B(OZ$^2$)$_2$ and —Sn(Z$^4$)$_3$ as defined in formula VIa.

Preferred aryl-aryl coupling processes and polymerisation processes are Yamamoto coupling, Negishi coupling, Suzuki coupling, Stille coupling, Sonogashira coupling, Heck coupling, C—H activation coupling, Ullmann coupling and Buchwald coupling. Particular preference is given to Suzuki, Negishi, Stille and Yamamoto coupling. Suzuki coupling is described, for example, in WO 00/53656 A1 or M. Ranger, D. Rondeau, M. Leclerc, *Macromolecules* 1997, 30, 7686-7691. Negishi coupling is described, for example, in *J. Chem. Soc., Chem. Commun.,* 1977, 683-684. Yamamoto coupling is described, for example, in T. Yamamoto et al., *Prog. Polym. Sci.,* 1993, 17, 1153-1205, WO 2004/022626 A1 or N. Kobayashi, R. Koguchi, M. Kijima, *Macromolecules* 2006, 39, 9102-9111, and Stille coupling is described, for example, in Z. Bao et al., *J. Am. Chem. Soc.,* 1995, 117, 12426-12435.

For example, Yamamoto coupling is preferably carried out using monomers as described above having two reactive halide groups. Suzuki coupling is preferably carried out using monomers as described above having two reactive boronic acid or boronic acid ester groups and monomers having two reactive halide groups, or monomers having one reactive boronic acid or boronic acid ester group and one reactive halide group. Stille coupling is preferably carried out using monomers as described above having two reactive stannyl groups and monomers having two reactive halide groups, or monomers having one reactive stannyl group and one reactive halide group. Negishi coupling is preferably carried out using monomers as described above having two reactive organozinc groups and monomers having two reactive halide groups, or monomers having one reactive organozinc group and one reactive halide group.

Preferred catalysts, in particular for Suzuki, Negishi or Stille coupling, are selected from Pd(0) complexes and Pd(II) salts. Preferred Pd(0) complexes are those which carry at least one phosphine ligand, such as Pd(PPh$_3$)$_4$. A further preferred phosphine ligand is tris(ortho-tolyl)phosphine, i.e. Pd(o-tol)$_4$. Preferred Pd(II) salts include palladium acetate, i.e. Pd(OAc)$_2$. The Pd(0) complex can also be prepared, for example, by mixing a Pd(0)/dibenzylideneacetone complex, such as, for example, tris(dibenzylideneacetone)dipalladium(0), bis(dibenzylideneacetone)palladium (0), or a Pd(II) salt, such as, for example, palladium acetate, with a phosphine ligand, such as, for example, triphenylphosphine, tris(ortho-tolyl)phosphine or tri(tertbutyl)phosphine. Suzuki polymerisation is carried out in the presence of a base, for example sodium carbonate, potassium phosphate, lithium hydroxide or potassium phosphate, or an organic base, such as tetraethylammonium carbonate or tetraethylammonium hydroxide. Yamamoto polymerisation is carried out using an Ni(0) complex, for example bis(1,5-cyclooctadienyl)nickel(0).

Suzuki polymerisation can be used in order to prepare both homopolymers and also random and alternating copolymers and randomly distributed block copolymers. Random or block copolymers can be prepared, for example, from the above monomers in which one of the reactive groups denotes halogen and the other reactive groups denotes a boronic acid or boronic acid derivative group. The synthesis of the random, alternating and block copolymers is described in greater detail, for example, in WO 03/048225 A2 or WO 2005/014688 A2.

As an alternative to halogens as described above, it is possible to use leaving groups of the formula —O—SO$_2$Z$^1$, in which Z$^1$ is as described above. Specific examples of such leaving groups are tosylate, mesylate and triflate.

The monomers and polymers can be prepared analogously to methods known to the person skilled in the art and described in the literature. Particularly preferred synthetic methods are given in the examples.

The invention likewise relates to the novel processes for the preparation of monomers and polymers as described above and below.

The oxalate side chains can be cleaved off from a polymer according to the invention simply by heating, for example after the polymer, or a material comprising the polymer, has been applied as semiconductor layer to a substrate or an electronic component.

The cleaving-off temperature can be determined by means of thermogravimetric analysis (TGA) and differential scanning calorimetry (DSC). In the case of side chains which are known from the literature, the temperature is typically 210° C. or 310° C. in order to obtain a completely defunctionalised polymer backbone. In the case of the groups according to the invention which can be cleaved off thermally, this temperature is, by contrast, <200° C. and can be reduced even further, for example by replacement of the alkyl radicals by, for example, alkenyl radicals. After the cleaving-off, the semiconducting polymers described in this invention usually contain an alcohol group, an amine function or an imide function. These may form hydrogen bonds, which reduce the solubility further.

As an example, the thermal cleaving-off reaction for a polymer according to the invention is shown in Scheme 1.

Scheme 1

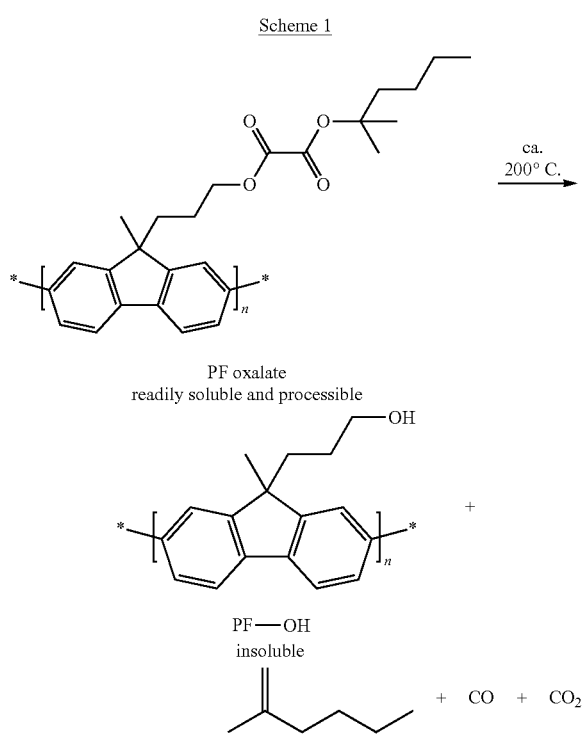

PF oxalate
readily soluble and processible

PF—OH
insoluble

+ CO + $CO_2$

The cleaving-off reaction is preferably carried out by heating the polymer according to the invention to a temperature of 200° C., preferably 100° C. to 200° C., particularly preferably 150° C. to 200° C.

The invention furthermore relates to a process for cleaving off some or all of the oxalate groups of a polymer according to the invention by heating the polymer or a layer, for example a semiconductor layer, comprising the polymer according to the invention to a temperature of 200° C., preferably 100° C. to 200° C., particularly preferably 150° C. to 200° C. The invention furthermore relates to a polymer or semiconductor layer obtainable by this process.

The polymers in accordance with the present invention can also be used in mixtures or polymer blends, for example together with monomeric compounds or together with other polymers having charge-transport, semiconducting, electrically conducting, photoconducting and/or light-emitting semiconductor properties, or, for example, with polymers having hole-blocking or electron-blocking properties for use as interlayers or chargeblocking layers in OLED devices. A further aspect of the invention therefore relates to a polymer blend comprising one or more polymers in accordance with the present invention and one or more further polymers having one or more of the above-mentioned properties. These blends can be prepared by conventional methods which are described in the prior art and are known to the person skilled in the art. Typically, the polymers are mixed with each other or dissolved in suitable solvents and the solutions are combined.

A further aspect of the invention relates to a formulation which comprises one or more polymers, mixtures or polymer blends as described above and below and one or more organic solvents.

Preferred solvents are aliphatic hydrocarbons, chlorinated hydrocarbons, aromatic hydrocarbons, ketones, ethers and mixtures thereof. Further solvents which can be used include 1,2,4-trimethylbenzene, 1,2,3,4-tetramethylbenzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, 4-fluoroanisole, 3-fluoroanisole, 3-trifluoromethylanisole, 2-methylanisole, phenetole, 4-methylanisole, 3-methylanisole, 4-fluoro-3-methylanisole, 2-fluorobenzonitrile, 4-fluoroveratrol, 2,6-dimethylanisole, 3-fluorobenzonitrile, 2,5-dimethylanisole, 2,4-dimethylanisole, benzonitrile, 3,5-dimethylanisole, N,N-dimethylaniline, ethyl benzoate, 1-fluoro-3,5-dimethoxybenzene, 1-methylnaphthalene, N-methylpyrrolidinone, 3-fluorobenzotrifluoride, benzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluorobenzene, 3-chlorofluorobenzene, 1-chloro-2,5-difluorobenzene, 4-chlorofluorobenzene, chlorobenzene, o-dichlorobenzene, 2-chlorofluorobenzene, p-xylene, m-xylene, o-xylene or a mixture of o-, m-, and p-isomers. Solvents having relatively low polarity are generally preferred. For ink-jet printing, solvents having high boiling points and solvent mixtures are preferred. For spin coating, alkylated benzenes, such as xylene and toluene, are preferred.

Examples of particularly preferred solvents include, without being restricted thereto, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 1,1,1-trichloroethane, 1,1,2,2-tetrachloroethane, ethyl acetate, n-butyl acetate, dimethylformamide, dimethylacetamide, dimethyl sulfoxide, tetralin, decalin, indane, methyl benzoate, ethyl benzoate, mesitylene, as well as mixtures of the above-mentioned solvents.

The concentration of the polymers in the solution is preferably 0.1 to 10% by weight, particularly preferably 0.5 to 5% by weight. The solution optionally also comprises one or more binders for adjustment of the rheological properties, as described, for example, in WO 2005/055248 A1.

After corresponding mixing and ageing, the solutions are classified in one of the following categories: complete solution, borderline solution or insoluble. The contour line is drawn in order to indicate the solubility parameter-hydrogen bonding limits which separate solubility and insolubility. "Complete" solvents which fall within the solubility range can be chosen from literature values, as published in "Crowley, J. D., Teague, G. S. Jr and Lowe, J. W. Jr., Journal of Paint Technology, 38, No. 496, 296 (1966)". Solvent mixtures can likewise be used and can be identified as described in "Solvents, W. H. Ellis, Federation of Societies for Coatings Technology, pp. 9-10, 1986". A procedure of this type may lead to a mixture of "non" solvents which dissolves both the polymers of the present invention, although it is desirable if at least one true solvent is present in a mixture.

The polymers in accordance with the present invention can also be used in structured semiconductor layers in the devices as described above and below. For applications in modern microelectronics, it is generally desirable to generate small structures or patterns in order to reduce the cost (more devices/unit area) and energy consumption. Structuring of thin layers which comprise a polymer in accordance with the present invention can be carried out, for example, by photolithography, electron-beam lithography or laser structuring.

For use as thin layers in electronic or electro-optical devices, the polymers, polymer blends or formulations of the present invention can be deposited by any suitable process. Liquid coating of devices is more desirable than vacuum deposition techniques. Solution deposition methods are particularly preferred. The formulations of the present invention enable the use of a number of liquid coating techniques. Preferred deposition techniques include, without being restricted thereto, dip coating, spin coating, ink-jet printing, letterpress printing, screen printing, doctor-blade coating, roller printing, reverse-roll printing, offset lithographic printing, flexographic printing, web printing, spray coating, brush coating and pad printing. Ink-jet printing is particularly preferred as it enables the production of high-resolution layers and devices.

Selected formulations of the present invention can be applied to prefabricated substrates for devices by ink-jet printing or microdispensing. For application of the organic semiconductor layer to a substrate, use can be made of industrial piezoelectric print heads, such as, but not limited to, those supplied by Aprion, Hitachi-Koki, InkJet Technology, On Target Technology, Picojet, Spectra, Trident, Xaar. In addition, use can be made of semi-industrial heads, such as those manufactured by Brother, Epson, Konica, Seiko Instruments or Toshiba TEC, or single-nozzle microdispensers, such as those produced by Microdrop and Microfab.

For application by ink-jet printing or microdispensing, the polymers should first be dissolved in a suitable solvent. Solvents must fulfil the requirements indicated above and must not have an adverse effect on the chosen print head. Furthermore, solvents should have boiling points >100° C., preferably >140° C. and particularly preferably >150° C. in order to prevent operational problems caused by the solution drying out inside the print head. Apart from the solvents mentioned above, suitable solvents include substituted and unsubstituted xylene derivatives, di-$C_{1-2}$-alkylformamide, substituted and unsubstituted anisoles and other phenol ether derivatives, substituted heterocycles, such as substituted pyridines, pyrazines, pyrimidines, pyrrolidinones, substituted and unsubstituted N,N-di-$C_{1-2}$-alkylanilines and other fluorinated or chlorinated aromatics.

A preferred solvent for the deposition of a polymer in accordance with the present invention by ink-jet printing comprises a benzene derivative in which a benzene ring is substituted by one or more substituents where the total number of carbon atoms in the one or more substituents is at least three. For example, the benzene derivative may be substituted by a propyl group or three methyl groups, where in both cases a total of at least three carbon atoms are present. A solvent of this type allows the formation of an ink-jet liquid comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene and diethylbenzene. The solvent may be a solvent mixture, i.e. a combination of two or more solvents, where each solvent preferably has a boiling point >100° C., particularly preferably >140° C. Solvents of this type also improve film formation in the deposited layer and reduce defects in the layer.

The ink-jet liquid (i.e. the mixture of solvent, binder and semiconducting compound) preferably has a viscosity at 20° C. of 1-100 mPa·s, particularly preferably 1-50 mPa·s and especially preferably 1-30 mPa·s.

The polymers or formulations in accordance with the present invention may additionally comprise one or more further components or additives selected, for example, from surface-active compounds, lubricants, wetting agents, dispersants, hydrophobicising agents, adhesives, flow improvers, antifoams, deaerators, diluents, which may be reactive or non-reactive, assistants, colorants, dyes or pigments, sensitisers, stabilisers, nanoparticles or inhibitors.

The polymers in accordance with the present invention can be used as charge-transport, semiconducting, electrically conducting, photoconducting or light-emitting materials in optical, electro-optical, electronic, electroluminescent or photoluminescent components or devices. In these devices, the polymers of the present invention are typically applied as thin layers or films.

The present invention therefore furthermore relates to the use of a semiconducting polymer, polymer blend, formulation or layer according to the invention in an electronic device. The formulation can be used in various devices and equipment as a semiconducting material having high mobility.

The formulation can be used, for example, in the form of a semiconducting layer or film. Accordingly, the present invention provides, in another aspect, a semiconducting layer for use in an electronic device, where the layer comprises a polymer, polymer blend or formulation in accordance with the invention. The layer or film may be less than about 30 microns. For various electronic device applications, the thickness may be less than about 1 micron thick. The layer may be deposited, for example on part of an electronic device, by any of the above-mentioned solution coating or printing techniques.

The present invention furthermore relates to an electronic device comprising a polymer, polymer blend, formulation or organic semiconducting layer in accordance with the present invention. Particularly preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge-injection layers, Schottky diodes, planarisation layers, antistatic films, conducting substrates and conducting patterns.

Particularly preferred electronic devices are OFETs, OLEDs and OPV and OPD devices, in particular bulk heterojunction (BHJ) OPV devices. In an OFET, for example, the active semiconductor channel between the drain and source may comprise the layer of the invention. As another example, the charge- (hole- or electron-) injection or transport layer in an OLED device may comprise the layer of the invention.

For use in OPV or OPD devices, the polymer according to the invention is preferably used in a formulation which comprises or contains, particularly preferably essentially consists of and very preferably consists exclusively of, a p-type (electron donor) semiconductor and an n-type (electron acceptor) semiconductor. The p-type semiconductor is preferably a polymer according to the invention. The n-type semiconductor is, for example, an inorganic material, such as zinc oxide ($ZnO_x$), zinc tin oxide (ZTO), titanium oxide ($TiO_x$), molybdenum oxide ($MoO_x$), nickel oxide ($NiO_x$) or cadmium selenide (CdSe), or an organic material, such as graphene, a fullerene or a substituted fullerene, for example an indene-$c_{60}$-fullerene bisadduct, such as ICBA, or (6,6)-phenyl-butyric acid methyl ester-derivatised methano-$C_{60}$-fullerene, also known as "PCBM" or "$C_{60}$PCBM", as disclosed, for example, in G. Yu, J. Gao, J. C. Hummelen, F. Wudl, A.J. Heeger, Science 1995, Vol. 270, pp. 1789 ff, and having the structure shown below, or an structurally analogous compound containing, for example, a $C_{70}$-fullerene group ($C_{70}$PCBM), or a polymer (see, for example, Coakley, K. M. and McGehee, M. D. *Chem. Mater.* 2004, 16, 4533). Polymers according to the invention which contain an acceptor group can also be employed as n-type semiconductor.

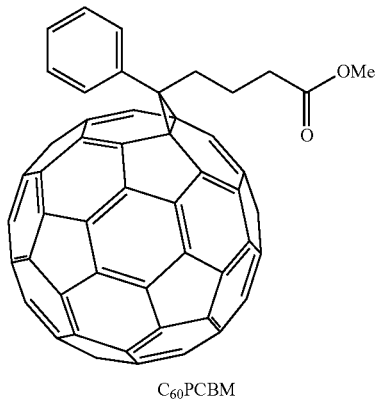 [SMILES: COC(=O)CCCC1(c2ccccc2)C23C=C4Cc5cc6cc7c8c9c(cc%10cc%11c%12c(c%13c%14c%15c(c4c5c4c6c8c(c%154)c4c9c%10c%12c%144)C%1321)C(=C3)C%11)C7]

$C_{60}$PCBM

In order to form a photoactive layer in an OPV or OPD device according to the invention, a polymer according to the invention is preferably mixed with a fullerene or a substituted fullerene, such as PCBM-$C_{60}$, PCBM-$C_{70}$, bisP-CBM-$C_{60}$, bis-PCBM-$C_{70}$, ICBA (1',1'',4',4''-tetrahydrodi[1,4]methanonaphthaleno[1,2:2',3';56,60:2'',3''][5,6]fullerene-$C_{60}$-Ih), or with graphene or a metal oxide, such as, for example, $ZnO_x$, $TiO_x$, ZTO, $MoO_x$ or $NiO_x$.

Apart from the photoactive layer, an OPV or OPD device according to the invention preferably comprises a first transparent or semitransparent electrode on a transparent or semitransparent substrate on one side the photoactive layer, and a second metallic or semitransparent electrode on the other side of the photoactive layer.

In a further preferred embodiment, an OPV or OPD device according to the invention comprises, between the photoactive layer and the first and/or second electrode, one or more interlayers or buffer layers which are able to act as hole-transport and/or electron-blocking layer and comprise a material such as, for example, a metal oxide, for example ZTO, $MoO_x$, $NiO_x$, a conjugated polymer electrolyte, for example PEDOT:PSS, a conjugated polymer, for example polytriarylamine (PTAA), or an organic compound, for example N,N'-diphenyl-N,N'-bis(1-naphthyl)(1,1'-biphenyl)-4,4'-diamine (NPB), N,N'-diphenyl-N,N'-(3-methylphenyl)-1,1'-biphenyl-4,4'-diamine (TPD), or one or more interlayers or buffer layers which are able to act as hole-blocking and/or electron-transport layer and comprise a material such as, for example, a metal oxide, for example $ZnO_x$, $TiO_x$, a salt, for example LiF, NaF, CsF, a conjugated polymer electrolyte, for example poly[3-(6-trimethylammoniumhexyl)thiophene], poly(9,9-bis(2-ethylhexyl)fluorene]-b-poly[3-(6-trimethylammoniumhexyl)thiophene], or poly[(9,9-bis(3'-(N,N-dimethylamino)propyl)-2,7-fluoreneyalt-2,7-(9,9-dioctylfluorene)], or an organic compound, for example tris(8-quinolinolato)aluminium(III) ($Alq_3$), or 4,7-diphenyl-1,10-phenanthroline.

In a mixture of a polymer or polymer blend according to the invention with a fullerene or substituted fullerene, the polymer:fullerene ratio is preferably from 5:1 to 1:5 parts by weight, particularly preferably from 1:1 to 1:3 parts by weight, very particularly preferably from 1:1 to 1:2 parts by weight. A polymeric binder may also be added, preferably in a concentration of 5 to 95% by weight. Examples of suitable and preferred binders include polystyrene (PS), polypropylene (PP) and polymethyl methacrylate (PMMA).

For the production of thin layers in BHJ-OPV devices, the polymers, polymer blends or formulations of the present invention can be deposited using any suitable method. Liquid coating of devices is more desirable than vacuum vapour deposition techniques. Deposition methods from solution are particularly preferred. The formulations of the present invention enable the use of a number of liquid coating techniques. The preferred deposition techniques include, without being restricted thereto, dip coating, spin coating, ink-jet printing, letterpress printing, screen printing, knife coating, roller printing, reverse roll printing, offset lithographic printing, flexographic printing, web printing, slot-die coating, spray coating, brush coating or pad printing. Ink-jet printing is particularly preferred since it enables the production of high-resolution layers and devices.

OPV devices and OPV modules are particularly preferably produced using area-printing processes which are compatible with flexible substrates, such as, for example, slot-die coating or spray coating.

When selecting suitable solvents for the production of BHJ layers from a polymer according to the invention and a fullerene, complete solution of the two components should be ensured, as well as interface conditions (for example the rheological properties) which result from the printing or coating method selected.

Organic solvents are used for this purpose. Typical solvents are, for example, aromatic and/or chlorinated solvents. Examples of suitable and preferred solvents include, but are not restricted to, chlorobenzene, 1,2-dichlorobenzene, chloroform, 1,2-dichloroethane, dichloromethane, carbon tetrachloride, toluene, cyclohexanone, ethyl acetate, tetrahydrofuran, anisole, morpholine, o-xylene, m-xylene, p-xylene, 1,4-dioxane, acetone, methyl ethyl ketone, 1,2-dichloroethane, 1,1,1-trichloroethane, 1,1,2,2-tetrachloroethane, n-butyl acetate, dimethylformamide, dimethylacetamide, dimethyl sulfoxide, tetralin, decalin, indane, methyl benzoate, ethyl benzoate, mesitylene and mixtures of the above-mentioned solvents.

The OPV device can be, for example, any desired type known from the literature [see, for example, Waldauf et al., *Appl. Phys. Lett.* 89, 233517 (2006)].

A first preferred OPV device according to the invention comprises (in the sequence commencing with the side facing the incident light):
  optionally a substrate,
  an electrode having a high work function, which preferably comprises a metal oxide, such as, for example, ITO, as anode,
  optionally a conductive polymer layer or hole-transport layer, which preferably comprises an organic polymer or polymer blend or an organic compound, such as, for example, PEDOT:PSS (poly(3,4-ethylenedioxythiophene):poly(styrene sulfonate)), TBD (N,N'-diphenyl-N-N'-bis(3-methylphenyl)-1,1'-biphenyl-4,4'-diamine) or NBD (N,N'-diphenyl-N—N'-bis(1-napthylphenyl)-1,1'-biphenyl-4,4'-diamine),
  a layer (also called "active layer" or "photoactive layer") which comprises a p-type organic semiconductor and an n-type organic semiconductor, which are, for example, in the form of a double layer or two separate layers of a p-type semiconductor and an n-type semiconductor, or in the form of a blend of a p-type semiconductor and an n-type semiconductor, which form a bulk heterojunction (BHJ), optionally an electron-transport layer, which comprises, for example, LiF, an electrode having a low work function, which preferably comprises a metal, such as, for example, aluminium, as cathode, where at least one of the electrodes, preferably the anode, is transparent, and where the p-type semiconductor and/or the n-type semiconductor is a polymer according to the invention.

A second preferred OPV device according to the invention is an inverted OPV device and comprises (in the sequence commencing with the side facing the incident light):

optionally a substrate, an electrode having a high work function, which preferably comprises a metal oxide, such as, for example, ITO, as cathode, a hole-blocking layer, which preferably comprises a metal oxide, such as, for example, $TiO_x$ or $ZnO_x$, a layer (also called "active layer" or "photoactive layer") which comprises a p-type organic semiconductor and an n-type organic semiconductor, which are, for example, in the form of a double layer or two separate layers of a p-type semiconductor and an n-type semiconductor, or in the form of a blend of a p-type semiconductor and an n-type semiconductor, which form a bulk heterojunction (BHJ), optionally a conductive polymer layer or hole-transport layer, which preferably comprises an organic polymer or polymer blend or an organic compound, such as, for example, PEDOT:PSS, TBD or NBD, an electrode which comprises a metal having a high work function, such as, for example, silver, as anode, where at least one of the electrodes, preferably the cathode, is transparent, and where the p-type semiconductor and/or the n-type semiconductor is a polymer according to the invention.

In the OPV devices of the present invention, the p-type and n-type semiconductor materials are preferably selected from the materials described above, such as the polymer/fullerene systems. If an active layer comprising a polymer/fullerene system of this type is applied to a substrate, it forms a BHJ which exhibits phase separation in the nanometer range, see, for example, Dennler et al, *Proceedings of the IEEE*, 2005, 93 (8), 1429, or Hoppe et al, *Adv. Func. Mater*, 2004, 14(10), 1005. A heating step may optionally be necessary in order to optimise the morphology of the blend and the performance of the OPV device.

A further method for optimisation of the performance of the OPV device is the preparation of a formulation for the production of OPV(BHJ) devices which comprises high-boiling additives which are able to influence the phase separation and steer it in the desired direction. For this purpose, use can be made, for example, of 1,8-octanedithiol, 1,8-diiodooctane, nitrobenzene, chloronaphthalene or other additives in order to produce highly efficient solar cells. Examples thereof are described in J. Peet, et al, *Nat. Mater*, 2007, 6, 497, or Fréchet et al. *J. Am. Chem. Soc.*, 2010, 132, 7595-7597.

The polymers, polymer blends, formulations and layers according to the invention are also suitable for use in an OFET as the semiconductor channel. Accordingly, the invention also provides an OFET comprising a gate electrode, an insulating (or gate insulator) layer, a source electrode, a drain electrode and an organic semiconductor channel connecting the source and drain electrodes, where the organic semiconductor channel comprises a polymer, polymer blend, formulation or organic semiconductor layer in accordance with the present invention. Further features of the OFET are known to the person skilled in the art and can be added without inventive step.

OFETs in which an organic semiconductor material is arranged as a thin film between a gate dielectric and a drain electrode and a source electrode are generally known and are described, for example, in U.S. Pat. No. 5,892,244, 5,998,804 or 6,723,394. Owing to the advantages, such as inexpensive production utilising the solubility properties of the compounds according to the invention and thus the processability of large surfaces, preferred applications of these FETs are those such as integrated circuits, TFT displays and security applications.

The gate, source and drain electrodes and the insulating and semiconductor layer in the OFET device can be arranged in any desired sequence, so long as the source and drain electrodes are separated from the gate electrode by the insulating layer, the gate electrode and the semiconductor layer are both in contact with the insulating layer, and the source electrode and drain electrode are both in contact with the semiconductor layer.

An OFET device in accordance with the present invention preferably comprises:

a source electrode, a drain electrode, a gate electrode, a semiconductor layer, one or more gate insulator layers, optionally a substrate.

where the semiconductor layer preferably comprises a polymer, polymer blend or formulation in accordance with the present invention.

The OFET device can be a top gate device or a bottom gate device. Suitable structures and production processes for an OFET device are known to the person skilled in the art and are described in the literature, for example in US 2007/0102696 A1.

The gate insulator layer can preferably comprise a fluoropolymer, such as, for example, commercially available Cytop 809M® or Cytop 107M® (from Asahi Glass). The gate insulator layer is preferably deposited, for example, by spin coating, knife coating, wire-bar coating, spray or dip coating or other known methods, from a formulation comprising an insulator material and one or more solvents having one or more fluorine atoms (fluorinated solvents), preferably a perfluorinated solvent. A suitable perfluorinated solvent is, for example, FC75® (available from Acros, catalogue number 12380). Other suitable fluorinated polymers and fluorinated solvents are known from the prior art, such as, for example, the perfluoropolymers Teflon AF® 1600 and 2400 (from DuPont) or Fluoropel® (from Cytonix) or the perfluorinated solvent FC 43® (Acros, No. 12377). Particular preference is given to organic dielectric materials having a low permittivity (or dielectric constant) from 1.0 to 5.0, very preferably from 1.8 to 4.0 ("low k materials"), as disclosed, for example, in US 2007/0102696 A1 or U.S. Pat. No. 7,095,044.

In security applications, OFETs and other devices comprising semiconductor materials in accordance with the present invention, such as transistors or diodes, can be used for RFID tags or security markings in order to authenticate and prevent counterfeiting of documents of value, such as banknotes, credit cards or identity cards, national identity documents, licenses or any desired products having a monetary value, such as postage stamps, entry and travel tickets, lottery tickets, shares, cheques, etc.

Alternatively, the materials according to the invention can be used in OLEDs, for example as the active display material in flat panel screens, or as backlighting of a flat panel screen, such as, for example, a liquid crystal display. Conventional OLEDs are produced using multilayered structures. An emission layer is generally sandwiched between one or more electron-transport and/or hole-transport layers. Application of an electric voltage causes electrons and holes as charge carriers to move towards the emission layer, where their recombination leads to the excitation and thus luminescence of the lumophore units present in the emission layer. The compounds, materials and films according to the invention can be employed in one or more of the charge-transport layers and/or in the emission layer, in accordance with their electrical and/or optical properties. Furthermore, their use in the emission layer is particularly advantageous if the compounds, materials and films according to the invention exhibit electroluminescent properties themselves or contain electroluminescent groups or compounds. The selection, characterisation and processing of suitable monomeric, oligomeric and polymeric compounds or materials for use in OLEDs is generally known to the person skilled in the art, see, for example, Müller et al, *Synth. Metals,* 2000, 111-112, 31-34, Alcala, *J. Appl. Phys.,* 2000, 88, 7124-7128, and the literature cited therein.

According to another use, the materials in accordance with this invention, in particular those which exhibit photoluminescent properties, can be employed as materials for light sources, for example for display devices, as described in EP 0 889 350 A1 or by C. Weder et al., *Science,* 1998, 279, 835-837.

A further aspect of the invention relates to both the oxidised and reduced forms of the compounds in accordance with this invention. Either release or uptake of electrons results in the formation of a highly delocalised ionic form having high conductivity. This can occur through the action of standard dopants. Suitable dopants and doping methods are known to the person skilled in the art, for example from EP 0 528 662, U.S. Pat. No. 5,198,153 or WO 96/21659.

The doping process typically provides treatment of the semiconductor material with an oxidising or reducing agent in a redox reaction, so that delocalised ionic centres form in the material, where the corresponding counterions originate from the applied dopants. Suitable doping methods include, for example, exposure to a doping vapour at atmospheric or reduced pressure, electrochemical doping in a solution comprising a dopant, bringing a dopant into contact with the semiconductor material for thermally diffusion and ion implantation of the dopant into the semiconductor material.

If electrons are used as carriers, suitable dopants are, for example, halogens (for example $I_2$, $Cl_2$, $Br_2$, ICl, $ICl_3$, IBr and IF), Lewis acids (for example $PF_5$, $AsF_5$, $SbF_5$, $BF_3$, $BCl_3$, $SbCl_5$, $BBr_3$ and $SO_3$), protonic acids, organic acids or amino acids (for example HF, HCl, $HNO_3$, $H_2SO_4$, $HClO_4$, $FSO_3H$ and $ClSO_3H$), transition-metal compounds (for example $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (where Ln is a lanthanoid), anions (for example $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $Fe(CN)_6^{3-}$, and anions of various sulfonic acids, such as aryl-503). If holes are used as carriers, examples of dopants are cations (for example $H^+$, $Li^+$, $Na^+$, $K^+$, $Rb^+$ and $Cs^+$), alkali metals (for example Li, Na, K, Rb, and Cs), alkaline-earth metals (for example Ca, Sr, and Ba), $O_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3.6H_2O$, $FSO_2OOSO_2F$, Eu, acetylcholine, $R_4N^+$, (R denotes an alkyl group), $R_4P^+$ (R denotes an alkyl group), $R_6As^+$ (R denotes an alkyl group), and $R_3S^+$ (R denotes an alkyl group).

The conducting form of the compounds of the present invention can be used as an organic "metal" in applications such as, for example, charge-injection layers and ITO planarisation layers in OLED applications, films for flat panel displays and touch screens, antistatic films, printed conductive substrates, patterns or conductor tracks in electronic applications, such as printed circuit boards and capacitors.

The compounds and formulations in accordance with the present invention may also be suitable for use in organic plasma-emitting diodes (OPEDs), as described, for example, in Koller et al., *Nat. Photonics,* 2008, 2, 684).

According to another use, the materials in accordance with the present invention can be used alone or together with other materials in or as alignment layers in LCD or OLED devices, as described, for example, in US 2003/0021913. The use of charge-transport compounds in accordance with the present invention may increase the electrical conductivity of the alignment layer. On use in an LCD, this increased electrical conductivity may reduce unfavourable residual direct-current effects in the switchable LCD element and suppress image sticking or, for example in ferroelectric LCDs, reduce the residual charge generated by the switching of the spontaneous polarisation charge of the ferroelectric LCs. On use in an OLED device comprising a light-emitting material applied to the alignment layer, this increased electrical conductivity may increase the electroluminescence of the light-emitting material. The compounds or materials in accordance with the present invention having mesogenic or liquidcrystalline properties can form oriented anisotropic films as described above, which are suitable, in particular, as alignment layers for the induction or increase of alignment in a liquid-crystal medium applied to the anisotropic film. The materials in accordance with the present invention may also be combined with photoisomerisable compounds and/or chromophores for use in or as photoalignment layers, as described in US 2003/0021913.

According to another use, the materials in accordance with the present invention, in particular their water-soluble derivatives (for example containing polar or ionic side groups) or ionically doped forms, can be employed as chemical sensors or materials for the detection and discrimination of DNA sequences. Such uses are described, for example, in L. Chen, D. W. McBranch, H. Wang, R. Helgeson, F. Wudl and D. G. Whitten, *Proc. Natl. Acad. Sci. U.S.A.,* 1999, 96, 12287; D. Wang, X. Gong, P. S. Heeger, F. Rininsland, G. C. Bazan and A. J. Heeger, *Proc. Natl. Acad. Sci. U.S.A.,* 2002, 99, 49; N. DiCesare, M. R. Pinot, K. S. Schanze and J. R. Lakowicz, *Langmuir,* 2002, 18, 7785; D. T. McQuade, A. E. Pullen, T. M. Swager, *Chem. Rev.,* 2000, 100, 2537.

So long as it is not clearly evident otherwise from the context, plural forms of the terms used here are to be regarded as including the singular form and vice versa.

Throughout the description and claims of this specification, the terms "comprise" and "contain" and variations thereof, such as, for example, "comprising" and "comprises", mean "including but not limited to", and should not be regarded as excluding other components.

It goes without saying that variations of the above embodiments of the invention can be carried out while still falling within the scope of protection of the present invention. Each feature disclosed in this application text may, unless indicated otherwise, be replaced by alternative features which serve the same, an equivalent or a similar purpose. Unless indicated otherwise, each feature disclosed is therefore only one example of a generic series of equivalent or similar features.

All the features disclosed in this application text may be combined with one another in any desired combination, with the exception of combinetions in which at least some of such features and/or steps are mutually exclusive. In particular, the preferred features of the invention are applicable to all aspects of the invention and can be used in any desired combination. Likewise, features described in non-essential combinations can also be used separately from one another (i.e. not in combination with one another).

Unless noted otherwise, all percent values above and below are percent by weight, and all temperature values are degrees Celsius. The values of the dielectric constant ε ("permittivity") mean the values determined at 20° C. and 1,000 Hz.

The invention will now be described in greater detail with reference to the following examples, which are intended to illustrate the invention without restricting it.

Example 1—Building Blocks 1.1 2-Methylhexan-2-yl 2-chloro-2-oxoacetate

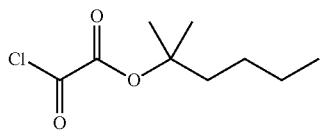

(1.1)

A solution of 2-methyl-2-hexanol (2.78 g, 20.0 mmol, 1.00 equiv.) in diethyl ether (5 ml) was added dropwise to a solution of oxalyl chloride (1.7 ml, 2.54 g, 20.0 mmol, 1.00 equiv.) in diethyl ether (10 ml) at 0° C. with stirring. The reaction mixture was stirred at 0° C. for 30 minutes and at room temperature overnight. Evaporation of the solvent left 4.08 g (quant.) of the product as a yellow oil.—$^1$H-NMR (300 MHz, CDCl$_3$): δ=1.80-1.86 (m, 2H, CH$_2$), 1.55 (s, 6H, 2×CH$_3$), 1.30-1.37 (m, 4H, 2×CH$_3$), 0.88-0.94 (m, 3H, CH$_3$)—$^{13}$C-NMR (75 MHz, CDCl$_3$): δ=161.9 (ClC=O), 154.7 (OC=O), 90.5 (O—C$_q$), 40.4 (CH$_2$), 26.1 (CH$_2$), 25.7 (2×CH$_3$), 23.0 (CH$_2$), 14.2 (CH$_3$).—FTIR: ṽ=2960, 2868, 1798, 1749, 1467, 1369, 1277, 1215, 973, 811 cm$^{-1}$.

Example 2—Monomers 2.1 3-(2,7-Dibromo-9-methyl-9H-fluoren-9-yl)propyl (2-methylhexan-2-yl) oxalate

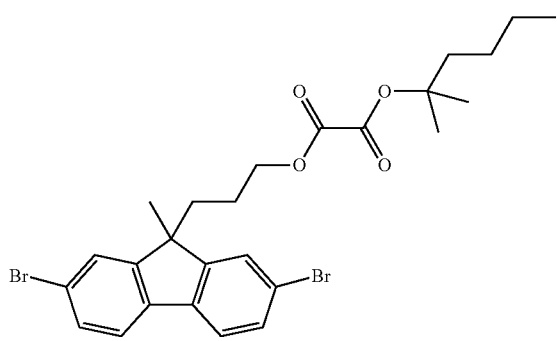

(2.1)

A solution of 2-methylhexan-2-yl 2-chloro-2-oxoacetate (1.24 g, 6.00 mmol, 1.20 equiv.) in dichloromethane (5 ml) was added dropwise to a solution of 2,7-dibromo-9-(3-hydroxypropyl)-9-methylfluorene (1.98 g, 5.00 mmol, 1.00 equiv.) and triethylamine (607 mg, 6.00 mmol, 1.20 equiv.) in dichloromethane (10 ml) at 0° C. The reaction mixture was stirred at 0° C. for 30 minutes and at room temperature for 2 hours. The solvent was removed under reduced pressure, and the residue was taken up again in ethyl acetate. The organic phase was washed with sat. sodium hydrogencarbonate solution, water and sodium chloride solution, dried over magnesium sulfate, filtered and evaporated. The crude product was purified by column chromatography on silica gel with petroleum ether/ethyl acetate (10:1) as eluent, giving 2.70 g (95%) of the product as a yellow oil. $^1$H-NMR (300 MHz, CDCl$_3$): δ=7.54 (d, $^3$J=7.7 Hz, 2H, 2×H$_{ar}$), 7.46-7.50 (m, 4H, 4×H$_{ar}$), 3.97 (t, $^3$J=6.8 Hz, 2H, CH$_2$—O), 2.03-2.09 (m, 2H, CH$_2$), 1.79-1.85 (m, 2H, CH$_2$—C$_q$), 1.52 (s, 6H, 2×CH$_3$), 1.47 (s, 3H, CH$_3$), 1.29-1.36 (m, 4H, 2×CH$_2$), 1.01-1.10 (m, 2H, CH$_2$), 0.88-0.94 (m, 3H, CH$_3$).—$^{13}$C-NMR (75 MHz, CDCl$_3$): δ=158.6 (C=O), 157.0 (C=O), 153.0 (2×C$_{ar}$), 138.3 (2×C$_{ar}$), 130.8 (2×C$_{ar}$H), 126.2 (2×C$_{ar}$H), 121.8 (2×C$_{ar}$—Br), 121.6 (2×C$_{ar}$H), 87.5 (C$_q$), 66.3 (CH$_2$—O), 50.9 (CH$_2$), 40.7 (CH$_2$—C$_q$), 36.3 (CH$_2$), 26.7 (CH$_2$), 26.1 (CH$_3$), 25.8 (2×CH$_3$), 23.5 (CH$_2$), 23.0 (CH$_2$), 14.2 (CH$_3$).—FTIR: ṽ=2954, 2863, 1759, 1736, 1451, 1411, 1323, 1261, 1186, 1143, 1064, 1002, 807 cm$^{-1}$.—MS (ESI), m/z (%): 607/605/603 (46/86/40) [(M+K)$^+$], 591/589/587 (47/100/48) [(M+Na)$^+$].—HRMS (C$_{26}$H$_{30}$Br$_2$O$_4$K): calc. 605.0148, found 605.0130.

2.2 2-(2-Bromo-5-iodothiophen-3-yl)ethyl (2-methylhexan-2-yl) oxalate

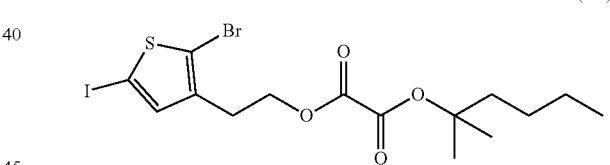

(2.2)

A solution of 2-methylhexan-2-yl 2-chloro-2-oxoacetate (992 mg, 4.80 mmol, 1.20 equiv.) in dichloromethane (5 ml) was added dropwise to a solution of 2-(2-bromo-5-iodothiophen-3-yl)ethanol (1.33 g, 4.00 mmol, 1.00 equiv.) and triethylamine (486 mg, 4.80 mmol, 1.20 equiv.) in dichloromethane (10 ml) at 0° C. The reaction mixture was stirred at 0° C. for 30 minutes and at room temperature for 2 hours. The solvent was removed under reduced pressure, and the residue was taken up again using ethyl acetate. The organic phase was washed with sat. sodium hydrogencarbonate solution, water and sodium chloride solution, dried over magnesium sulfate, filtered and evaporated. The crude product was purified by column chromatography on silica gel with petroleum ether/ethyl acetate (5:1) as eluent, giving 1.83 g (91%) of the product as a yellow oil.

$^1$H-NMR (300 MHz, CDCl$_3$): δ=7.05 (s, 1H, Har), 4.36 (t, 3J=6.8 Hz, 2H, CH$_2$—O), 2.98 (t, 3J=6.8 Hz, 2H, Car-CH$_2$), 1.80-1.87 (m, 2H, Cq-CH$_2$), 1.53 (s, 6H, 2×CH$_3$), 1.29-1.35 (m, 4H, 2×CH$_2$), 0.88-0.93 (m, 3H, CH$_3$).—13C-NMR (75 MHz, CDCl$_3$): δ=158.5 (C=O), 156.7 (C=O), 138.9 (Car-CH$_2$), 138.2 (Car), 114.0 (Car-Br), 87.7 (O-Cq), 71.9 (Car-

I), 65.1 (CH$_2$—O), 40.3 (Cq-CH$_2$), 28.4 (Car-CH$_2$), 26.1 (CH$_2$), 25.9 (2×CH$_3$), 23.0 (CH$_2$), 14.2 (CH$_3$).—FTIR: $\tilde{v}$=2957, 2865, 1758, 1732, 1461, 1348, 1317, 1225, 1182, 1136, 1093, 974, 852, 799 cm-1.—MS (DART), m/z (%): 522/520 (100/97) [(M+NH4)+].—HRMS (C$_{15}$H$_{24}$BrINO$_4$S): calculated: 519.9654, found: 519.9630.

Example 3—Polymers 3.1 Poly(3-(2,7-(9-methyl-9H-fluoren-9-yl)propyl) (2-methylhexan-2-yl) oxalate)

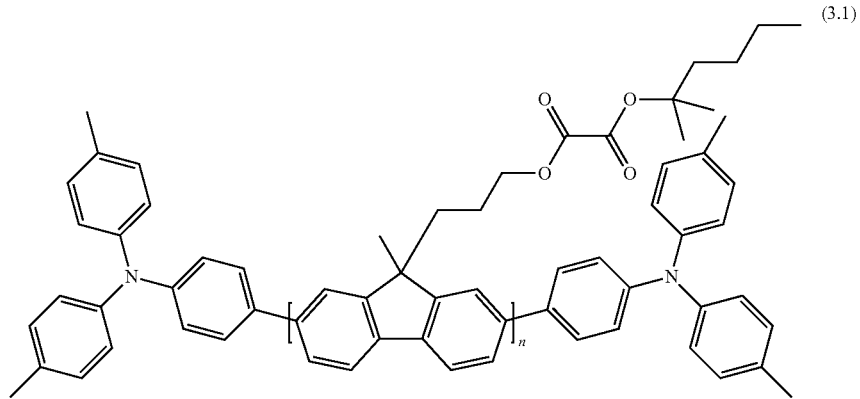

(3.1)

A mixture of bis(1,5-cyclooctadiene)nickel (495 mg, 1.80 mmol, 2.25 equiv.), cyclooctadiene (195 mg, 1.80 mmol, 2.25 equiv.) and 2,2-bipyridine (281 mg, 1.80 mmol, 2.25 equiv.) in tetrahydrofuran (5 ml) was stirred at 50° C. for 30 minutes. A solution of 3-(2,7-dibromo-9-methyl-9H-fluoren-9-yl)propyl (2-methylhexan-2-yl) oxalate (453 mg, 0.80 mmol, 1.00 equiv.) and 4-bromo-N,N-di-p-tolylaniline (3.00 mg, 8.00 μmol) in tetrahydrofuran (10 ml) was added. The reaction mixture was stirred at 70° C. for two days. After cooling to room temperature, the reaction mixture was added to a mixture of methanol/hydrochloric acid (2:1, 300 ml), and the insoluble material was fractionated in a Soxhlet apparatus with methanol, acetone and chloroform, giving 180 mg (55%) of the polymer as a yellow solid in two fractions.

GPC (PSS standard in chloroform): acetone fraction: M$_n$=13.6 kg/mol, M$_w$=30.5 kg/mol, PDI=2.24. chloroform fraction: M$_n$=38.3 kg/mol, M$_w$=78.2 kg/mol, PDI=2.04.— FT-IR: ($\tilde{v}$ in cm$^{-1}$): 2960, 2928, 2862, 1758, 1734, 1458, 1328, 1258, 1189, 1145, 815, 747, 668 cm$^{-1}$. TGA/DSC (10 K/min)—cleavage temperature: T$_{on}$=145° C. (18%). UV/Vis: λmax (chloroform)=385 nm.

Example 4—Devices 4.1 OLEDs Having an Emitter Layer Comprising Polymer 3.1

OLEDs were produced as follows:
All OLEDs were deposited on glass coated with indium tin oxide (R$_\square$≈13Ω/□). This had previously been structured by means of hydrochloric acid and subsequently cleaned in acetone and isopropanol for 15 min in each case, the final organic residues were removed by an oxygen plasma.

The organic layers were deposited by means of spin coating under a protective-gas atmosphere (N$_2$).

The hole-injection layer, consisting of poly(3,4-ethylenedioxythiophene) poly(styrene sulfonate) (PEDOT:PSS), was diluted with water in the ratio 1:1 and deposited at 4000 rpm. In order to remove final residues of water, the samples were placed in a vacuum oven at 120° C. for 10 min.

The emitter consisting of polymer 3.1 was dissolved in toluene in a concentration of 8 g/l and deposited at 1000 rpm, followed by a heating step at 200° C. over a period of 10 min for thermal removal of the solubility-promoting groups. OLEDs were likewise constructed without this heating step as reference.

As electrode, 0.7 nm of lithium fluoride, followed by 200 nm of aluminium, were deposited by means of thermal sublimation.

The voltage/current density (IN) characteristic line was recorded by means of an "source measurement unit" (SMU for short, Keithley 238). Finally, the power and current efficiencies were calculated by means of the voltage and current values determined in this way and the luminous density calculated from the spectrum.

The spectrometer had been calibrated in advance using a halogen standard (Philips FEL-1000 W). The power and current efficiencies were calculated assuming Lambert light propagation.

Polymer 3.1 is an emitting polymer. The solubility group can, as mentioned above, be cleaved off by input of thermal energy (>145° C., in the example 160° C.) over a period of 10-30 minutes. This temperature changes depending on the structure of the radicals R$^{1a}$, R$^{1b}$ and R$^{1c}$.

FIGS. 1a-d show the opto-electronic characteristic data of an OLED comprising polymer 3.1 emitter (1a: current density/voltage characteristic line; 1b: luminous density/voltage characteristic line; 1c: current efficiency; 1d: power efficiency; in each case with and without thermal treatment). Due to the decreasing layer thickness of the material due to the cleavage, the current/voltage characteristic line rises more steeply than before the cleavage. This gives rise to slightly lower efficiency, but this is compensated by the process advantage of an insoluble layer.

FIG. 2 shows for polymer 3.1 the comparison of the electroluminescence spectra at the same voltage before (100° C.) and after (200° C.) thermal cleavage of the oxalate side chains. Only a minimal difference is evident between the two spectra.

The solubility switchability of the polymers can now be utilised in order to deposit further functional layers, such as, for example, a hole-blocking layer, onto the emitters. This generally has a very positive effect on the charge-carrier equilibrium and should thus further increase the efficiency of the components.

The invention claimed is:

1. A conjugated polymer comprising one or more identical or different recurring units, wherein at least one of the one or more identical or different recurring units is substituted by an oxalate group.

2. The conjugated polymer of claim 1, wherein the conjugated polymer comprises one or more identical or different recurring units of formula (I):

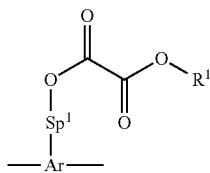

(I)

wherein

Ar is an optionally substituted mono- or polycyclic aryl or heteroaryl radical;

$Sp^1$ is a single bond or an alkylene radical having 1 to 20 C atoms and which is optionally substituted with F, Cl, Br, I, or CN, and wherein one or more non-adjacent $CH_2$ groups are optionally replaced, independently of one another, with —O—, —S—, —NH—, —NR$^0$—, —SiR$^0$R$^{00}$—, —CO—, —COO—, —OCO—, —OCO—O—, —S—CO—, —CO—S—, —CR$^0$=CR$^{00}$— or such that any O and/or S atoms are not directly linked to one another;

$R^0$ and $R^{00}$ are each, independently of one another, H or an alkyl radical having 1 to 12 C atoms; and $R^1$ is a hydrocarbyl radical having 1 to 40 C atoms.

3. The conjugated polymer of claim 2, wherein the recurring units of formula (I) are selected from the group consisting of formulae I1 through I12:

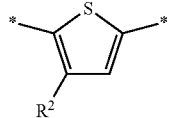

I1

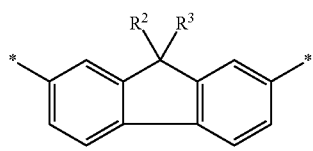

I2

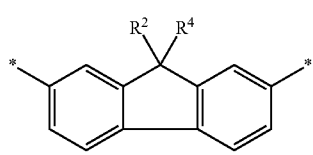

I3

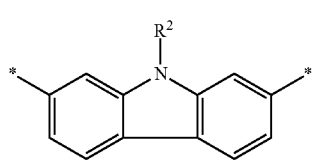

I4

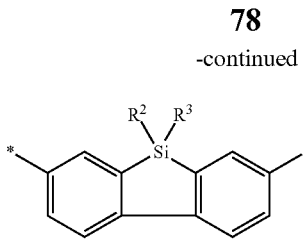

I5

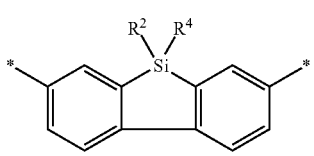

I6

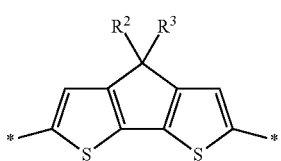

I7

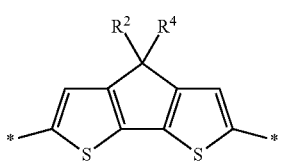

I8

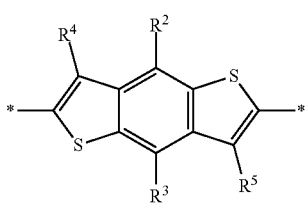

I9

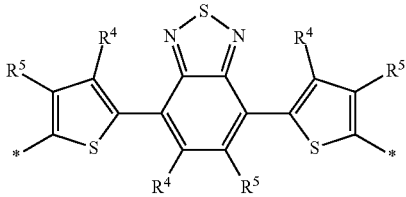

I10

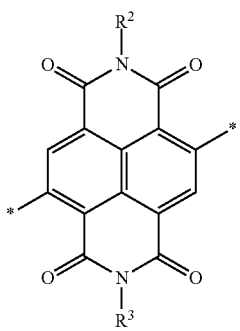

I11

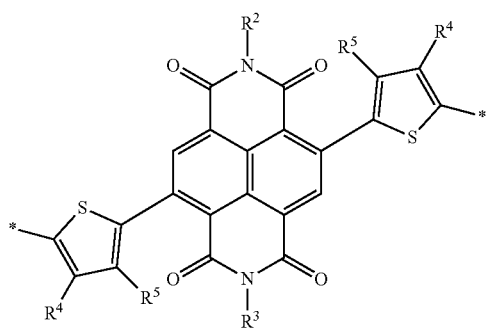

I12 wherein $R^2$ and $R^3$ are each, independently of one another, and identically or differently on each occurrence, a radical -Sp$^1$-O—C(O)—C(O)—O—R$^1$;

$R^4$ and $R^5$ are each, independently of one another, and identically or differently on each occurrence, H, F, or a hydrocarbyl radical having 1 to 40 C atoms; and wherein at least one of the radicals $R^4$ and $R^5$ in formula I10 is a radical -Sp$^1$-O—C(O)C(O)—O—R$^1$.

4. The conjugated polymer of claim 3, wherein the radical -Sp$^1$-OC(O)—C(O)—O—R$^1$ is a radical of formula (S):

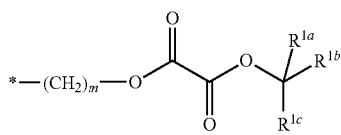

(S)

wherein $R^{1a}$, $R^{1b}$, and $R^{1c}$ are each, independently of one another, H or a straight-chain, branched, or cyclic alkyl radical having 1 to 20 C atoms or a straight-chain, branched, or cyclic alkenyl radical or alkynyl radical, in each case having 2 to 20 C atoms, wherein two of radicals $R^{1a}$, $R^{1b}$, and $R^{1c}$ together optionally define a cyclic alkyl radical, alkenyl radical or alkynyl radical, each having 5 to 12 C atoms;

m is 0 or an integer from 1 to 12; and

* denotes the link to the radical Ar.

5. The conjugated polymer of claim 3, wherein the radical -Sp$^1$-OC(O)—C(O)—O—R$^1$ is selected from the groups consisting of formulae S1 through S12:

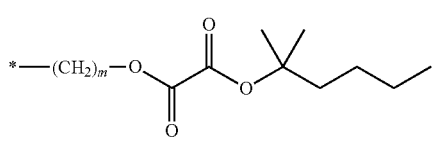

S1

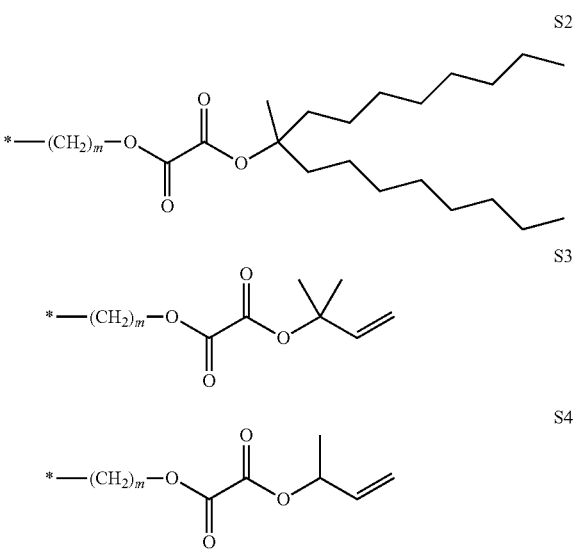

S2

S3

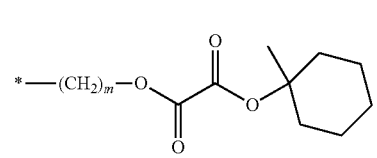

S4

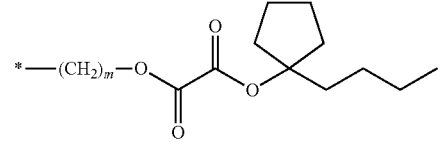

S5

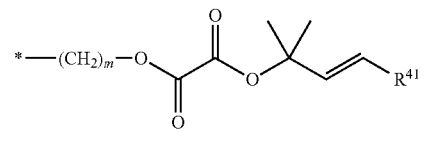

S6

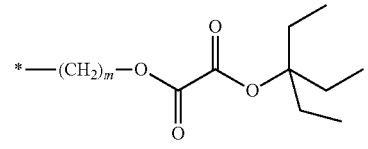

S7

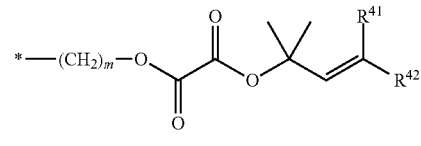

S8

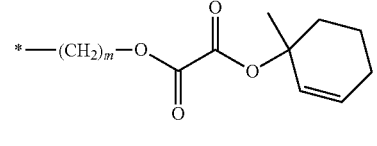

S9

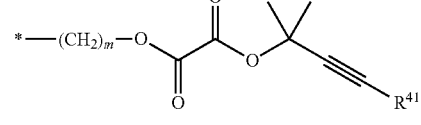

S10

S11

-continued

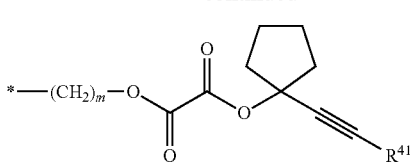
S12 wherein
$R^{41}$ and $R^{42}$
are each, independently of one another, and identically or differently on each occurrence, H or a straight-chain or branched alkyl radical having 1 to 20 C atoms;
m is an integer from 1 to 12; and
* denotes the link to the radical Ar.

6. The conjugated polymer of claim 2, wherein the $Sp^1$ is an alkylene radical having 1 to 20 C atoms.

7. The conjugated polymer of claim 2, wherein, when $R^1$ is not H and F, $R^1$ is a straight-chain, branched, or cyclic alkyl radical having 1 to 25 C atoms optionally substituted with F, Cl, Br, I, or CN, and wherein one or more non-adjacent $CH_2$ groups are each optionally replaced, independently of one another, with —O—, —S—, —C(O)—, —C(S)—, —C(O)—O—, —O—C(O)—, —$SiR^0R^{00}$—, —$CF_2$—, —$CHR^0=CR^{00}$—, —$CY^1=CY^2$—, or —C≡C— such that any O and/or S atoms are not directly linked to one another, and $Y^1$ and $Y^2$ each, independently of one another, denote H, F, Cl or CN.

8. The conjugated polymer of claim 2, wherein the conjugated polymer comprises one or more recurring units of formula (IIa) or (IIb):

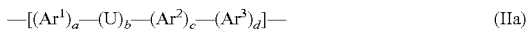 (IIa)

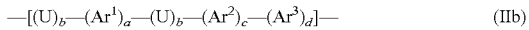 (IIb)

wherein
U is a unit of formula (I);
$Ar^1$, $Ar^2$, and $Ar^3$
are on each occurrence, identically or differently, and in each case independently of one another, an optionally substituted aryl or heteroaryl radical different from U;
a, b, and c
are on each occurrence, identically or differently, and in each case independently of one another, 0, 1 or 2; and
d is on each occurrence, identically or differently, 0 or an integer from 1 to 10;
wherein the conjugated polymer comprises at least one recurring unit of formula (IIa) or (IIb) wherein b is at least 1.

9. The conjugated polymer of claim 2, wherein the conjugated polymer further comprises one or more optionally substituted mono- or polycyclic aryl or heteroaryl units.

10. The conjugated polymer of claim 9, wherein the one or more optionally substituted mono- or polycyclic aryl or heteroaryl units are selected from the groups consisting of formulae (IIIa) and (IIIb):

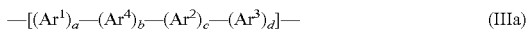 (IIIa)

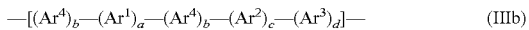 (IIIb)

$Ar^1$, $Ar^e$, and $Ar^3$
are on each occurrence, identically or differently, and in each case independently of one another, an optionally substituted aryl or heteroaryl radical different from U, wherein U is a unit of formula (I);
a, b, and c
are on each occurrence, identically or differently, and in each case independently of one another, 0, 1 or 2;
d is on each occurrence, identically or differently, 0 or an integer from 1 to 10; and
$Ar^4$ is an optionally substituted aryl or heteroaryl radical different from U, $Ar^1$, $Ar^2$, and $Ar^3$;
wherein the conjugated polymer contains at least one recurring unit of formula (IIIa) or (IIIb) wherein b is at least 1.

11. The conjugated polymer of claim 2, wherein the conjugated polymer is a conjugated polymer of formula (IV):

 (IV)

wherein
A, B, and C
are each, independently of one another, a different unit of the formula (I);
x is >0 and ≤1;
y is ≥0 and <1;
z is ≥0 and <1;
wherein x+y+z=1; and
n is an integer >1.

12. The conjugated polymer of claim 11, wherein the conjugated polymer of formula (IV) is selected from the groups consisting of sub-formulae (IVa) through (IVk):

 (IVa)

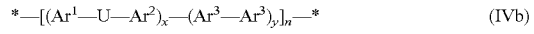 (IVb)

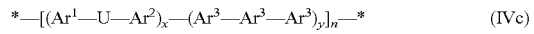 (IVc)

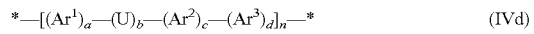 (IVd)

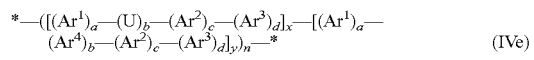 (IVe)

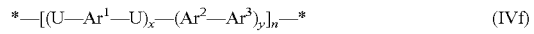 (IVf)

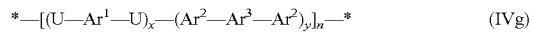 (IVg)

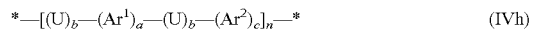 (IVh)

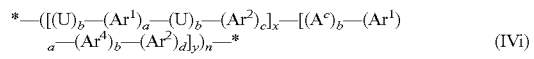 (IVi)

 (IVk)

wherein
U is a unit of formula (I);
$Ar^1$, $Ar^2$, and $Ar^3$
are on each occurrence, identically or differently, and in each case independently of one another, an optionally substituted aryl or heteroaryl radical different from U;
a, b, and c
are on each occurrence, identically or differently, and in each case independently of one another, 0, 1 or 2; and
d is on each occurrence, identically or differently, 0 or an integer from 1 to 10;
$Ar^4$ is an optionally substituted aryl or heteroaryl radical different from U, $Ar^e$, and $Ar^3$;

x is >0 and ≤1;
y is ≥0 and <1;
z is ≥0 and <1;
wherein x+y+z=1; and
n is an integer >1;
wherein the conjugated polymers are optionally alternating or random copolymers; and
wherein, in formulae (IVd) and (IVe), b is at least 1 in at least one recurring unit [(Ar$^1$)$_a$—(U)$_b$—(Ar$^2$)$_c$—(Ar$^3$)$_d$] and in at least one recurring unit[(Ar$^1$)$_a$—(Ar$^4$)$_b$—(Ar$^2$)$_c$—(Ar$^3$)$_d$], and, in formulae (IVh) and (IVi), b is 1 in at least one recurring unit [(U)$_b$—(Ar$^1$)$_a$—(U)$_b$—(Ar$^2$)$_c$].

13. The conjugated polymer of claim 11, wherein Ar$^1$, Ar$^e$, Ar$^3$, and Ar$^4$ are selected, in each case independently of one another, and identically or differently on each occurrence, from the group consisting of 1,4-phenylene, thiophene-2,5-diyl, selenophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo-[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, carbazole-2,7-diyl, fluorene-2,7-diyl, indaceno[1,2-b:5,6-b']dithiophene-2,7-diyl, benzo[1",2":4,5;4",5":4',5']bis(silolo[3,2-b:3',2'-b']thiophene)-2,7-diyl, phenanthro[1,10,9,8-c,d,e,f,g]carbazole-2,7-diyl, benzo-2,1,3-thiadiazole-4,7-diyl, benzo-2,1,3-selenadiazole-4,7-diyl, benzo-2,1,3-oxadiazole-4,7-diyl, 2H-benzotriazole-4,7-diyl, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, 3,6-dithien-2-ylpyrrolo[3,4-c]pyrrole-1,4-dione, and 1,3-thiazolo[5,4-d]-1,3-thiazole-2,5-diyl, wherein all of the above radicals are optionally substituted.

14. The conjugated polymer of claim 11, wherein the conjugated polymer comprises a conjugated polymer of formula (V):

R$^{21}$-chain-R$^{22}$     (V)

wherein
"chain"
is a polymer chain of formula (IV);
R$^{21}$ and R$^{22}$
are each, independently of one another, H, F, Br, Cl, I, —CN, —NC, —NCO, —NCS, —OCN, —SCN, —C(O)NR$^0$R$^{00}$, —C(O)X$^0$, —C(O)R$^0$, —NH$_2$, NR$^0$R$^{00}$, —SH, —SR$^0$, —SO$_3$H, —SO$_2$R$^0$, —OH, —NO$_2$, —CF$_3$, —SF$_5$, —CH$_2$Cl$_1$, —CHO, —CR'═CR"$_2$, —SiR'R"R'", —SiR'X'X", —SiR'R"X', —SnR'R"R'", —BR'R", —B(OR')(OR"), —B(OH)$_2$, —O—SO$_2$—R', —ZnX', or an optionally substituted silyl or hydrocarbyl radical having 1 to 40 C atoms and which optionally contains one or more heteroatoms, wherein X' and X" are halogen, wherein R$^0$, R$^{00}$, R', R", and R'" are each, independently of one another H or an alkyl radical having 1 to 12 C atoms, and wherein two of radicals R', R", and R'", together with the respective heteroatom to which they are bonded, optionally define a cyclosilyl, cyclostannyl, cycloborane, or cycloboronate group having 2 to 20 C atoms; and
X$^0$ is halogen.

15. The conjugated polymer of claim 1, wherein the conjugated polymer comprises a monomer unit selected from the group consisting of formulae (IV1) through (IV10):

(IV1)

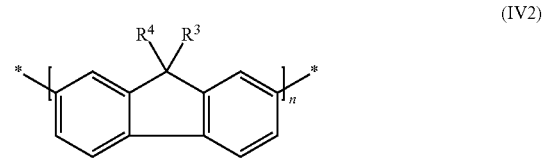

(IV2)

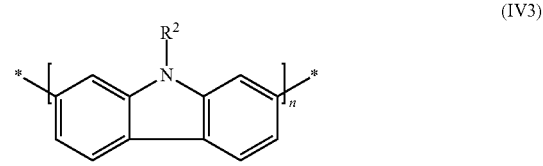

(IV3)

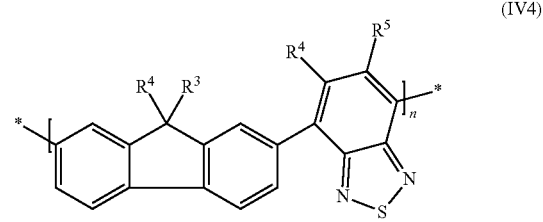

(IV4)

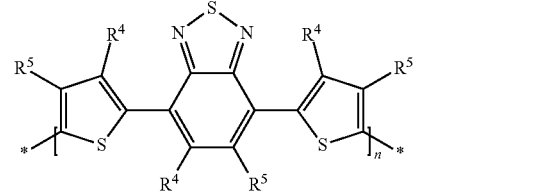

(IV5)

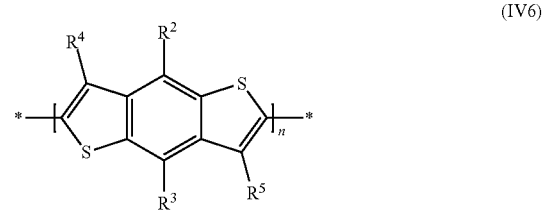

(IV6)

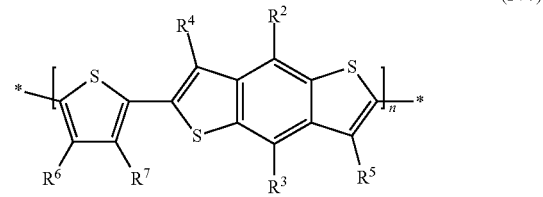

(IV7)

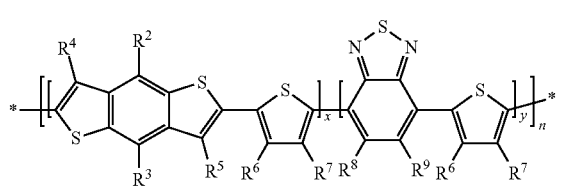

(IV8)

-continued

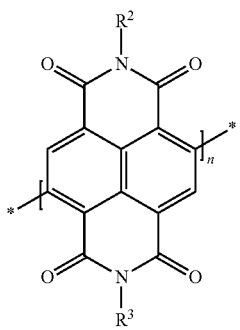
(IV9)

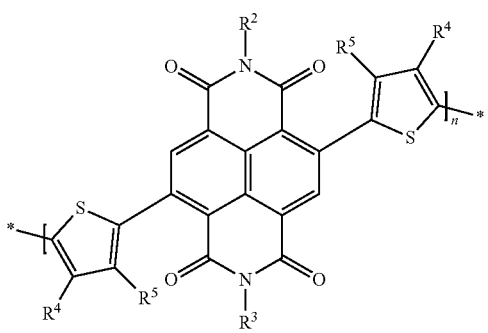
(IV10)

wherein
R² and R³
are each, independently of one another, and identically or differently on each occurrence, a radical -Sp¹-O—C(O)—C(O)—O—R¹;
R⁴, R⁵, R⁶, R⁷, R⁸, and R⁹
are each, independently of one another, and identically or differently on each occurrence, H, F, or a hydrocarbyl radical having 1 to 40 C atoms optionally substituted with F, Cl, Br, I, or CN, and wherein one or more non-adjacent CH₂ groups are each optionally replaced, independently of one another, with —O—, —S—, —C(O)—, —C(S)—, —C(O)—O—, —O—C(O)—, —NR⁰—, —SiR⁰R⁰⁰—, —CF₂—, —CHR⁰=CR⁰⁰—, —CY¹=CY²—, or such that any O and/or S atoms are not directly linked to one another;
Y¹ and Y² each, independently of one another, denote H, F, Cl or CN;
Sp¹ is a single bond or an alkylene radical having 1 to 20 C atoms and which is optionally substituted with F, Cl, Br, I or CN, and wherein one or more non-adjacent CH₂ groups are optionally replaced, independently of one another, with —O—, —S—, —NH—, —NR⁰—, —SiR⁰R⁰⁰—, —CO—, —COO—, —OCO—, —OCO—O—, —S—CO—, —CO—S—, —CR⁰=CR⁰⁰— or —C≡C— such that any O and/or S atoms are not directly linked to one another;
R¹ is a hydrocarbyl radical having 1 to 40 C atoms;
R⁰ and R⁰⁰
are each, independently of one another, H or an alkyl radical having 1 to 12 C atoms; and
wherein, in formula (IV5), at least one of radicals R⁴ and R⁵ is a radical -Sp¹-O—C(O)—C(O)—O—R¹, n is an integer >1, and x and y are each, independently of one another, >0 and <1.

16. A mixture or polymer blend comprising one or more conjugated polymers of claim 1 and one or more compounds or polymers having semiconductor, charge-transport, hole/electron-transport, hole/electron-blocking, electrically conducting, photoconducting, or light-emitting properties.

17. The mixture or polymer blend of claim 16, further comprising one or more compounds selected from the group consisting of electron acceptors or n-type organic semiconductors.

18. The mixture or polymer blend of claim 16, wherein the n-type organic semiconductor is selected from the group consisting of fullerenes and substituted fullerenes.

19. A formulation comprising one or more conjugated polymers of claim 1 and one or more solvents.

20. A charge-transport, semiconductor, electrically conducting, photoconducting, or light-emitting material comprising the conjugated polymer of claim 1.

21. A device having optical, electro-optical, electronic, electroluminescent, or photoluminescent properties, a component of such a device, or a product containing such a device, comprising the conjugated polymer of claim 1.

22. The device of claim 21, wherein the device is selected from the group consisting of organic field-effect transistors, organic thin-film transistors, organic light-emitting diodes, organic light-emitting transistors, organic photovoltaic component devices, organic photodetectors, organic solar cells, Perovskite solar cells, Schottky diodes, laser diodes and organic photoconductors.

23. The device of claim 21, wherein the device is an organic field effect transistor, an organic photovoltaic component device, an organic solar cell, a Perovskite solar cell, or an organic photodetector and comprises a photoactive layer comprising organic semiconductors, wherein the organic semiconductors form a bulk heterojunction in the photoactive layer.

24. The device having optical, electro-optical, electronic, electroluminescent, or photoluminescent properties, a component of such a device, or a product containing such a device of claim 21, wherein the component of such a device is selected from the group consisting of charge-injection layers, charge-transport layers, interlayers, planarisation layers, antistatic films, polymer electrolyte membranes, conducting substrates, and conducting patterns.

25. The device having optical, electro-optical, electronic, electroluminescent, or photoluminescent properties, a component of such a device, or a product containing such a device of claim 21, wherein the product containing such a device is selected from the group consisting of integrated circuits, capacitors, radio frequency identification tags, security marks and security devices containing radio frequency identification tags, flat-panel screens, backlighting for displays, electro-photographic devices, electrophotographic recording devices, organic memory devices, sensor devices, photovoltaic systems, biosensors, and biochips.

26. A battery or a component or device for the detection and discrimination of DNA sequences comprising the conjugated polymer of claim 1.

27. A process for preparing the conjugated polymer of claim 1, comprising reacting one or more monomers of formula (VIa) or (VIb):

 (VIa)

 (VIb)

wherein
U is a unit of formula (I);

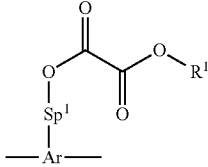
(I)

wherein
Ar is an optionally substituted mono- or polycyclic aryl or heteroaryl radical;
Sp¹ is a single bond or an alkylene radical having 1 to 20 C atoms and which is optionally substituted with F, Cl, Br, I, or CN, and wherein one or more non-adjacent CH₂ groups are optionally replaced, independently of one another, with —O—, —S—, —NH—, —NR⁰—, —SiR⁰R⁰⁰—, —CO—, —COO—, —OCO—, —OCO—O—, —S—CO—, —CO—S—, —CR⁰=CR⁰⁰— or such that any O and/or S atoms are not directly linked to one another;
R⁰ and R⁰⁰
are each, independently of one another, H or an alkyl radical having 1 to 12 C atoms; and
R¹ is a hydrocarbyl radical having 1 to 40 C atoms;
with one another and/or with one or more monomers selected from the group consisting of formulae (VIII), (IX), and (X):

 (VIII)

 (IX)

 (X)

wherein
Ar¹, Ar², Ar³, and Ar⁴
are on each occurrence, identically or differently, and in each case independently of one another, an optionally substituted aryl or heteroaryl radical different from U;
a and c
are on each occurrence, identically or differently, and in each case independently of one another, 0, 1 or 2; and
R³¹ and R³²
are selected from the group consisting of Cl, Br, I, —B(OZ²)₂, and —Sn(Z⁴)₃.

28. A process for cleaving some or all oxalate groups off of the polymer of claim 1, comprising heating the conjugated polymer, or a layer comprising the conjugated polymer, to a temperature of from 150° C. to 200° C.

29. A monomer of formula (VIa) or (VIb):

 (VIa)

 (VIb)

wherein
U is a unit of formula (I);

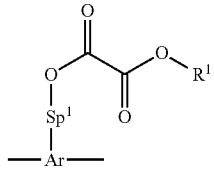
(I)

wherein
Ar is an optionally substituted mono- or polycyclic aryl or heteroaryl radical;
Sp¹ is a single bond or an alkylene radical having 1 to 20 C atoms and which is optionally substituted with F, Cl, Br, I, or CN, and wherein one or more non-adjacent CH₂ groups are optionally replaced, independently of one another, with —O—, —S—, —NH—, —NR⁰—, —SiR⁰R⁰⁰—, —CO—, —COO—, —OCO—, —OCO—O—, —S—CO—, —CO—S—, —CR⁰=CR⁰⁰— or such that any O and/or S atoms are not directly linked to one another;
R⁰ and R⁰⁰
are each, independently of one another, H or an alkyl radical having 1 to 12 C atoms; and
R¹ is a hydrocarbyl radical having 1 to 40 C atoms;
Ar¹ and Ar²
are on each occurrence, identically or differently, and in each case independently of one another, an optionally substituted aryl or heteroaryl radical different from U;
a and c
are on each occurrence, identically or differently, and in each case independently of one another, 0, 1 or 2, wherein a and c cannot both be 0; and
R³¹ and R³²
are each selected, independently of one another, from the group consisting of Cl, Br, I, O-tosylate, O-triflate, O-mesylate, O-nonaflate, —SiMe₂F, —SiMeF₂, —O—SO₂Z¹, —B(OZ²)₂, —CZ³=C(Z³)₂, —C≡CH, —C≡CSi(Z¹)₃, —ZnX⁰, and —Sn(Z⁴)₃, wherein X⁰ is halogen, wherein Z¹, Z², Z³, and Z⁴ are selected from the group consisting of optionally substituted alkyl and aryl, and wherein two radicals Z², together with B and O atoms, optionally define a cycloboronate group having 2 to 20 C atoms.

30. The monomer of claim 29, wherein the monomer is selected from the group consisting of formulae (VI1), (VI3), (VI4), and (VI5):

 (VI1)

 (VI3)

 (VI4)

 (VI5).

* * * * *